United States Patent
Yokoyama et al.

(10) Patent No.: US 7,062,344 B2
(45) Date of Patent: Jun. 13, 2006

(54) FABRICATION SYSTEM AND FABRICATION METHOD

(75) Inventors: Natsuki Yokoyama, Mitaka (JP); Yoshifumi Kawamoto, Kanagawa (JP); Eiichi Murakami, Tokorozawa (JP); Fumihiko Uchida, Hachioji (JP); Kenichi Mizuishi, Hachioji (JP); Yoshio Kawamura, Kokubunji (JP)

(73) Assignee: Renesas Technology Corp., Tokyo (JP)

( * ) Notice: Subject to any disclaimer, the term of this patent is extended or adjusted under 35 U.S.C. 154(b) by 0 days.

(21) Appl. No.: 10/713,012

(22) Filed: Nov. 17, 2003

(65) Prior Publication Data

US 2004/0107020 A1   Jun. 3, 2004

Related U.S. Application Data

(63) Continuation of application No. 09/611,976, filed on Jul. 6, 2000, now abandoned, which is a division of application No. 09/106,147, filed on Jun. 29, 1998, now Pat. No. 6,099,598, which is a continuation of application No. 08/713,192, filed on Sep. 12, 1996, now Pat. No. 5,820,679, which is a continuation of application No. 08/274,308, filed on Jul. 12, 1994, now abandoned.

(30) Foreign Application Priority Data

Jul. 15, 1993 (JP) ............................................. 5-175114
Aug. 31, 1993 (JP) ............................................. 5-215489

(51) Int. Cl.
*G06F 19/00* (2006.01)

(52) U.S. Cl. ........................ 700/112; 700/121; 414/937; 414/222.02

(58) Field of Classification Search ................. 700/121, 700/99–104, 108, 109, 112–115; 414/222.06, 414/222.02, 217, 935, 937; 118/719; 438/15; 29/25.01; 198/617

See application file for complete search history.

(56) References Cited

U.S. PATENT DOCUMENTS 3,812,947 A * 5/1974 Nygaard .................... 198/617

(Continued)

FOREIGN PATENT DOCUMENTS

EP          502412         11/1992

(Continued)

OTHER PUBLICATIONS

"Operation of LSI Production System to Reduce Development Investment and to Meet Diversified Needs," Nikkei Microdevice, Aug. 1992, pp. 66–74.

(Continued)

*Primary Examiner*—Leo Picard
*Assistant Examiner*—Steven R. Garland
(74) *Attorney, Agent, or Firm*—Mattingly, Stanger, Malur & Brundidge, P.C.

(57) ABSTRACT

Disclosed is a fabricating system including a plurality of processing apparatuses connected to each other by means of an inter-apparatus transporter, wherein one group of semiconductor wafers are processed in processing apparatuses and other group of wafers are transported to specified processing apparatuses for a time interval from (To+T) to a time To; and another group of wafers are processed and the remaining group of wafers are transported for a time interval from (To+T) to (To+2T). Since processing apparatuses can receive at least one of works from the inter-apparatus transporter for a time interval T min, the distribution of works from the transporter to processing apparatuses is completed for the time interval T min. The transporter is emptied for each time interval T min, and works are unloaded to the emptied transporter, which makes easy the scheduling, control and management of the transporting of a plurality of works in the fabricating system. Moreover, since the fabricating system including processing apparatuses is periodically controlled at a cycle time T min, the scheduling of a plurality of works can be made easy, to enhance the level of optimization, thus improving the productivity.

12 Claims, 31 Drawing Sheets

U.S. PATENT DOCUMENTS

| | | | |
|---|---|---|---|
| 4,510,673 A | 4/1985 | Shils et al. | |
| 4,592,306 A | 6/1986 | Galleco | |
| 4,796,194 A | 1/1989 | Atherton | |
| 4,886,592 A | 12/1989 | Anderle | |
| 5,019,233 A | 5/1991 | Blake | |
| 5,024,570 A | 6/1991 | Kiriseko | |
| 5,067,218 A | 11/1991 | Williams | |
| 5,076,205 A | 12/1991 | Vowles | |
| 5,100,276 A | 3/1992 | Iwasaki et al. | |
| 5,135,608 A | 8/1992 | Okutani | |
| 5,202,716 A | 4/1993 | Tateyama | |
| 5,237,508 A | 8/1993 | Furukawa et al. | |
| 5,259,881 A | 11/1993 | Edwards | |
| 5,388,945 A | 2/1995 | Garric | |
| 5,399,531 A | 3/1995 | Wu | |
| 5,404,894 A | 4/1995 | Shiraiwa | |
| 5,436,848 A | 7/1995 | Nishida et al. | 700/112 |
| 5,442,561 A | 8/1995 | Yoshizawa et al. | |
| 5,443,346 A | 8/1995 | Murata | |
| 5,445,491 A | 8/1995 | Nakagawa | |
| 5,536,128 A | 7/1996 | Shimoyashiro et al. | |
| 5,601,686 A | 2/1997 | Kawamura et al. | |
| 5,820,679 A | 10/1998 | Yokoyama et al. | 178/719 |
| 5,858,863 A | 1/1999 | Yokoyama et al. | 438/514 |
| 6,099,598 A | 8/2000 | Yokoyama et al. | 29/25.01 |

FOREIGN PATENT DOCUMENTS

| | | |
|---|---|---|
| JP | 57-157518 | 9/1982 |
| JP | 58-50728 | 3/1983 |
| JP | 60-10641 | 1/1985 |
| JP | 61-128512 | 6/1986 |
| JP | 63-244730 | 10/1988 |
| JP | 63-288009 | 11/1988 |
| JP | 64-6540 | 2/1989 |
| JP | 2-292810 | 12/1990 |
| JP | 4115513 | 4/1992 |
| JP | 4-130618 | 5/1992 |
| JP | 4-199709 | 7/1992 |
| JP | 7-122622 | 5/1995 |

OTHER PUBLICATIONS

Wolf and Tauber, Silicon Processing for the VLSI Era, vol. 1, 1986, p. 429.

Mamoru Shibada, Cassette Transfer System "Auto Track", Electrical Material, Mar. 1984, (pp. 4, 14–15, 17).

IBM Technical Disclosure Bulletin vol. 33 Issue 1A pp. 80–84, Jun. 1, 1990, "Knowledge–Based Dynamic Scheduler in Distributed Computer Control.".

* cited by examiner-

Details of Transporting and Processing in Metal Films Deposition Apparatus.

Fig. 4
Details of Transporting and Processing of Semiconductor Wafer #1.
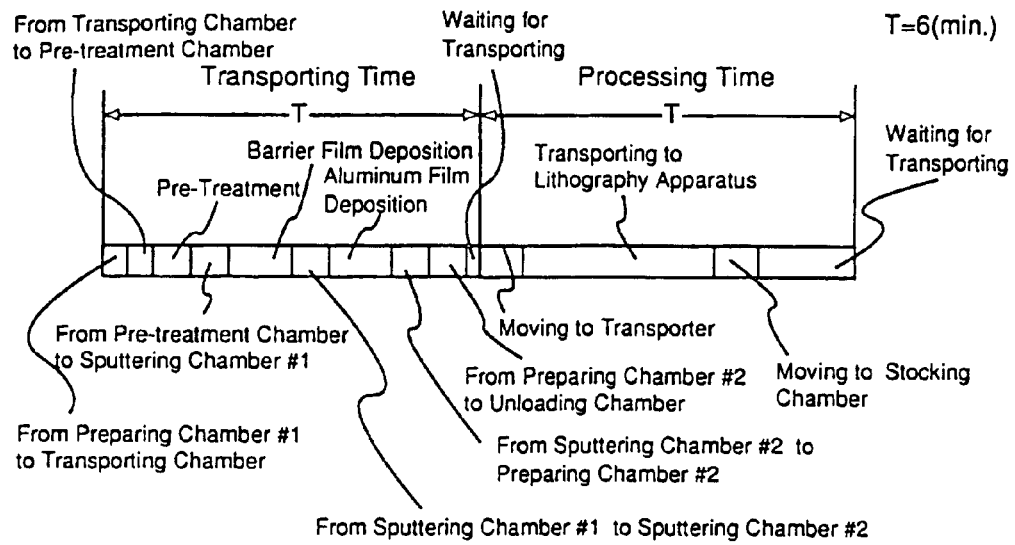
Details of Transporting and Processing of Semiconductor Wafer #2.
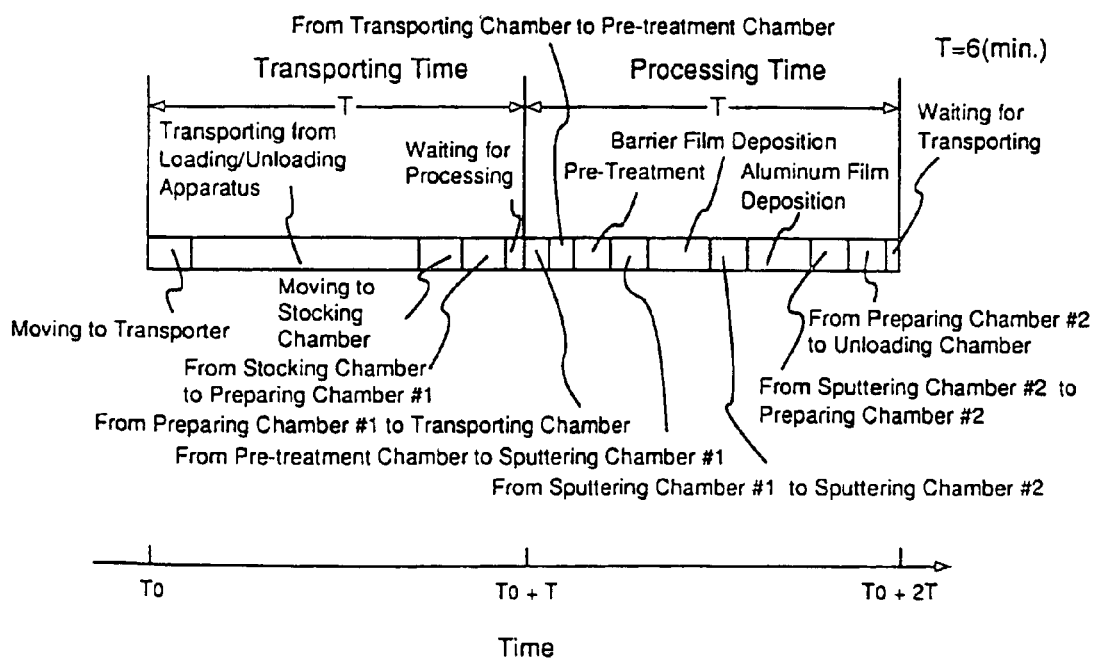

Details of Transporting and Processing in Insulating Films Deposition Apparatus.

Details of Transporting and Processing in Lithography Apparatus.

Details of Transporting and Processing in Metal Films Dry Etching Apparatus.

Continued Processing Ratio = Continued Process Steps / All Process Steps

Fig. 26
Pipelining Processing and Transporting.
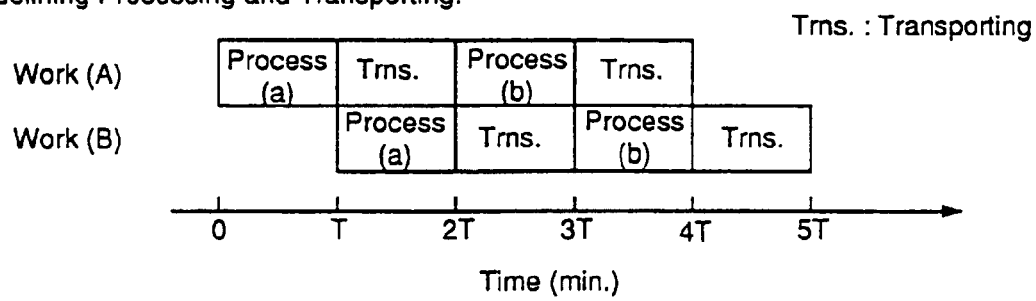
Processing and Transporting by Lot.
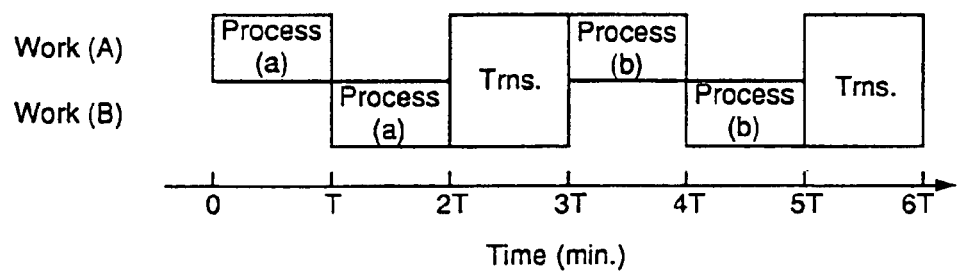

Details of Transporting and Processing in Metal Films Deposition Apparatus.

Fig. 30
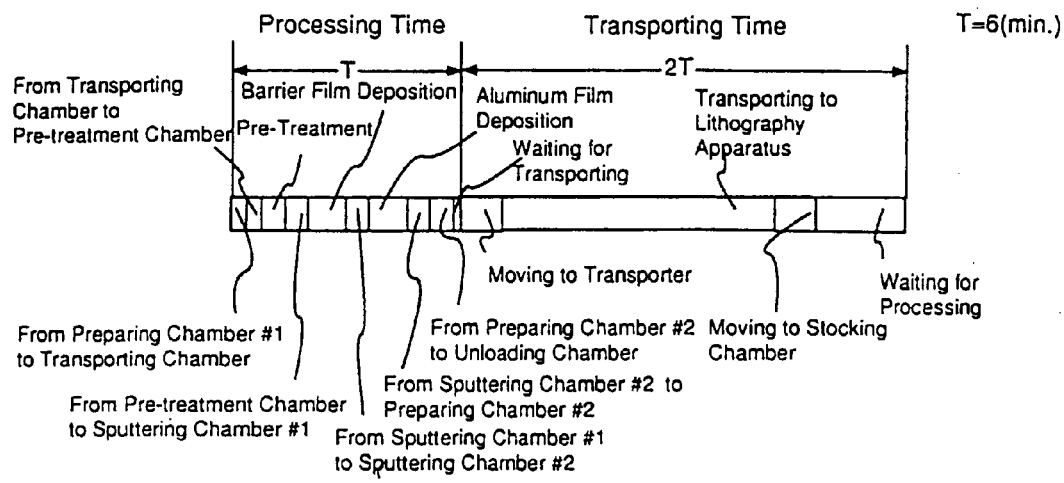
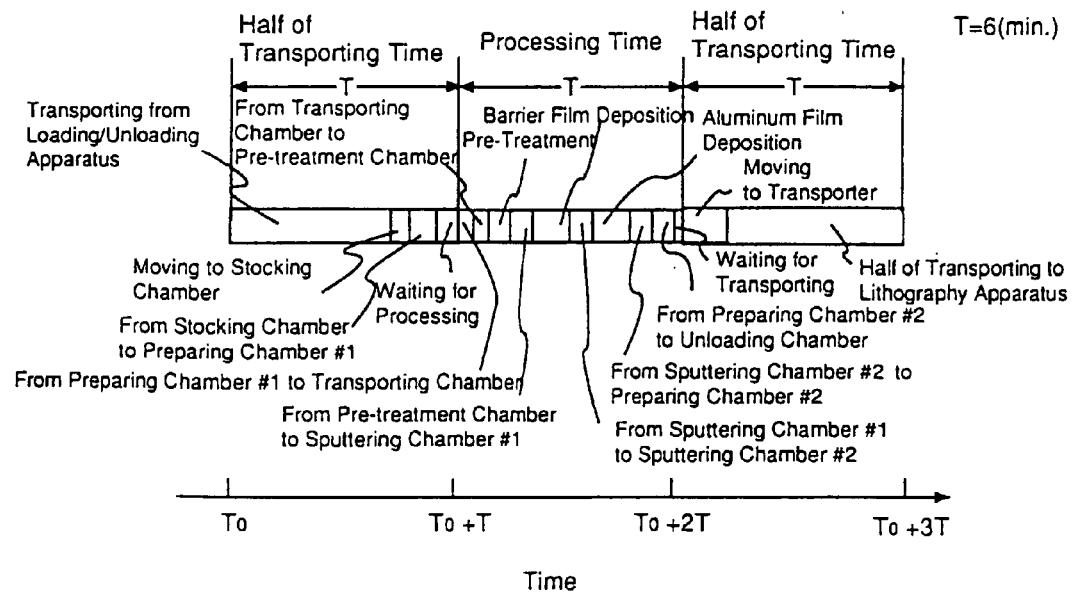

Fig. 31
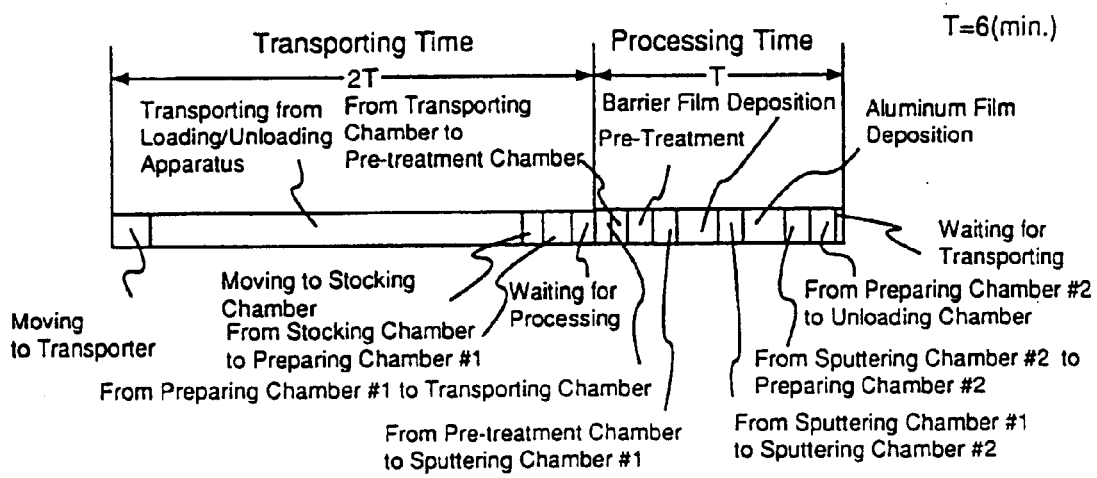
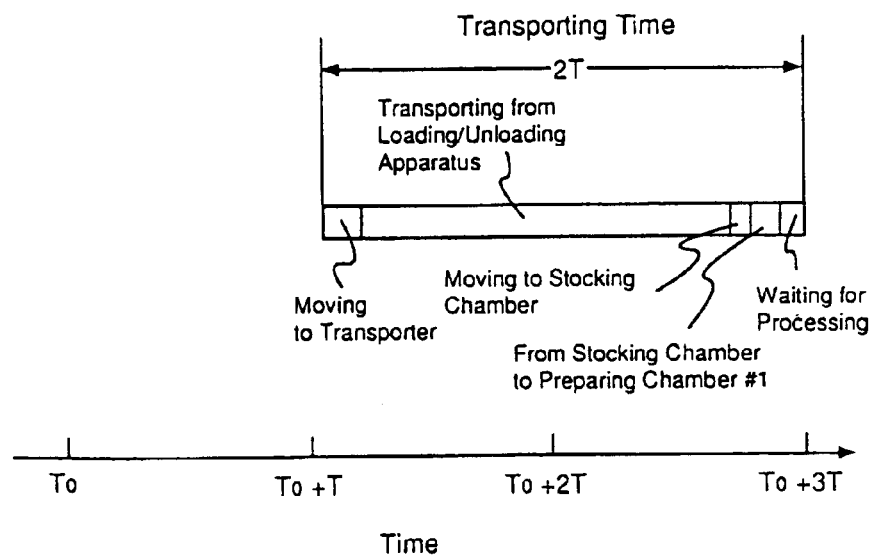

Details of Transporting and Processing in Insulating Films Deposition Apparatus.

Fig. 43

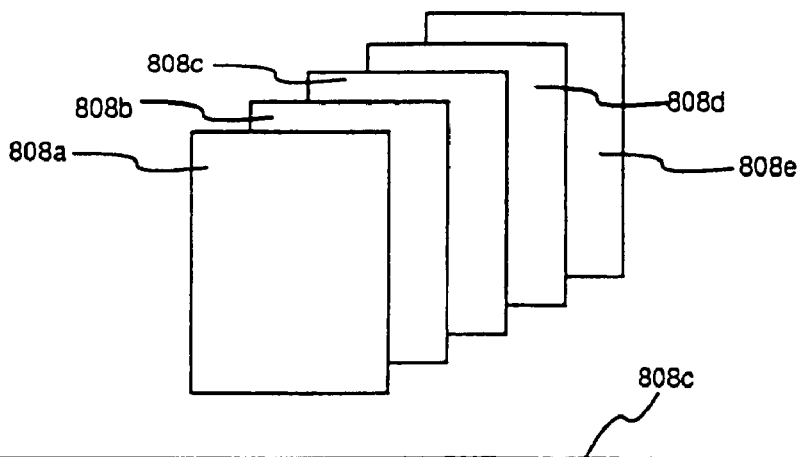

| Wafer # : 00002, Kind : ABCD, Start : 940505 | | |
|---|---|---|
| Step # | Process | Information on Result of Processing and Transporting |
| 1 | Contact Hole Lithography | Kind: ABCD, Layer: Contact Hole, Check: OK |
| 2 | Contact Hole Dry Etching | Kind:ABCD, Layer:Contact Hole, Normal Operation |
| 3 | Ashing | Kind:ABCD, Layer:Contact Hole, Normal Operation |
| 4 | Cleaning | Condition: After Cont. Etching, Normal Operation |
| 5 | SiO2 Cleaning | Condition: Before 1st Metal Depo., Normal Operation |
| 6 | TiN Film Sputtering | Set: 100nm, Result: 110nm, Normal Operation |
| 7 | W Film CVD | Set: 150nm, Result: 155nm, Normal Operation |
| 8 | 1st Metal Lithography | Kind: ABCD, Layer: 1st Metal, Under Exposure |
| 9 | 1st Metal Dry Etching | |
| 10 | Ashing | |
| 11 | Cleaning | |
| 12 | Insulator Film Deposition | |
| 13 | SOG Coating, Baking | |
| 14 | Insulator Film Deposition | |
| 15 | Via Hole Lithography | |
| 16 | Via Hole Dry Etching | |
| 17 | Ashing | |
| 18 | Cleaning | |
| 19 | SiO2 Cleaning | |
| 20 | W Film CVD | |
| 21 | Al Film Sputtering | |
| 22 | 2nd Metal Lithography | |
| 23 | 2nd Metal Dry Etching | |
| 24 | Ashing | |
| 25 | Cleaning | |
| 26 | Insulator Film Deposition | |
| 27 | Silicon Nitride Deposition | |
| 28 | Passivation Layer Lithography | |
| 29 | Passivation Layer Dry Etching | |
| 30 | Ashing | |
| 31 | Cleaning | |

Fig. 44

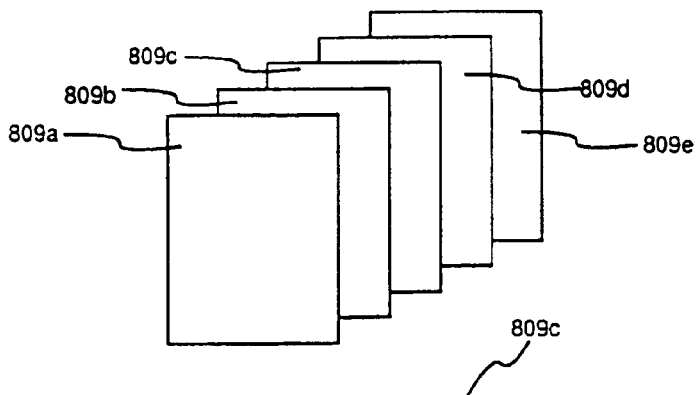

| Wafer # : 00002, Kind : ABCD, Start : 940505, End : 940505 17 : 30 | | | |
|---|---|---|---|
| Step # | Process | Information on Result of Processing and Transporting | Scheduling Information of Proc. |
| | | | Proc. Apparatus / Starting Time |
| 1 | Contact Hole Lithography | Kind: ABCD, Layer: Contact Hole | 201 | 940505 10:00 |
| 2 | Contact Hole Dry Etching | Kind:ABCD, Layer:Contact Hole | 203-1 | 940505 10:30 |
| 3 | Ashing | Kind:ABCD, Layer:Contact Hole | 203-3 | 940505 10:40 |
| 4 | Cleaning | Condition: After Cont. Etching | 205-2 | 940505 10:50 |
| 5 | SiO2 Cleaning | Condition: Before 1st Metal Depo. | 205-1 | 940505 11:00 |
| 6 | TiN Film Sputtering | Set: 100nm, Result: 110nm | 206-1 | 940505 11:10 |
| 7 | W Film CVD | Set: 150nm, Result: 155nm | 206-3 | 940505 11:20 |
| 8 | 1st Metal Lithography | Kind:ABCD, Layer: 1st Metal | 201 | 940505 11:30 |
| 9 | 1st Metal Dry Etching | Set: W/TiN=155nm/110nm | 204-1 | 940505 12:00 |
| 10 | Ashing | Kind:ABCD, Layer: 1st Metal | 204-2 | 940505 12:10 |
| 11 | Cleaning | Condition: After 1st Metal Etching | 205-3 | 940505 12:20 |
| 12 | Insulator Film Deposition | Condition: Lower Layer of Insulating | 207-2 | 940505 12:30 |
| 13 | SOG Coating, Baking | Condition: Insulating | 207-3 | 940505 12:40 |
| 14 | Insulator Film Deposition | Condition: Upper Layer of Insulating | 207-2 | 940505 12:50 |
| 15 | Via Hole Lithography | Kind: ABCD, Layer: Via Hole, Now Dev. | 202 | 940505 13:00 |
| 16 | Via Hole Dry Etching | | 203-1 | 940505 13:30 |
| 17 | Ashing | | 203-3 | 940505 13:40 |
| 18 | Cleaning | | 205-2 | 940505 13:50 |
| 19 | SiO2 Cleaning | | 205-1 | 940505 14:00 |
| 20 | W Film CVD | | 206-3 | 940505 14:10 |
| 21 | Al Film Sputtering | | 206-2 | 940505 14:20 |
| 22 | 2nd Metal Lithography | | 201 | 940505 14:30 |
| 23 | 2nd Metal Dry Etching | | 204-1 | 940505 15:00 |
| 24 | Ashing | | 203-3 | 940505 15:30 |
| 25 | Cleaning | | 205-3 | 940505 15:40 |
| 26 | Insulator Film Deposition | | 207-2 | 940505 15:50 |
| 27 | Silicon Nitride Deposition | | 207-1 | 940505 16:00 |
| 28 | Passivation Layer Lithography | | 202 | 940505 16:30 |
| 29 | Passivation Layer Dry Etching | | 203-1 | 940505 17:00 |
| 30 | Ashing | | 203-3 | 940505 17:10 |
| 31 | Cleaning | | 205-2 | 940505 17:20 |

FABRICATION SYSTEM AND FABRICATION METHOD

This is a continuation application of U.S. Ser. No. 09/611,976, filed Jul. 6, 2000, now abandoned, which is a divisional application of U.S. Ser. No. 09/106,147 filed Jun. 29, 1998, now U.S. Pat. No. 6,099,598, which is a continuation application of U.S. Ser. No. 08/713,192, filed Sep. 12, 1996, now U.S. Pat. No. 5,820,679, which is a file wrapper continuation application of U.S. Ser. No. 08/274,308, filed Jul. 12, 1994, abandoned.

BACKGROUND OF THE INVENTION

The present invention relates to a fabrication system and a fabrication method capable of fabricating various kinds of semiconductor devices for a short period of time.

In automated fabricating plants, various kinds of works are processed in a plurality of automated fabrication apparatuses. In such a fabricating plant, the scheduling of processing is determined in terms of the appointed data of works, working efficiency, and the minimized amount of semi-finished products between processing apparatuses. To smoothly perform the above processing in the automated fabricating plant, it is important to enhance the reliability of each processing apparatus and a system managing computer; and it is more important to enhance the function of managing the whole fabricating system. This is because, in the automated fabricating plant, the fabricating system is automatically operated, and it is managed by the unit having the function of managing the fabricating system.

In particular, in a fabricating plant for semiconductor devices, a plurality of semiconductor wafers of various kinds are processed using a plurality of processing apparatuses according to processing steps and processing conditions determined for every kinds of wafers. In some cases, the same apparatus is used for different processes, and thereby the repeating of the processing becomes very complicated. Accordingly, a high management function is required for the fabricating system for semiconductor devices. One example of the complicated processing in the fabricating system for semiconductor devices will be described. A circuit element used in assembly of a semiconductor device is formed of at least one semiconductor chip. In general, the chips are obtained by cutting circuit element areas arranged on a semiconductor wafer in the longitudinal and lateral directions, along the boundaries. Various processing steps are required to form circuit element areas on a semiconductor wafer. For example, processes of forming areas including the desired impurities atoms on a semiconductor wafer includes (1) a process of cleaning the wafer; (2) a heat treatment process of oxidizing the surface of the wafer; (3) a resist coating process of coating a photoresist on an oxide film and drying it; (4) an exposing process of exposing the desired area of a resist by an energy particle beam such as a light beam, electron beam or X-ray; (5) a developing process of selectively removing the exposed or non-exposed portion of the photoresist; (6) an etching process of removing the exposed oxide film using the resist partially remaining on the oxide film as a mask; (7) a resist removing process of removing the resist partially remaining on the oxide film; (8) an impurities introducing process of depositing impurities on the wafer or allowing them to permeate a surface layer portion by exposing the wafer in the impurity atmosphere using the oxide film as a mask, or using CVD, vapor-deposition or ion implantation; and diffusing the impurities up to the desired depth by heating; and (9) an etching process of removing the unnecessary oxide film or the like on the surface of the wafer. A sequence of processes from the resist removing process (3) to the developing process (5) or to a resist baking process applied after the developing process as needed are called photolithography processes, and which are repeatedly used for the formation of the circuit element. Namely, the photolithography processes are used for the formation of a metal film and the formation of a passivation layer, other than the formation of the impurity introducing area. In this way, various processes are applied to the wafer, and further, some processes, for example included in the photolithography processes are repeatedly applied to the same semiconductor wafer by twice or more. In general, the number and order of various processes applied to the wafer are partially different for the kinds of products. In processing of semiconductor wafers, several hundreds of kinds of works are processed by one method selected from several tens of methods. Moreover, the number of semiconductor wafers processed simultaneously are extremely large. It is extremely difficult to process these semiconductor wafers under good management. As a result, there occur problems in that the appointed date is made longer, and the working ratio of each processing apparatus is reduced thereby lowering the number of products finished per unit time. Moreover, the cleanliness of a clean space in which semiconductor wafers are processed must be usually kept to be high. However, since many operators get around in a clean space in which processing apparatuses are disposed, dust adhering on the clothes of the operators and floors are scattered, which makes it difficult to keep the high cleanliness of the clean space. This causes a disadvantage that the dust adheres on semiconductor wafers thereby reducing the percent non-defective. To cope with this disadvantage, there has been known a method, exemplified in Japanese Patent Laid-open No. SHO 64-6540, wherein works are processed in an unmanned system for preventing the contamination of semiconductor wafers, and a sequence of processing steps are organically controlled to manage a plurality of semiconductor wafers of various kinds, thereby reducing the term of works, enhancing the percent non-defective, and lowering the number of operators.

The prior art managing system for automating the very complicated fabricating system for semiconductor devices described above has been described, for example in "Operation of LSI Production System to Reduce Development Investment and to Meet Diversified Needs" (Nikkei Microdevice, August, 1992, pp. 66–74). At the beginning of the automated fabrication, a centralized control system has been extensively performed, in which processing information in a plant is all inputted in a central computer and the work indications are performed by the computer. In this system, when the centralized control computer is normally operated, it usually grasps the whole state of the fabricating system, and thereby a high level control can be realized. However, this system is disadvantageous in that when the computer fails, the control of the fabricating system is stopped because of the absence of any means replaced with the computer. A software incorporated in the centralized control computer is of a model type including processing apparatuses and transporters, and many cases, algolizm depending on the features of processing apparatuses and transporters is incorporated therein. Accordingly, in renewal of a processing apparatus, the software incorporated in the computer must be exceedingly corrected, thus requiring a large amount of labor for the correction and expansion of the software. A distributed processing system is used to solve the above disadvantage of the centralized control system, in which the centralized computer is replaced by a plurality of computers. The management of the distributed processing system is described, for example in Japanese Patent Laid-open No. SHO 63-244730. However, even when either of the above-described managing systems is used to automate the fabricating system, the effect of shortening the term of works and the effect of increasing the number of products per unit time by enhancing the working ratio and the percent non-defective do not reach the sufficient level for achieving the suitable time/suitable amount production.

The first reason for this is that in the prior art, the transporting between a plurality of processing apparatuses is performed by a batch system, in which the so-called "lot" constituted of a plurality of semiconductor wafers is taken as a unit. The diameter of a semiconductor wafer has been enlarged for enhancing the productivity. For the purpose of performing a high accurate processing to such a semiconductor wafer, the processing in each processing apparatus has been changed from the conventional batch system to a single wafer processing. However, even in the single wafer processing apparatus, so long as semiconductor wafers are processed for each unit of lot, one processing takes a time required to process the number of semiconductor wafers constituting one lot, which makes longer the waiting time until the subsequent processing. Therefore, even if the management of products and processes is enhanced using computers, there is a limitation to the shortage of the term of works in principle. Moreover, the waiting time between specified two continued processes is greatly dependent on the lot, that is, on the semiconductor wafer, thus obstructing the improvement in percent non-defective.

The second reason for this is that, it is very difficult to optimize a plurality of complicated processes even by the control using computers in the lot processing environment, thus reducing the productivity. In a fabricating system, the number of processing apparatuses capable of performing the same process is determined on the basis of the throughput while examining the processing number for each wafer in each processing apparatus, and thus the processing ability (wafer/unit time) of each processing apparatus is equalized. However, in some cases, the fabricating system cannot actually achieve the processing ability thus calculated as a whole. Namely, it is impossible to optimize the complicated processes, the balance in the processing amount in each processing apparatus is not kept, thus reducing the productivity.

The third reason for this is that, in the fabricating system by batch transporting, a large amount of works in process (non-finished products) are required to ensure the productivity, thereby making longer the term of works. Moreover, when the term of works is made longer, the stay time of semiconductor wafers in a clean space where the fabricating system is contained is made longer, and thereby a high cleanliness of the clean space is required to prevent the reduction of percent non-defective. The fine pattern of a circuit element requires a high cleanliness, and it becomes difficult to realize a clean space with a high cleanliness, because the buildings having the clean space becomes very complicated and expensive, and a large energy is required to keep the clean space. One of the disadvantage of the prior art fabricating system by the batch transporting is to require a clean space with a high cleanliness.

To cope with the above disadvantage, in recent years, a fabricating system using a single wafer transporting has been proposed, for example in Japanese Patent Nos. HEI 4-130618 and HEI 4-199709, wherein a single wafer is transported between a plurality of processing apparatuses The prior art fabricating system disclosed in Japanese Patent Laid-open No. HEI 4-199709 has a disadvantage in increasing the number of processing apparatuses. Even when a plurality of processes can be performed using the same processing apparatus, a plurality of processing apparatuses must be prepared in the order of the processing steps. If not so, the flows of semiconductor wafers are crossed to each other, and two or more wafers cannot be simultaneously processed in the fabricating system. As described above, for example, the photolithography processes are repeatedly used for the formation of a circuit element. The resist coating and resist baking process included in the photolithography processes is repeatedly applied to the same semiconductor wafer by twice or more. To prevent an increase in the number of processing apparatuses, the processing apparatus required in some processes must be commonly used. To commonly use the resist coating and baking process, the resist coating and resist baking apparatus must be directly connected to all of processing apparatuses for performing processes before and after the resist coating and resist baking process by means of an inter-apparatus single wafer transporter not by way of other processing apparatuses. For example, it must be connected to all of the film deposition apparatuses. It is impossible to realize such a construction by the system shown in Japanese Patent Laid-open No. HEI 4-199709.

On the contrary, in the system shown in Japanese Patent Laid-open No. HEI 4-130618, all of processing apparatuses are connected to each other by means of an inter-apparatus single wafer transporter, so that the above-described disadvantages can be solved. This is because each semiconductor wafer can be transported between any two processing apparatuses. The disadvantage of this system lies in that a plurality of semiconductor wafers are crossed to each other in processing apparatuses and transporters. Only by connecting single wafer processing apparatuses to each other by means of a single wafer transporter, it cannot be achieved to obtain a high efficiency in simultaneously processing a plurality of semiconductor wafers.

First, it is required to determine the number of processing apparatuses on the basis of the throughput while examining the processing number for each semiconductor wafer in each processing apparatus, and to equalize the processing ability (wafers/unit time) of each process. In the system shown in Japanese Patent Laid-open No. HEI 4-130618, the number of processing apparatuses is determined on the basis of a failure frequency and a repairing time, and the first processing for one wafer is completed and then the next wafer is loaded in the first processing apparatus, with a result that wafers are stayed in the processing apparatus with a lowest processing ability. To avoid the above problem, the processed amount must be reduced on the basis of the ability of the processing apparatus, which causes a disadvantage that the term of works is shortened and the wafer output is reduced. It is necessary to examine the transporter and the transporting time. In the single wafer transporting, the transporting is performed for each unit of a single wafer, so that it becomes very complicated. In the system shown in Japanese Patent Laid-open No. HEI 4-130618, the crossing of semiconductor wafers in the transporting stage is not examined. The control and management for single wafer processing and single wager transporting are also complicated, and is very difficult to be satisfactorily realized.

In the prior art systems described in Japanese Patent Laid-open Nos. HEI 4-130618 and HEI 4-199709, all of processing apparatuses are of a single wafer processing type;

however, by adopting the single wafer processing for all processes, the productivity is reduced in terms of the existing throughput. The above-described prior art systems fail to examine this point, which is one reason why these systems are not extensively used.

The prior art managing system has the following problems. In either of the centralized control system and the distributed processing system, the management of the prior art fabricating system is based on a unit of the so-called lot constituted of several to 25 pieces of wafers. In this case, wafers constituting a lot are contained in a cassette case, so that the management of information for each lot can be performed by the addition of an IC card to each cassette case. The reason why such an auxiliary means is required is as follows: namely, the information to be managed in the system is large; and further, in the case that the management of information is all dependent on a computer for managing the information of the whole system, when there occurs the malfunction and system-down of the information managing computer, all of the management information in the fabricating system is lost, resulting in a large damage. In the fabricating system of the distributed processing system described in the above document "Operation of LSI Production System to Reduce Development Investment and to Meet Versified Needs" (Nikkei Microdeviec, August, 1992), an IC card is attached to each lot. A method of utilizing an identification symbol of a cassette case is disclosed, for example in Japanese Patent No. SHO 61-128512. However, as described above, a processing apparatus of the batch type has been gradually changed into that of the single wafer processing type. Moreover, the transporting between processing apparatuses has been changed from the batch type to the single wafer type. To make efficient use of the advantage of the inter-apparatus single wafer transporting which is at least partially used in the fabricating system, the management of information for each semiconductor wafer is at least partially inevitable. In the inter-apparatus transporting where wafers are transported in a manner not to be contained in a cassette case, an auxiliary storing means such as the IC card moved together with wafers having wafer information to be managed cannot be used. Moreover, since the renewing number of processing information necessary for processing in each processing apparatus becomes extremely larger than in the batch transporting, which causes a problem in that the management of information by the auxiliary storing means such as the IC card is large in the renewal frequency and is cannot be used. To cope with this problem, a method in which information on the kind and process is held in a semiconductor wafer itself is described in Japanese Patent Laid-open Nos. SHO 57-157518, SHO 58-50728, SHO 63-288009, HEI 2-292810 and HEI 5-83520. A method in which information is written in a chip is described in Japanese Patent Laid-open No. SHO 60-10641. In either method, the technique is limited only to the writing or reading of information, and it does not examine the management of information contained in a fabricating system. Since the number of the transporting between processing apparatuses becomes extremely larger, the management of information in the inter-apparatus transporter is required to be managed. In view of the foregoing, there have been required a fabricating system for semiconductor devices which is suitable for single wafer management and is capable of solving the above-described problems; and a fabricating method using the system. Moreover, there have been required a fabricating system for semiconductor devices capable of optimizing a plurality of complicated processing steps controlled by computers, improving the productivity, and reducing the term of works, in the environment of the above-described management of information of a single wafer; and a fabricating method using the system.

SUMMARY OF THE INVENTION

An object of the present invention is to provide a fabricating system capable of shortening the term of a sequence of processes applied to works, making efficient use of processing apparatuses for enhancing the productivity while improving the percent non-defective thereby enlarging the number of products finished per unit time, and eliminating a clean space with a high cleanliness conventionally required; and a fabricating method using the system, which are particularly suitable for a semiconductor fabricating system and a fabricating method using the system mainly performed by single wafer processing and transporting.

The above object can be achieved, according to the present invention, by provision of a fabricating system including:

at least two processing apparatuses; and

L sets (L: positive integer) of inter-apparatus transporters;

wherein either of the processing apparatuses or either of a plurality of the processing apparatuses having the same processing function includes;

a means for receiving and stocking at least one set of works from either of the inter-apparatus transporters for a time interval T min (T; positive number) after a time To; and a means for processing a set of works received before the time To, and unloading a set of already-processed works to either of the inter-apparatus transporters at a time $(To+N \times T)$ (N; positive integer).

The above inter-apparatus transporter for connecting at least two of the above processing apparatuses capable of applying continued processes to each other, preferably, includes a means for transporting a set of works between the two processing apparatuses for a transporting time of $L \times T$ min or less not by way of other processing apparatuses.

The above transporter preferably includes a means for transporting and stocking a set of works started to be unloaded from a processing apparatus at a time $(To+N \times T)$ to and in another processing apparatus capable of applying a continued process until a time $(To+(N+L) \times T)$.

Moreover, the above object can be achieved, according to the present invention, by provision of a fabricating system capable of applying the steps of:

applying the m-th process to the n-th set of works (n, m: positive integer) for a period from $(n+2 \times m-3) \times T$ min to $(n+2 \times m-2) \times T$ min on the basis of a time To;

performing the transporting by an inter-apparatus transporter from the processing apparatus in which the m-th process is performed to a processing apparatus in which the (m+1)-th process is performed for a time interval from $(n+2 \times m-2) \times T$ min to $(n+2 \times m-1+L) \times T$ min; and applying the (m+1)-th process to the n-th set of works for a time interval from $(n+2 \times m-1+L) \times T$ min to $(n+2 \times m+L) \times T$ min.

In the above fabricating system, preferably, all of processing apparatuses for applying continued processes to sets of works are connected to each other by means of inter-apparatus transporters, and all of processing steps applied to a plurality of sets of works are performed by a pipe-line processing method.

In the above fabricating system, preferably, the transporting between processing apparatuses is automated, and works are transported in a partially clean space filled with nitrogen or in vacuum.

As for the managing system, according to the present invention, there is provided a fabricating system wherein a plurality of computers manage the managing information of process progress, and scheduling information of processing and transporting reflected by the result of the scheduling of processing and transporting for semiconductor wafers contained in the system.

Preferably, the above information is generally managed by a computer provided in the fabricating system, and is further managed by each computer distributed in each or set of processing apparatuses and transporters.

The scheduling of processing and transporting is preferably determined by the computer for generally managing the above information and the computer distributed in each or set of the processing apparatuses and the transporters.

Preferably, the above managing information of process progress and the above scheduling information of processing and transporting are for each semiconductor wafer.

These and other objects and many of the attendant advantages of the invention will be readily appreciated as the same becomes better understood by reference to the following detailed description when considered in connection with the accompanying drawing.

BRIEF DESCRIPTION OF THE DRAWINGS

FIG. 4 is a diagram showing one example of a processing procedure for a plurality of semiconductor wafers in the fabricating system according to the present invention;

FIG. 26 is a diagram showing the flow of applying two continued processes to two works using the inventive system and old system;

FIG. 30 is a diagram showing one example of a processing procedure for a plurality of semiconductor wafers in the fabricating system according to the present invention;

FIG. 31 is a view showing one example of a processing procedure for a plurality of semiconductor wafers in the fabricating system according to the present invention;

FIG. 43 is a view showing one example of a data base contained in a memory;

FIG. 44 is a view showing another example of a data base contained in a memory;

DETAILED DESCRIPTION OF THE INVENTION

Figure 1:
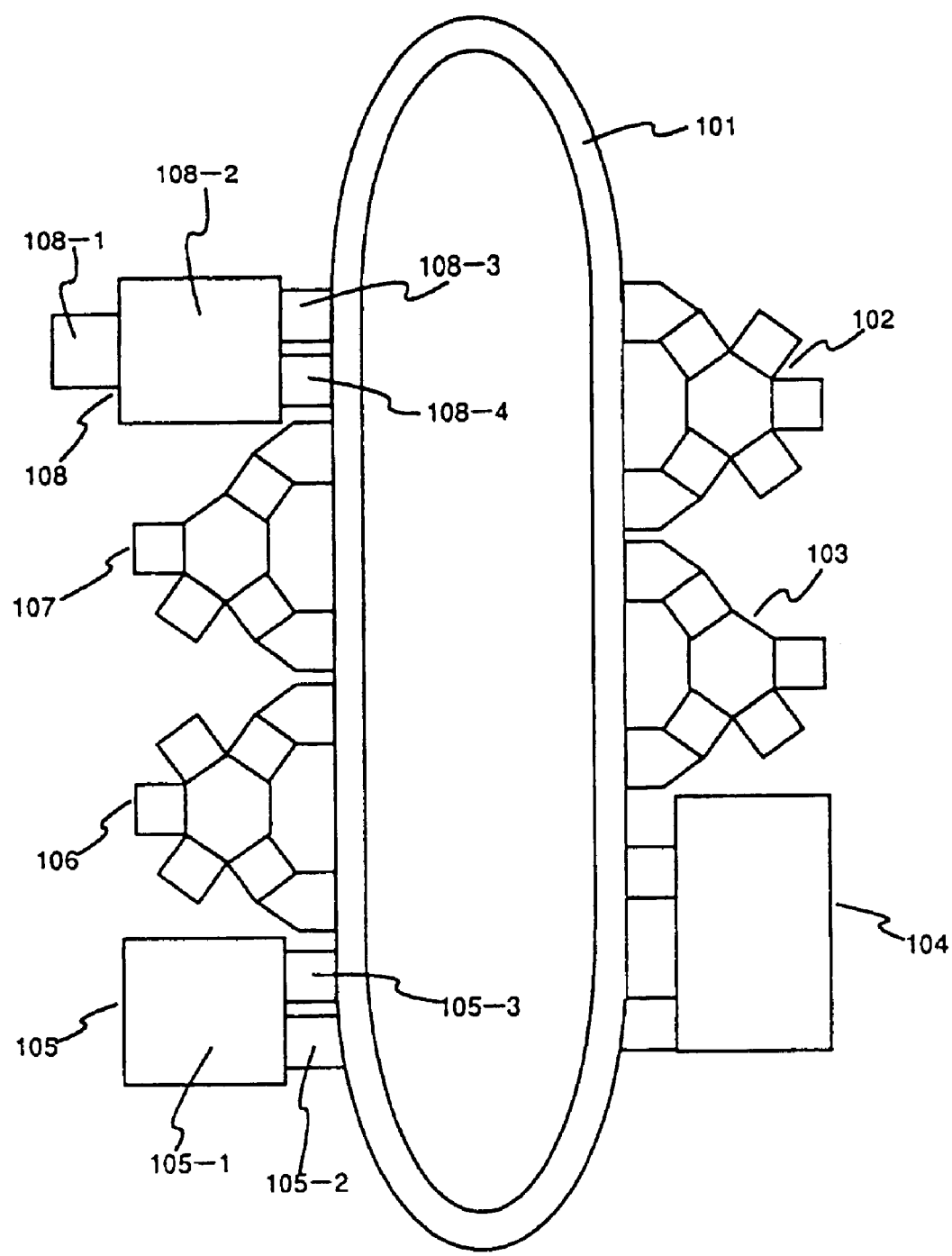
FIG. 1 is a plan view showing one example of a fabricating system for semiconductor devices according to the present invention.

In a fabricating system of the present invention, any processing apparatus can receive and stock at least one set of works from either of L pieces of inter-apparatus transporters for a time interval T (min) after a time To. The distribution of sets of works from the inter-apparatus transporters to the processing apparatuses is performed for a time interval L×T min. One of L pieces of transporters is perfectly emptied until a time (To+L×T). Sets of works are started to be unloaded from some processing apparatuses to the emptied inter-apparatus transporter after the time (To+L×T), and are then distributed to the processing apparatuses again until a time (To+2L×T). Thus, sets of works are sequentially unloaded to L pieces of the inter-apparatuses, one of the inter-apparatus transporters can be emptied for each time interval T min. By making empty one of the inter-apparatus transporters for each time interval T min, and unloading set of works to the emptied transporter, it becomes possible to make easy the scheduling, control and management of loading and unloading of sets of works between processing apparatuses and inter-apparatus transporters. This makes it easy the scheduling, control and management of transporting of a plurality of sets of works in a fabricating system, to enhance the level of the optimization, thus improving the productivity. Each processing apparatus only receives or unloads a set of works from or to either of the inter-apparatus transporters for each time of T min. With this construction, the fabricating system including the processing apparatuses is periodically controlled with the cycle time T min, so that the scheduling for processing a plurality of sets of works is made easy, resulting in the improved productivity. Namely, according to the inventive system, the scheduling, control and management of the processing and transporting, and further the whole production management are made extremely easy, to enhance the level of the optimization, thus improving the productivity.

To reduce the term of works, a set of works started to be unloaded from each processing apparatus to one of L pieces of the transporters at a time (To+T) are preferably those distributed and stocked in the processing apparatus from a time interval from (To−L×T) to the time To, and are processed until a time (To+T). However, in a processing apparatus in which the processing for a set of works takes a time T min or more, the above requirement is not necessarily satisfied. Namely, a set of the works distributed in the processing apparatus before a time (To−L×T) and are processed for a time interval T min or more may be unloaded to one of the transporters at a time (To+T). For example, even the batch type processing apparatus in which a set of works (M pieces or more) are processed once may satisfy the necessary function for the processing apparatus of the present invention by the addition of the stocking function or the function of loading/unloading a set of works (M pieces or more) between the processing apparatus and the inter-apparatus transporter with a cycle time T min.

A plurality of sets of processing apparatuses having the same function may satisfy the necessary function for the processing apparatus described above. For example, when two processing apparatuses in each of which the processing is performed for a time interval more than T min and less than 2T are periodically controlled with a cycle time 2T while shifting the starting time by T min, a set of processing apparatuses have the same function as that of the processing apparatus in which the processing is controlled with a cycle time less than T min, that is, the function of receiving and stocking a set of works from the inter-apparatus for a time interval T min after To, and unloading at least one set of works from the processing apparatus to the inter-apparatus after a time (To+T).

In the continued processing to a plurality of sets of works, sets of works are not necessarily unloaded from all of the processing apparatuses to the transporters for each time interval T min. In some cases, the unloading is not performed from a processing apparatus in which a set of works to be processed are not distributed. Moreover, when sets of works in the number exceeding the number of the processing apparatuses having the same function are distributed in the processing apparatuses, sets of the works are overlapped. At this time, a means for stocking a plurality of sets of works may be provided in each processing apparatus, or a stocking apparatus for stocking a plurality of sets of works may be separately provided in the fabricating system.

The inventive system is effective to shorten the term of works. The term of works is reduced by a pipeline processing, other than the effect of enhancing the productivity. The pipeline process is suitable for applying a plurality of processes to a plurality of sets of works. In the pipeline processing of the inventive system, a plurality of continued processes are combined with the transporting therebetween. In this pipeline processing, a time interval L×T min is allocated to the transporting. The pipeline processing is effective to process and transport a plurality of works, and is most effective to process and transport one work as a unit (M=1).

As described above, semiconductor wafers used as in the semiconductor industry have various kinds, and they are subjected to a large number of various processes. Consequently, the number of sets of works is increased. As the number of processes is increased, the pipe line processes achieves the effect of reducing the term of works, and is most effective, when L=1.

The pipeline processing of the present invention is effective to reduce the term of works compared with the conventional lot processing. This will be described with reference to FIG. 26, wherein L=1 and M=1. In FIG. 26, two of continued processes (a) and (b) are applied to two works (A) and (B). In the pipeline processing, the work (A) is transported directly after being subjected to the process (a) by the single wafer transporting manner, and is subjected to the process (b). The work (B) is subjected to the process (a) after the processing of the work (A) in the process (a) is completed, and is transported by the single wafer transporting manner like the work (A) and is subjected to the process (b). When each of the processes (a) and (b), and the transporting takes a time interval T min for each work, a time required to complete all processing and to finally transport the work (B) is 5T min. In the lot processing, after the works (A) and (B) are subjected to the process (a), they are transported, and are subjected to the process (b). When the transporting in this case takes a time interval T min, a time required to perform all processing and to finally transport the works (A) and (B) is 6T min. The pipeline processing reduces the total time by T min. As the numbers of works and processes are increased, the difference between the pipeline processing and the lot processing becomes increased.

In the inventive system, the transporting between processing apparatuses is automated, and works can be transported in a local clean space filled with nitrogen or in vacuum, thus eliminating the clean space with a high cleanliness.

The fabricating system has a data base for generally managing the managing information of process progress for each semiconductor wafer, and also a plurality of data bases each containing part of the above general managing data base, so that when the general managing data base is broken by any cause and contains erroneous information, the fabrication can be continued on the basis of the data contained the other data bases. On the contrary, when a plurality of the data bases are broken an contain erroneous information, the fabrication can be continued on the basis of the general managing data base. When the above data base has the information on result of processing and transporting reflected by the result of processing and transporting, it may be used for the feedforward control to enhance the accuracy of the processing. When the above data base has the scheduling information of processing and transporting reflected by the scheduling of processing and transporting, it may be used to determine the operational condition of the processing and the transporting by computers distributed in each or set of the processing apparatuses and inter-apparatus transporters.

When the present invention is applied to a fabricating system and a fabricating method for semiconductor devices in which the single wafer processing and single wafer transporting are performed, it is possible to perform the single wafer information management with a high reliability, and to make efficient use of the single wafer transporting. Namely, it is possible to shorten the term of a sequence of processes applied to semiconductor wafers, to improve the productivity and percent non-defective thereby increasing the number of products finished for unit time, and to eliminate the clean space with a high cleanliness.

The present invention will be more clearly understood with reference to the following examples.

In addition, in the following description, numeral 101 designates an inter-apparatus single wafer transporter; 102 is a metal film deposition apparatus; 103 is an insulator film deposition apparatus; 104 is a lithography apparatus; 105 is a stocking apparatus; 106 is a metal film dry etching apparatus; 107 is an insulator film dry etching apparatus; and 108 is a loading/unloading apparatus. Numerals 201 and 202 are lithography apparatuses; 203 and 204 are dry etching apparatuses; 205 and 206 are film deposition apparatuses; 207 is a cleaning apparatus; 208 is a looped transporter; 209 is an interface; and 210 is as stocking apparatus. Numerals 301 and 302 are lithography apparatuses; 303 and 304 are dry etching apparatuses; 305 is a cleaning apparatus; 306 and 307 are film deposition apparatuses; 308 is a looped transporter; 309 is an interface; and 310 is a stocking apparatus. Numeral 401 is a lithography apparatus; 402 is an ion implanting apparatus; 403 is a dry etching apparatus; 404 and 405 are film deposition apparatuses; and 406 is an ultra-clean space. Numeral 501 is a lithography apparatus; 502 is a looped transporter; 503a and 503b are linear transporters; 504 and 505 are dry etching apparatuses; 506 and 507 are film deposition apparatuses; 508 is a common exhaust system; 509 is a cleaning and wet etching processing apparatus; 510 is an oxidizing apparatus; 511 and 512 are film deposition apparatuses; 513 is a control system; 514 is an ion implantation apparatus; 517 is an annealing apparatus; 518 is a loading/unloading apparatus; and 519 is a coating apparatus. Numeral 601-1 and 601-2 are inter-apparatus transporters; 602 is a metal film deposition apparatus; 603 is an insulator film deposition apparatus; 604 is a lithography apparatus; 605 is a stocking apparatus; 606 is a metal film dry etching apparatus; 607 is an insulator film dry etching apparatus; and 608 is a loading/unloading apparatus. Numeral 701 and 702 are lithography apparatuses; 703 and 704 are dry etching apparatuses; 705 is a cleaning apparatus; 706 and 707 are film deposition apparatuses; 708 is a looped transporter; 709 is an interface; and 710 is a stocking apparatus. Numerals 801a to 801e are processing apparatuses; 802a to 802e are computers; 803a to 803e are computers for managing data bases; 804a to 804e are memories for storing data bases; 805 is a computer for managing a general control data base; 806 is a general managing data base; 808a to 808e are information on result of processing and transporting; 809a to 809e are information on result and scheduling of processing and transporting; 811 and 812 are processing apparatuses; 813 is an inter-apparatus transporter; 814 to 816 are memories; 817 to 826 are semiconductor wafers; and 827 to 836 are data bases. Numerals 901 and 902 are processing apparatuses; 903 is an inter-apparatus transporter; 904 to 906 are memories; 907 to 916 are semiconductor wafers; 917 to 926 are information on result of processing and transporting; 951 and 952 are processing apparatuses for applying two continued processes; 953 to 956 are partial transporting units; 957 to 960 are transporting robots; 961 to 963 are expansible connecting portions; 964 is a laser source; 965 is a laser beam; 966 and 967 are intermediate monitor portions; 968 is final monitoring portion; and 969 and 970 are position adjustment mechanisms.

Embodiment 1

This will be described with reference to FIGS. 1 to 12 and Tables 1 and 3. In this embodiment, one layer metal film and a passivation layer are formed on a semiconductor wafer formed with elements and contact-holes.

FIG. 1 is a view showing the embodiment of the inventive system. A metal film deposition apparatus 102, insulator film deposition apparatus 103, lithography apparatus 104, stocking apparatus 105, metal film dry etching apparatus 106, insulator film dry etching apparatus 107, and wafer loading/unloading mechanism 108 are disposed around a looped inter-apparatus single wafer transporter 101. Six pieces of semiconductor wafers #1 to #6 are continuously processed in the metal film deposition apparatus 102, lithography apparatus 104, metal film dry etching apparatus 106, insulator film deposition apparatus 103, lithography apparatus 104 and insulator film dry etching apparatus 107.

Six pieces of the semiconductor wafers are unloaded to the fabricating system by way of the loading/unloading apparatus 108. First, they are put in a preparing chamber 108-1 of the apparatus 108, and after the atmosphere of the preparing chamber 108-1 is replaced by high purity nitrogen, they are transported to a stocking chamber 108-2 filled with high purity nitrogen by a transporting mechanism provided in the stocking chamber 108-2. The wafers are then unloaded from the stocking chamber 108-2 to the transporter 101 by a transporting mechanism provided in an unloading chamber 108-4 sequentially in the order of the number of the wafers with a time interval of 6 min (which is the specified time interval T in this embodiment) on the basis of a specified starting time. It takes 1 min until the start of the unloading of the wafer #1 after six pieces of the wafers are disposed in the preparing chamber 108-1. The unloading chamber 108-4 is filled with high purity nitrogen. In the transporter 101, the wafers are also transported in a high purity nitrogen atmosphere. The transporter 101 has a mechanism of moving semiconductor wafers along one-direction by a belt, and it takes 4 min for one round. The length of one round is 60 m and the transporting speed is 0.9 km/h. These functions of the transporter 101 can be realized by the conventional transporting technique. A semiconductor wafer can be moved between any two processing apparatuses for 4 min or less by means of this transporter 101. The transporting time of a semiconductor wafer between processing apparatuses, including receiving and unloading times to and from a processing apparatus, is less than the time interval T (6 min).

Figure 2:
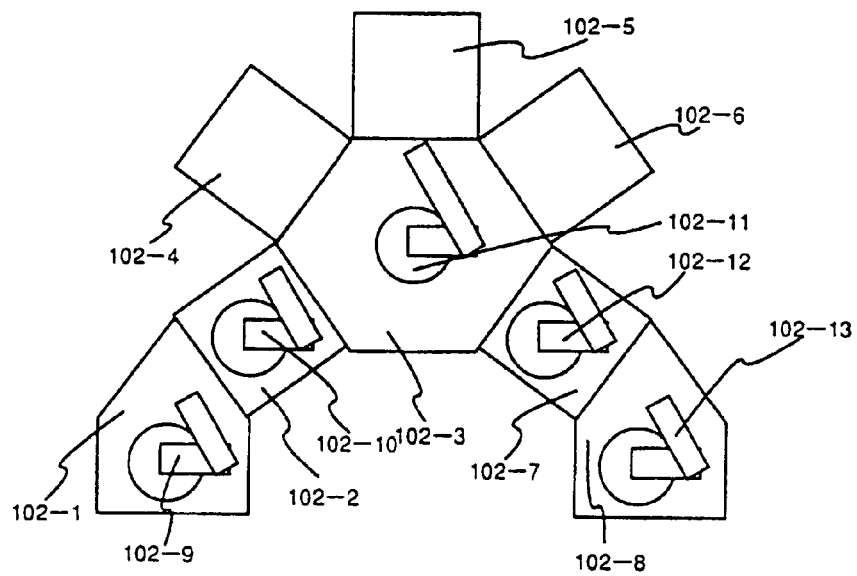
FIG. 2 is a plan view showing one example of a metal film deposition apparatus constituting the fabricating system according to the present invention.
Figure 3:
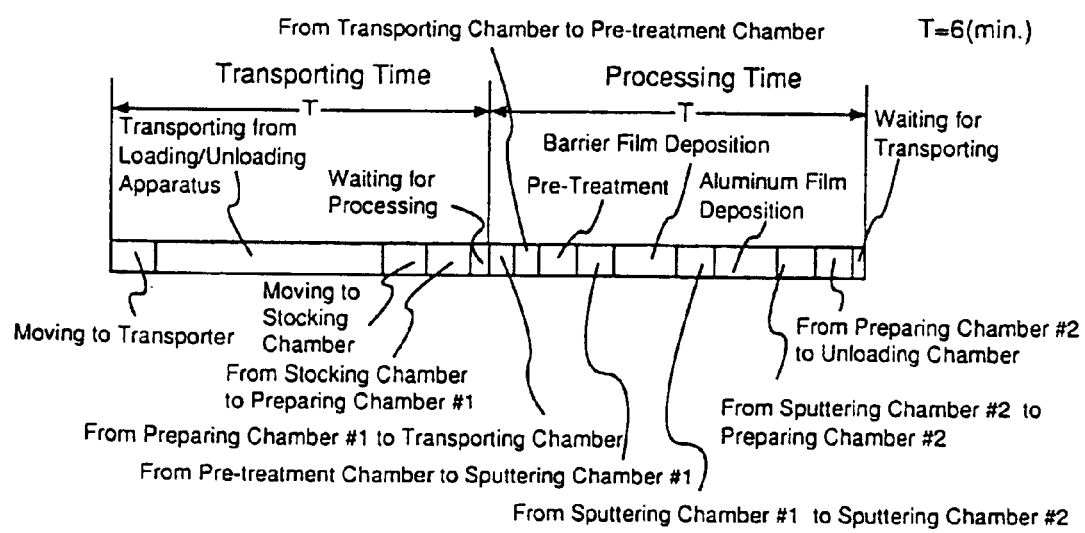
FIG. 3 is a diagram showing one example of a processing procedure for semiconductor wafers in the metal film deposition apparatus shown in FIG. 2.
Figure 5:
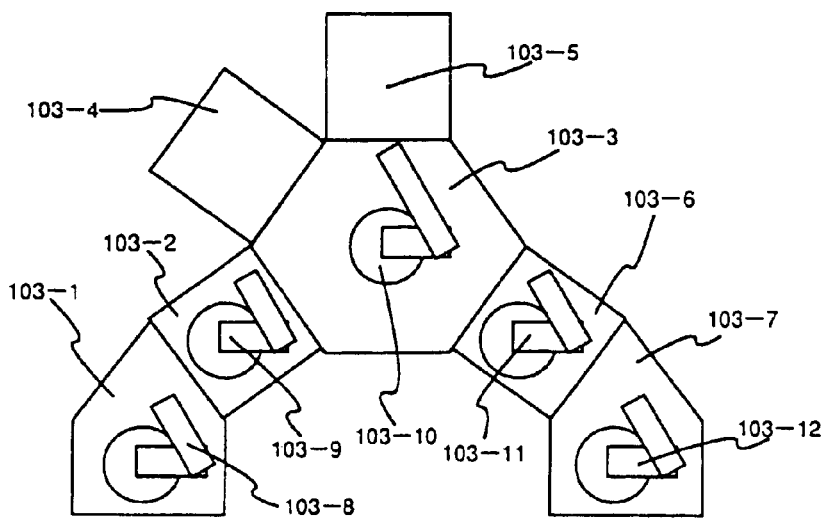
FIG. 5 is a plan view showing one example of an insulator film deposition apparatus constituting the fabricating system according to the present invention.
Figure 6:
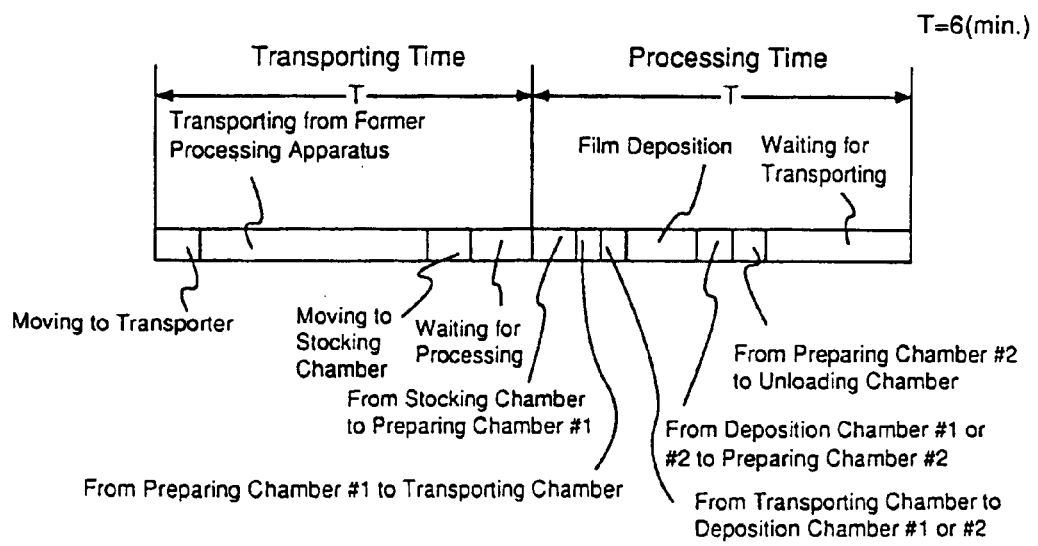
FIG. 6 is a diagram showing a processing procedure for semiconductor wafers in the insulator film deposition apparatus shown in FIG. 5.
Figure 7:
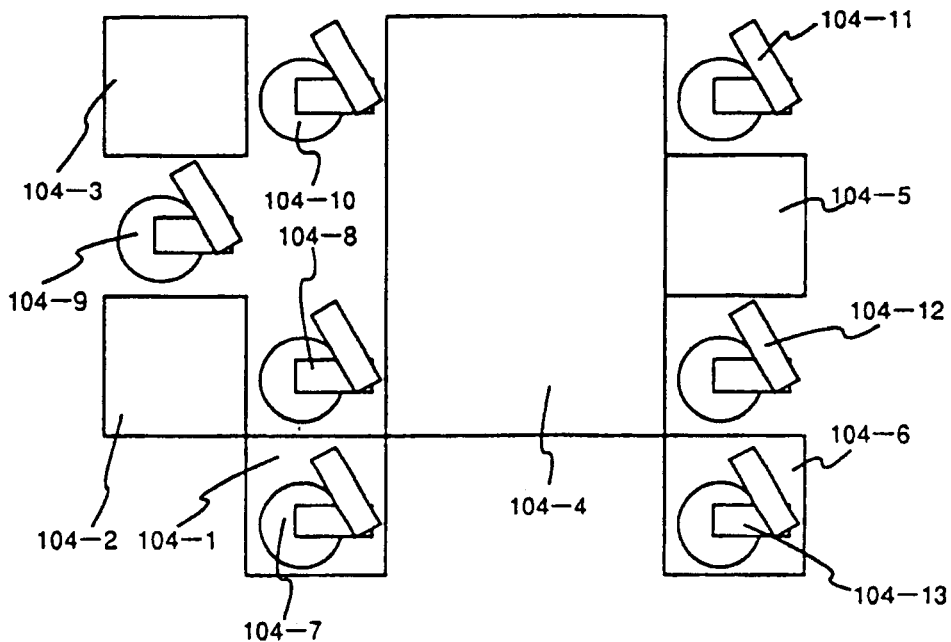
FIG. 7 is a plan view showing one example of a lithography apparatus constituting the fabricating system according to the present invention.
Figure 8:
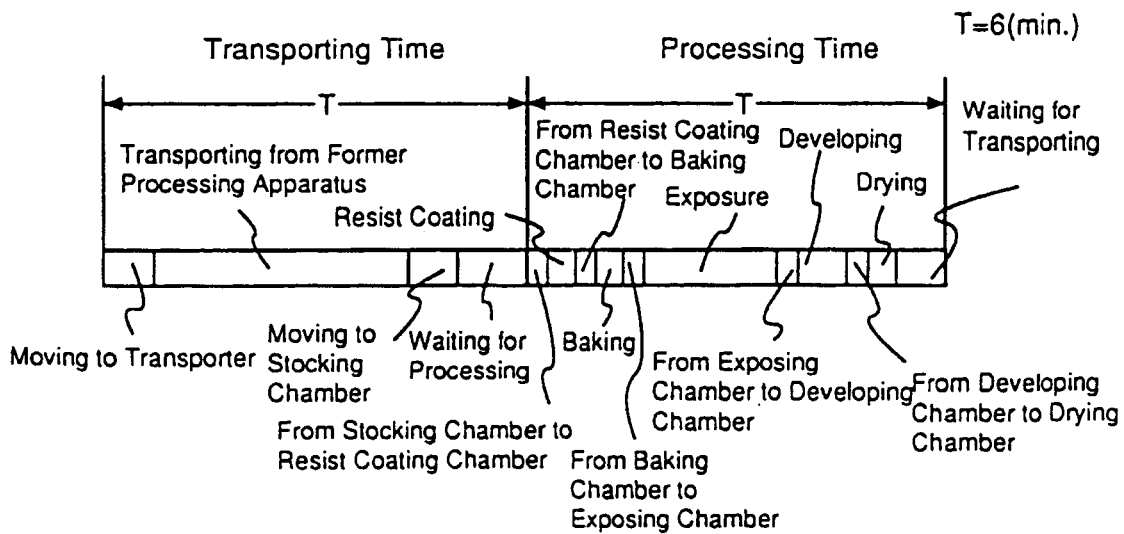
FIG. 8 is a diagram showing a processing procedure for semiconductor wafers in the lithography apparatus shown in FIG. 7.
Figure 9:
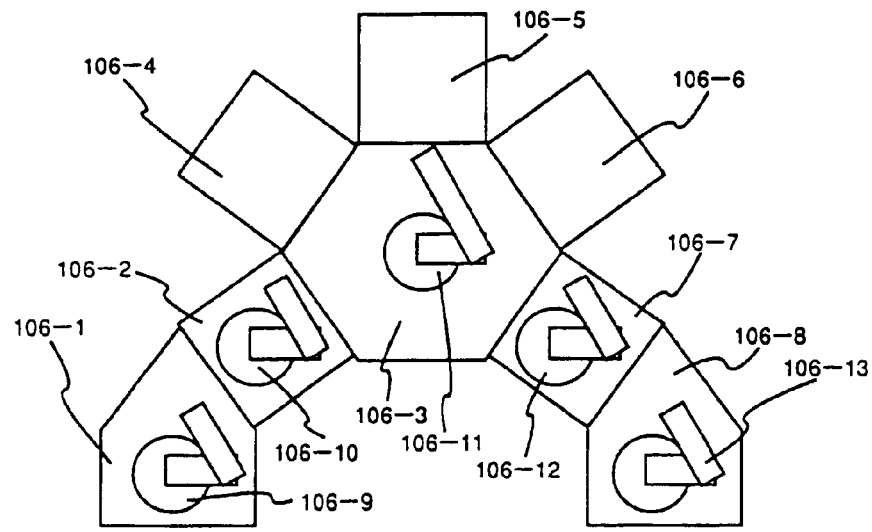
FIG. 9 is a plan view showing one example of a metal film dry etching apparatus constituting the fabricating system according to the present invention.
Figure 10:
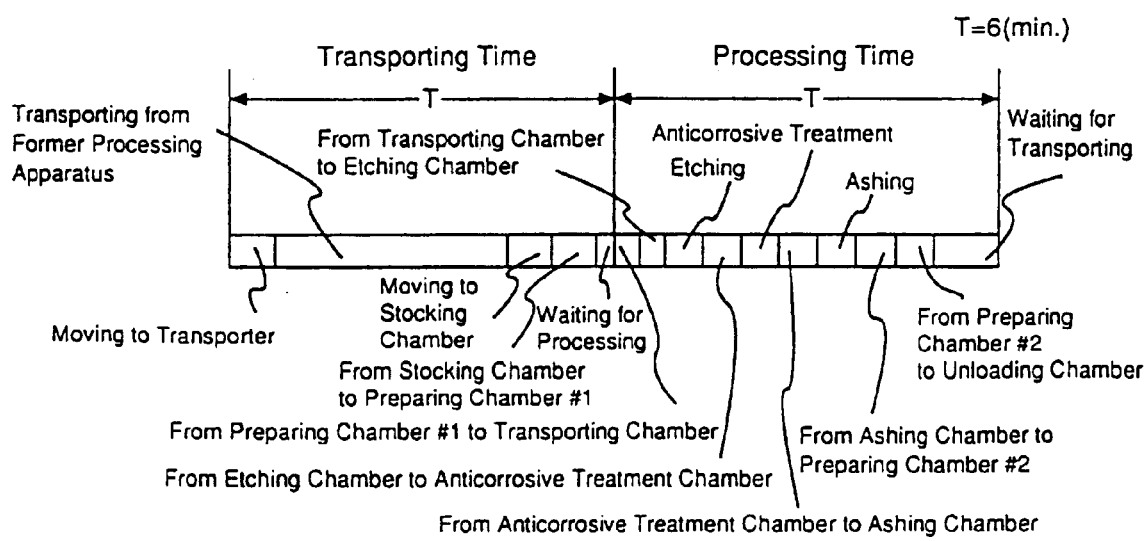
FIG. 10 is a diagram showing a processing procedure for semiconductor wafers in the dry etching apparatus shown in FIG. 9.
Figure 11:
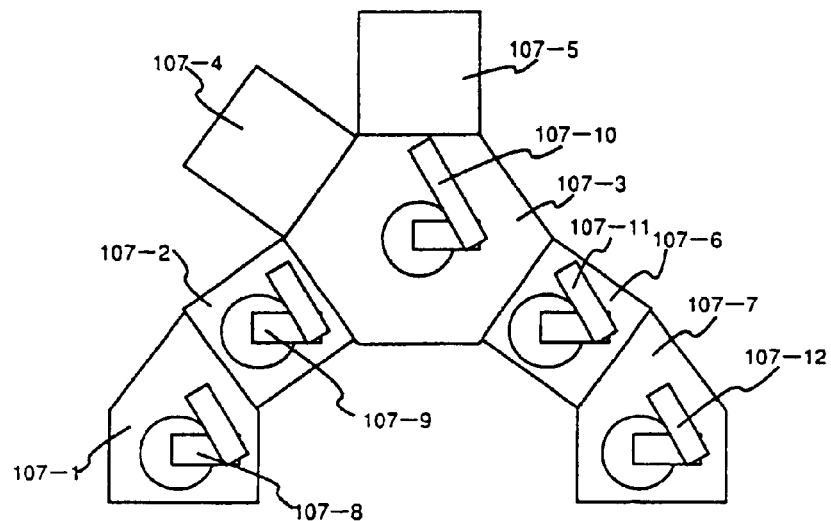
FIG. 11 is a plan view showing one example of an insulator film dry etching apparatus constituting the fabricating system according to the present invention.
Figure 12:
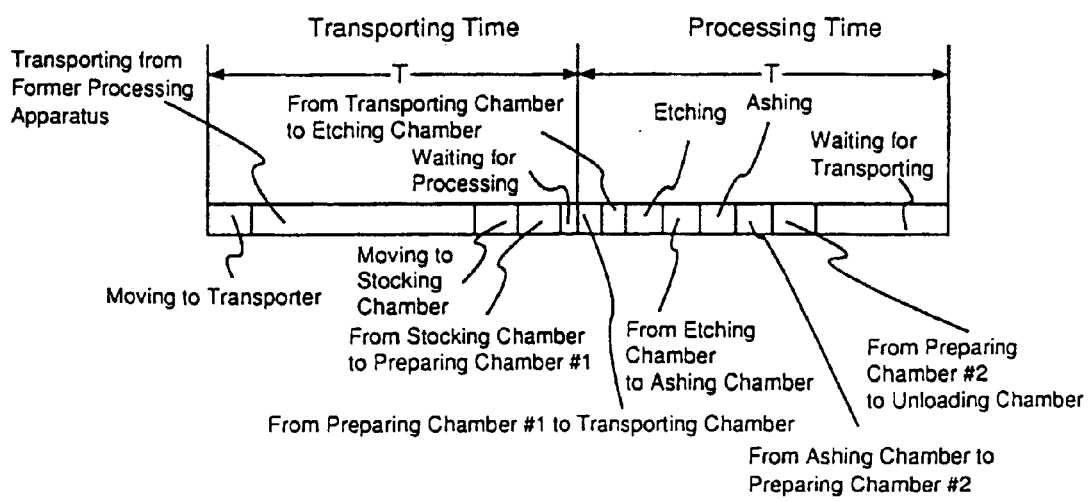
FIG. 12 is a view showing a processing procedure for semiconductor wafers in the dry etching apparatus shown in FIG. 11.

First, the wafer #1 is transported to the metal film deposition apparatus 102 by the transporter 101. The construction of the metal film deposition apparatus 102 is shown in FIG. 2. The details of the processing and the transporting in the apparatus 102 are shown in FIG. 3. Similarly, the construction and the details of the processing and transporting in the insulator film deposition apparatus 103 are shown in FIGS. 5 and 6; those in lithography apparatus 104 are shown in FIGS. 7 and 8; those in metal film dry etching apparatus 106 are shown in FIGS. 9 and 10; and those in insulator film dry etching apparatus 107 are shown in FIGS. 11 and 12.

A transporting mechanism 102-9 of the stocking chamber 102-1 filled with high purity nitrogen receives the wafer #1 from the transporter 101. It is transported to a preparing chamber #1 102-2 filled with nitrogen at the atmospheric pressure by a transporting mechanism 102-10 provided in the preparing chamber #1 102-2, and then the preparing chamber #1 102-2 is evacuated up to 0.06 Pa.

It takes not less than 6 min until the evacuation of the preparing chamber #1 102-2 is completed and the wafer #1 is made possible to be transported to a transporting chamber 102-3, after it is started to be unloaded to the transporter 101 by the transporting mechanisms provided in the unloading chamber 108-4. The processing is started after an elapse of 6 min. The time, at which the wafer #1 is started to be processed in the metal film deposition apparatus 102, is taken as a time To. The wafer #1 waits for a time interval until it is started to be processed after it is made possible be transported to the transporting chamber 102-3.

First, the wafer #1 is transported from the preparing chamber 102-2 to the transporting chamber 102-3 by means of a transporting mechanism 102-11 provided in the transporting chamber 102-3. The pressure in the transporting chamber 102-3 is 6.5×10E(−5) Pa. The wafer #1 is then transported to a pre-treatment chamber 102-4 by the transporting mechanism 102-11 and are subjected to the pre-treatment for film deposition. In this embodiment, a natural oxide film or the like on the bottom of a contact-hole of an Si substrate is removed by soft-etching using Ar soft plasma. The pressure is 0.65 Pa and the etching time is 30 sec. After evacuation of the pre-treatment chamber 102-4, the wafer #1 is transported to a sputtering chamber #1 102-5 by way of the transporting chamber 102-3 by a transporting mechanism 102-11 provided in the transporting chamber 102-3. In the sputtering chamber #1 102-5, the wafer #1 is formed with a barrier film, which is TiN in this embodiment, to a thickness of 150 nm by a reactive sputter using a discharge gas of Ar and $N_2$. In the film formation, the pressure is 0.5 Pa, and the processing time is 1 min. The wafer #1 is then transported to a sputtering chamber #2 102-6 by way of the transporting chamber 102-3 by the transporting mechanism 102-11. In the sputtering chamber #2 102-6, an Al-1% Si-0.5% Cu alloy film is deposited. The thickness of the Al alloy film is 700 nm, the pressure for the film deposition is 0.5 Pa, and the processing time is 1 min. After that, the wafer #1 is transported to a preparing chamber #2 102-7 with a pressure of 0.06 Pa by way of the transporting chamber 102-3 by the transporting mechanism 102-11. After the pressure of the preparing chamber #2 102-7 is returned to the atmospheric pressure using nitrogen, the wafer #1 is transported to an unloading chamber 102-8 filled with high purity nitrogen by a transporting mechanism 102-12 provided in the preparing chamber #2 102-7. It takes not less than 6 min, that is, 5.7 min until the wafer #1 is transported to the unloading chamber 102-8 and is made possible to be transported to the transporter 101 by a transporting mechanism 102-13 provided in the unloading chamber 102-8, after it is started to be transported to the transporting chamber 102-3 from the preparing chamber #1 102-2. The wafer #1 is started to be transported to the next processing apparatus after an elapse of 6 min. The wafer #1 waits for a time interval until it is started to be transported after it is made possible to be unloaded to the transporter 101.

The time, at which the wafer #1 is started to be processed in the metal film deposition apparatus 102, is taken as the time To. FIG. 4 is a view for explaining the details of the processing and transporting applied to the wafers #1 and #2 for a time period of 2T (=12) min after the time To. The processing time of the wafer #1 in the metal film deposition apparatus 102 is the time from To to (To+T), that is, the time T (=6) min. The transporting time of the wafer #1 from the metal film deposition apparatus 102 to the lithography apparatus 104 is the time from (To+T) to (To+2T), that is, the time T min. This transporting will be described. First, at the time (To+T), the wafer #1 is started to be unloaded to the transporter 101 by means of a transporting mechanism 102-13 (FIG. 2) provided in the unloading chamber 102-8, and it is transported to the subsequent lithography apparatus 104 by the transporter 101. It is transported from the transporter 101 to a stocking chamber 104-1 by means of a transporting mechanism 104-7 provided in the stocking chamber 104-1 (FIG. 7). The wafer #1 waits for a time interval until the time (To+2T) after the wafer #1 is transported to the stocking chamber 104-1 and it is made possible to be transported to a coating chamber 104-2 of the lithography apparatus 104 by means of a transporting mechanism 104-8.

FIG. 4 also shows the details of the processing and transporting applied to the wafer #2 for a time interval from the time To to (To+2T). The wafer #2 is loaded to the system by means of the loading/unloading apparatus 108 while being delayed by T min, and which is subjected to the same processing and transporting operations as those for the wafer #1. It takes a time interval T min, from the time To to (To+T), to transport the wafer #2 from the loading/unloading apparatus 108 to the metal film deposition apparatus 102. It takes a time interval T min, from the time (To+T) to (To+2T), to process the wafer #2 in the metal film deposition apparatus 102.

Next, the processing for the wafer #1 in the lithography apparatus 104 will be fully described with reference to FIGS. 7 and 8. First, the wafer #1 is transported from a stocking chamber 104-1 to a coating chamber 104-2 by means of a transporting mechanism 104-8, and which is coated with a resist by a roller type resist coater. It takes 40 sec to coat the wafer #1 with the resist to a thickness of 1.2 µm. The transporting mechanism 104-8 and the like are all contained in a housing (not shown) filled with nitrogen, so that the wafer is not exposed to the atmospheric air in the processing apparatus 104. The wafer #1 is then transported to a baking chamber 104-3 by means of a transporting mechanism 104-9, and is subjected to heat treatment (120° C.×40 sec) to harden the resist. It is transported from the baking chamber 104-3 to an exposing chamber 104-4 by means of a transporting mechanism 104-10, to be subjected to exposure using the infrared ray of mercury as a light source. The function of the exposing chamber 104-4 is the same as that of the usual stepper. The exposure for the wafer #1 takes 2 min. The wafer #1 is then moved to a developing chamber 104-5 by means of a transporting mechanism 104-11, and is subjected to developing by exposing the surface to a developing agent. The developing for the wafer #1 takes 80 sec. It is then transported to a dry chamber (serving as an unloading chamber) 104-6 by means of a transporting mechanism 104-12. It takes 5.3 min which is less than the time T (6 min) of the inventive system, until the wafer #1 is made possible to be transported by a transporting mechanism 104-13 provided in the dry chamber 104-6, after it is started to be moved from the stocking chamber 104-1 to the coating chamber 104-2. The wafer #1 waits until an elapse of 6 min, that is, it is transported after an elapse of 6 min.

The wafer #1 is unloaded to the transporter 101, and is transported to the metal film dry etching apparatus 106. It is moved to a stocking chamber 106-1 filled with nitrogen by means of a transporting mechanism 106-9 provided in the stocking chamber 106-1 (FIG. 9), and is further transported to a preparing chamber #1 106-2 by means of a transporting mechanism 106-10. It takes a time less than 6 min (T of the system) until the preparing chamber #1 106-2 is evacuated up to 0.65 Pa and the wafer #1 is made possible to be moved to a transporting chamber 106-3, after it is started to be transported. The wafer #1 waits until an elapse of 6 min, that is, it is started to be processed after an elapse of 6 min.

The processing for the wafer #1 in the metal film dry etching chamber 106 will be described with reference to FIGS. 9 and 10. The wafer #1 in the preparing chamber #1 106-2 is transported to the transporting chamber 106-3 by means of a transporting mechanism 106-11 provided in the transporting chamber 106-3, and which is further transported to an etching chamber 106-4. The pressure of the transporting chamber 106-3 is 0.01 Pa. In an etching chamber 106-4, a multi-layer film of an Al alloy film/TiN film is etched. It takes 40 sec to etch the multi-layer film using a mixed gas of chlorine and $BCl_3$. The pressure upon etching is 0.4 Pa. The etching chamber 106-4 is evacuated to 0.015 Pa, and the wafer #1 is transported to an anticorrosive treatment chamber 106-5 through the transporting chamber 106-3 by means of a transporting mechanism 106-11, to be subjected to anticorrosive treatment by $CHF_3$ for the Al alloy film. The pressure upon the anticorrosive treatment is 0.6 Pa, and the treatment takes 30 sec. The wafer #1 is then transported from the anti-corrosive treatment chamber 106-5 to an ashing chamber 106-6 through the transporting chamber 106-3 by means of the transporting mechanism 106-11. The resist is removed by ashing using oxygen plasma in the ashing chamber 106-6. The pressure upon the ashing is 50 Pa, and the ashing takes 30 sec. The wafer #1 is then transported to a preparing chamber #2 106-7 through the transporting chamber 106-3 by means of the transporting mechanism 106-11. The preparing chamber #2 106-7, after receiving the wafer #1, is filled with high purity nitrogen at the atmospheric pressure. After that, the wafer #1 is transported to an unloading chamber 106-13 filled with high purity nitrogen by means of a transporting mechanism 106-12, and waits for transporting. It takes 5 mm until the wafer #1 is made possible to be transported after it is started to be processed. The wafer #1 waits for 1 min.

The wafer #1 is unloaded onto transporter 101 by a transporting mechanism 106-13 and moved from the metal film dry etching apparatus 106 to insulator film deposition apparatus 103.

The processing for the wafer #1 in the insulator film deposition apparatus 103 will be described with reference to FIGS. 5 and 6. The wafer #1 is placed in a film deposition chamber #1 103-4 of the insulator film deposition chamber 103 by transporting mechanism 103-8, an $SiO_2$ film is deposited by plasma chemical vapor deposition (CVD) using TEOS (Tetra Ethyl Ortho Silicate) and oxygen as a source gas. The $SiO_2$ film thus deposited is used as an interlayer insulator film for metallization. In a film deposition chamber #2 103-5, an $Si_3N_4$ film is deposited by plasma CVD using $SiH_4$ and $NH_3$ as a source gas. The $Si_3N_4$ film thus deposited is used as the uppermost passivation layer of the wafer. Now, the nitride film is formed on the wafer #1. In this insulator film deposition apparatus 103, only the film deposition is performed, and this processing does not take a lot of time; accordingly, the wafer #1 waits for processing in stocking chamber 103-1.

First, the wafer #1 is moved from the stocking chamber 103-1 to a preparing chamber #1 103-2 by means of a transporting mechanism 103-9, thus starting the processing.

It is transported from the preparing chamber #1 103-2 to a transporting chamber 103-3 by means of a transporting mechanism 103-10, and is further transported to a film deposition apparatus #2 103-5. In this chamber #2 103-5, an $Si_3N_4$ film is deposited on the wafer #1 to a thickness of 0.5 µm by the above-described plasma CVD. The pressure is 50 Pa, and the film deposition takes 1 min. The wafer #1 is then transported to a preparing chamber #2 103-6 through the transporting chamber 103-3 by means of a transporting mechanism 103-10. The preparing chamber #2 103-6 is filled with nitrogen at the atmospheric pressure, and then the wafer #1 is transported to an unloading chamber 103-7 filled with nitrogen by means of a transporting mechanism 103-11, and it waits for unloading to the transporter 101 (FIG. 1) by a transporting mechanism 103-12. It takes 4 min until the wafer #1 is made possible to be unloaded after it is started to be processed. Accordingly, the wafers #1 waits for 2 min. After the wafer #1 is moved from the film deposition chamber #2 103-5 to the transporting chamber 103-3, the film deposition chamber #2 103-5 is cleaned by NF3 plasma, and is prepared for the next semiconductor wafer.

The wafer #1 is transported from the insulator film deposition apparatus 103 to the lithography apparatus 104 again, and is subjected to the same processing as that applied after the metal film deposition. The flow of the processes, and the processing time are the same, except for the processing condition such as the reticle upon exposure. The wafer #1 is transported from the lithography apparatus 104 to the insulator film dry etching apparatus 107.

The processing for the wafer #1 in the insulator film dry etching apparatus 107 will be described with reference to FIGS. 11 and 12. First, the wafer #1 is transported from the transporter 101 (FIG. 1) to a stocking chamber 107-1 filled with nitrogen by means of a transporting mechanism 107-8. It is then transported to a preparing chamber #1 107-2 by means of a transporting mechanism 107-9. The preparing chamber #1 107-2 is evacuated. The wafer #1 waits for the processing. The processing of the wafer #1 is started by the movement of the wafer #1 to a transporting chamber 107-3. The wafer #1 is transported from the preparing chamber #1 107-2 to the transporting chamber 107-3 by means of a transporting mechanism 107-10, and is further transported to an etching chamber 107-4. In the etching chamber 107-4, the dry etching for the $SiO_2$ film and the $Si_3N_4$ film can be performed; however, in this embodiment, the dry etching for the $Si_3N_4$ film is performed. The etching gas is $CHF_3$, and the pressure is 0.7 Pa. This dry etching takes 40 sec. The wafer #1 is then transported from the etching chamber 107-4 to an ashing chamber 107-5 through the transporting chamber 107-3 by means of the transporting mechanism 107-10. In the ashing chamber 107-5, the resist is removed by ashing using oxygen plasma. The pressure is 50 Pa, and the processing takes 30 sec. The wafer #1 is then transported to a preparing chamber #2 107-6 through the transporting chamber 107-3 by means of the transporting mechanism 107-10, and is further transported to an unloading chamber 107-7 filled with nitrogen by means of a transporting mechanism 107-11 and it waits for unloading by a transporting mechanism 107-12. It takes 4 min until the wafer #1 is made possible to be unloaded after it is started to be processed. The wafer #1 waits for 2 min.

Next, the wafer #1 is transported to the loading/unloading apparatus 108 by means of the transporter 101. The wafer #1 is moved in a stocking chamber 108-2 by means of a transporting mechanism 108-4 provided in the apparatus 108. Thus the wafer #1 is transported in a preparing chamber 108-1 filled with nitrogen together with the subsequent wafers #2 to #6. They wait for unloading from the fabricating system. The transporting from the stocking chamber 108-2 to the preparing chamber 108-1 takes 1 min.

The details of processing and transporting for the wafer #1 to #3 for each time interval T from To to (To+9T) are summarized in Tables 1 to 3.

TABLE 1

| Time | Wafer #1 | Wafer #2 | Wafer #3 |
|---|---|---|---|
| T0~T0 + T | Processing in A | Transporting to A | |
| T0 + T~T0 + 2T | Transporting from A to B | Processing in A | Transporting to A |
| T0 + 2T~T0 + 3T | Processing in B | Transporting from A to B | Processing in A |
| T0 + 3T~T0 + 4T | Transporting from B to C | Processing in B | Transporting from A to B |
| T0 + 4T~T0 + 5T | Processing in C | Transporting from B to C | Processing in B |

TABLE 1-continued

| Time | Wafer #1 | Wafer #2 | Wafer #3 |
|---|---|---|---|
| T0 + 5T~T0 + 6T | Transporting from C to D | Processing in C | Transporting from B to C |
| T0 + 6T~T0 + 7T | Processing in D | Transporting from C to D | Processing in C |
| T0 + 7T~T0 + 8T | Transporting from D to B | Processing in D | Transporting from C to D |
| T0 + 8T~T0 + 9T | Processing in B | Transporting from D to B | Processing in D |

Apparatus A: Metal Films Deposition Apparatus
Apparatus B: Lithography Apparatus
Apparatus C: Metal Films Dry Etching Apparatus
Apparatus D: Insulating Films Deposition Apparatus
Apparatus E: Insulating Films Dry Etching Apparatus
T0 + T: T minutes after the time T0

TABLE 2

| Time | Apparatus A | Apparatus B | Apparatus C |
|---|---|---|---|
| T0~T0 + T | Processing Wafer #1 | | |
| T0 + T~T0 + 2T | Processing Wafer #2 | | |
| T0 + 2T~T0 + 3T | Processing Wafer #3 | Processing Wafer #1 | |
| T0 + 3T~T0 + 4T | Processing Wafer #4 | Processing Wafer #2 | |
| T0 + 4T~T0 + 5T | Processing Wafer #5 | Processing Wafer #3 | Processing Wafer #1 |
| T0 + 5T~T0 + 6T | Processing Wafer #6 | Processing Wafer #4 | Processing Wafer #2 |
| T0 + 6T~T0 + 7T | | Processing Wafer #5 | Processing Wafer #3 |
| T0 + 7T~T0 + 8T | | Processing Wafer #6 | Processing Wafer #4 |
| T0 + 8T~T0 + 9T | | Processing Wafer #1 | Processing Wafer #5 |

Apparatus A: Metal Films Deposition Apparatus
Apparatus B: Lithography Apparatus
Apparatus C: Metal Films Dry Etching Apparatus
Apparatus D: Insulating Films Deposition Apparatus
Apparatus E: Insulating Films Dry Etching Apparatus
T0 + T: T minutes after the time T0

TABLE 3

| | Transporter between Processing Apparatuses | | |
|---|---|---|---|
| Time | From A to B | From B to C | From C to D |
| T0~T0 + T | | | |
| T0 + T~T0 + 2T | Wafer #1 | | |
| T0 + 2T~T0 + 3T | Wafer #2 | | |
| T0 + 3T~T0 + 4T | Wafer #3 | Wafer #1 | |
| T0 + 4T~T0 + 5T | Wafer #4 | Wafer #2 | |
| T0 + 5T~T0 + 6T | Wafer #5 | Wafer #3 | Wafer #1 |
| T0 + 6T~T0 + 7T | Wafer #6 | Wafer #4 | Wafer #2 |
| T0 + 7T~T0 + 8T | | Wafer #5 | Wafer #3 |
| T0 + 8T~T0 + 9T | | Wafer #6 | Wafer #4 |

Apparatus A: Metal Films Deposition Apparatus
Apparatus B: Lithography Apparatus
Apparatus C: Metal Films Dry Etching Apparatus
Apparatus D: Insulating Films Deposition Apparatus
Apparatus E: Insulating Films Dry Etching Apparatus
T0 + T: T minutes after the time T0

As shown in Table 1, semiconductor wafers are subjected to a pipeline processing, in which the continued process and the transporting between processing apparatuses are repeated with a cycle of T min, that is, the cycle time T min is equally allocated to the processing and transporting. In this embodiment, the time T is 6 min. The maximum value of each minimum time interval required to unload each semiconductor wafer already processed in each processing apparatus to the transporter is 5.7 min (at the metal film deposition apparatus). This maximum values (5.7 min) is added with a margin (0.3 min), thus determining the time T (6 min). In each processing apparatus of this embodiment, the trailing treatment cannot be applied by the restriction of the control of the transporting mechanism in the processing apparatus or the like. Namely, during one wafer is processed in a processing apparatus, the next wafer is not processed in the same processing apparatus. For example, even when the preceding wafer is transported to the anticorrosive treatment chamber after the completion of the metal film etching, the subsequent wafer cannot be started to be etched. Accordingly, if the trailing treatment can be applied, the time interval T can be shortened to be less than 6 min.

The processing for semiconductor wafers in three processing apparatuses (A to C) for each time interval T min from To to (To+9T) are summarized in Table 2. In the viewpoint of the processing apparatus, six pieces of semiconductor wafers are continuously processed except for the waiting time for transporting.

Table 3 summarizes semiconductor wafers transported by the single wafer transporter from an apparatus A to B, from B to C, and from C to D, for each T min from To to (To+9T). The wafers are stayed in the transporter by the number of three (=6/2) at maximum. When even-numbered wafers are transported in the transporter, odd-numbered wafers are processed in processing apparatuses. On the contrary, when odd-numbered wafers are transported in the transporter, even-numbered wafers are processed in processing apparatuses. In the pipeline processing in which the equal cycle time is allocated to the processing and transporting, only half or less of the wafers in the fabricating system exist in the transporter, thus simplifying the construction of the transporter. In this embodiment, it takes 110 min until six pieces of wafers are made possible to be unloaded, after they are loaded in the fabricating system. Namely, it takes 80 min, which includes 13T (=78) min for six process steps and seven transporting steps and 2 min (each of the loading and unloading takes 1 min), until the initial wafer #1 is possible to be unloaded; and each of the subsequent wafers #2 to #6 is delayed by a time of T min, the total delayed time being 5T (=30) min. Accordingly, the processing and transporting for the wafers #1 to #6 takes 110 (=80+30) min.

The above pipeline processing will be compared with the conventional lot processing with six pieces of semiconductor wafers taken as one unit. The processing time per one wafer in each processing apparatus is as follows: 5.7 min (metal film deposition apparatus); 4 min (insulator film deposition apparatus); 5.3 min (10.6 min (twice)) (lithography apparatus); 5 min (metal film dry etching apparatus); and 4 min (insulator film deposition apparatus). In the lot processing, six of wafers are all processed in each apparatus, and then transported to the next apparatus. Accordingly, the total processing time is six times the processing time for one wafer in each apparatus, that is, 175.8 min. This is added with the transporting time and the loading/unloading time. The transporting time for two apparatuses is 4 min, and the loading and unloading time is 2 min, that is, the total transporting time including the loading/unloading time is 28 (=4×7) min+2 min=30 min. Namely, in the lot processing, it takes 205.8 min until six pieces of wafers are made possible to be unloaded, after they are loaded in the fabricating system. In this embodiment, therefore, the term of works is reduced to be about half compared with the lot processing.

By the shortened term of works and the effect of the transporter capable of being transported in nitrogen, the inventive system can eliminate the necessity of the conventional clean space with a high cleanliness, and improve the percent non-defective. The percent non-defective is increased from 88% to 93% compared with the case using the conventional apparatuses.

As is apparent from Table 2, the allocation (scheduling) of the wafer to each processing apparatus is highly optimized. Each processing apparatus sequentially processes semiconductor wafers with no dead time. The reason for this is that the processing time in each apparatus is specified to be the equal time T min, thus equalizing the timing of each processing. Moreover, since the processing time in each apparatus is smaller than that in the conventional lot processing, it can be allocated effectively. As the number of semiconductor wafers is increased, the above effect is enlarged.

Embodiment 2

This embodiment will be described with reference to FIGS. 1, 2, 7, 9, 11, 13 and 20. In this embodiment, the present invention is applied to a fabricating system and a fabricating method for fabricating an Si memory LSI, wherein a sequence of metallization processes for a CMOS-LSI having two layer metal films are applied to a wafer.

Figure 13:
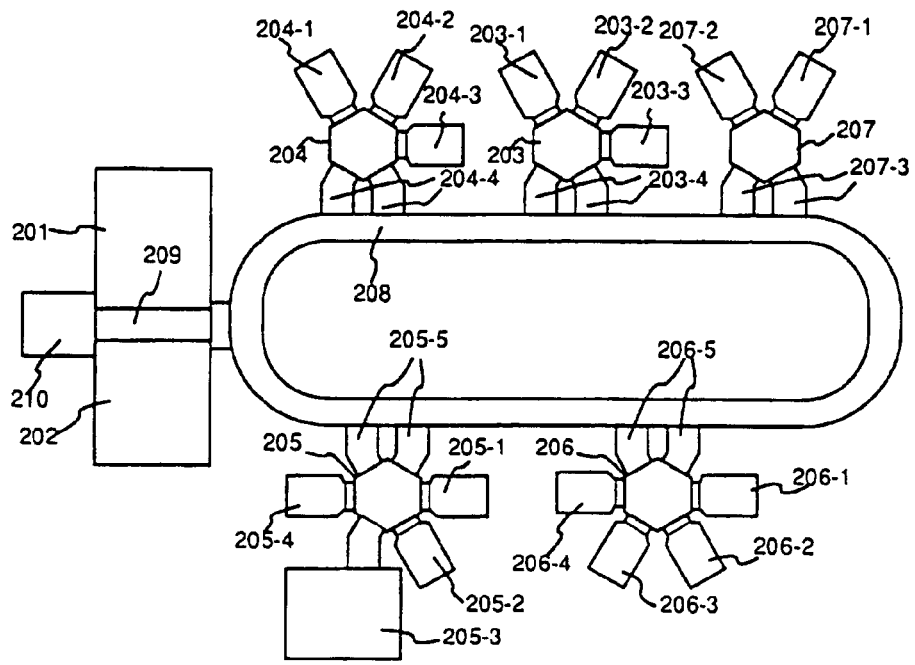
FIG. 13 is a plan view showing another example of the fabricating system according to the present invention.

FIG. 13 is a view showing a fabricating system according to this embodiment. Lithography apparatuses 201 and 202 are adapted to perform a sequence of lithography processes including resist coating, resist baking, exposure using an infrared ray of mercury as a light source, resist developing and drying. By the provision of a plurality of processing apparatuses capable of applying the same processing, it becomes possible to effectively suppress the disorder of the processing due to a failure of the processing apparatus or the like.

Figure 14:
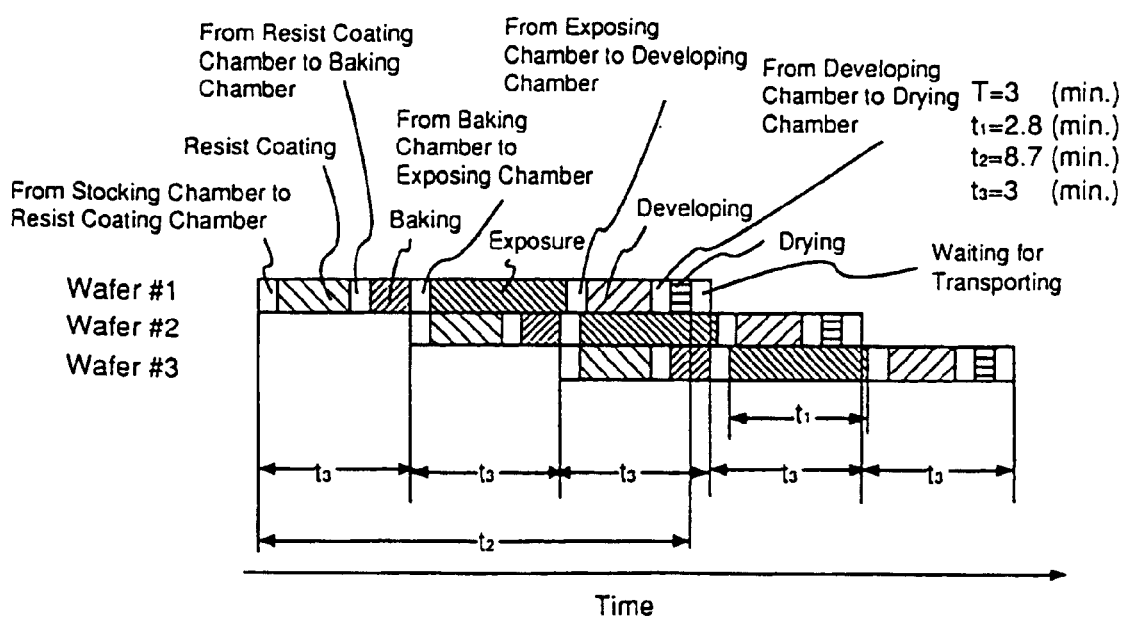
FIG. 14 is a diagram showing a procedure for sequentially processing a plurality of semiconductor wafers using the lithography apparatus.

The construction of each of the processing apparatuses 201 and 202 is the same as that of the lithography apparatus 104 (FIG. 7) in Embodiment 1, except for the condition of processing a wafer. In this embodiment, a finer pattern must be-formed, and thereby the processing time for each wafer is made longer; and the flow of the processing for a plurality of wafers is complicated. Differently from the lithography apparatus 104, the lithography apparatuses 201 and 202 can be finely controlled, which enables a trailing treatment. The trailing treatment will be described with reference to FIG. 14. FIG. 14 is a view for explaining the trailing treatment when semiconductor wafers #1 to #3 are sequentially processed. In the processing and transporting performed in the lithography apparatus 201 or 202, the exposure takes the longest time. In this embodiment, the exposing process takes a time of $t_1$ (=2.8) min. To make efficient use of an exposing chamber, as shown in FIG. 14, it is effective to proceed the next wafer #2, so that the wafer #2 is processed directly after the completion of the exposure for the wafer #1. Namely, the processing for the wafer #2 is not started after the completion of all of the processes for the wafer #1 in the lithography apparatus 201 or 202 which takes a time $t_2$ (=8.7) min, but is made to trail the wafer #1 while being delayed by a time of $t_3$ ($t_3 \geq t_1$). The wafers #3 to #6 are similarly subjected to the trailing treatment. Thus, each wafer may be loaded in and unloaded from the lithography apparatus 201 or 202 for each time of $t_3$. In each of the lithography apparatuses 201 and 202, $t_3$ is 3 (min). In this embodiment, the cycle time T is 3 min. The wafer #1 is started to be transported to the next processing apparatus after N×T (min)=3×3 (min)=9 (min)

from the start of processing in the lithography apparatus 201 or 202. The wafer #1 waits for a time interval 0.3 min from 8.7 min to 9 min. The wafers #3 to #6 are similarly processed. Thus, one wafer is loaded in the processing apparatus for each 3 min, and a different wafer is unloaded from the processing apparatus for each 3 min. In addition, a single wafer inter-apparatus transporter 208 takes 2 min for one round.

Figure 15:
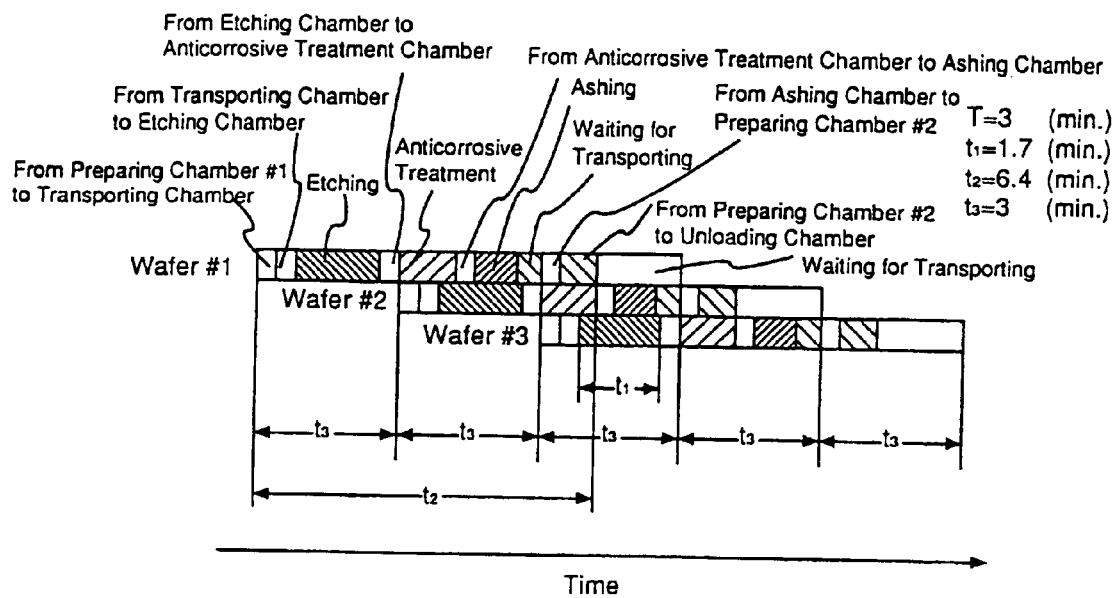
FIG. 15 is a diagram showing a procedure for sequentially processing a plurality of semiconductor wafers using the metal film dry etching apparatus.

The construction of a metal film dry etching apparatus 203 is the same as that of the metal film dry etching apparatus 106 (FIG. 9) in Embodiment 1, except for the processing condition. In this embodiment, a finer pattern must be etched, and thereby the processing time for each wafer is made longer. The metal film dry etching apparatus 203 is a cluster tool capable of applying dry etching to an alloy mainly containing aluminum; and a metal or metal compound such as tungsten, titanium nitride. It has an anticorrosive treatment chamber 203-2 for applying anticorrosive treatment to a wafer, other than an etching chamber 203-1. The processing apparatus 203 is also provided with an ashing chamber 203-3 capable of applying the resist removing process to a wafer. The resist removing apparatus may be independently provided, or at least part of the apparatus may be contained in part of another apparatus such as the dry etching apparatus as shown in the inventive system. The same is true for the cleaning process, heat-treatment process and the like. This is because the means of applying the above process to a wafer can be easily added to the processing apparatus having a plurality of processing chambers, for example, the cluster tool of this inventive system. The processing apparatus 203 can be subjected to the trailing treatment. As fully described in Embodiment 1, since the transporting mechanism (106-11 in FIG. 9) provided in the transporting chamber is used for various transporting steps in the apparatus, the processing apparatus 203 is restricted more than the lithography apparatuses 201 and 202. The trailing treatment in the metal film dry etching apparatus 203 will be described with reference to FIGS. 9 and 15. In the processing apparatus 203, the transporting mechanism 106-11 of the transporting chamber 106-3 is used to transport wafers from the preparing chamber #1 106-2 to the transporting chamber 106-3, from the etching chamber 106-4 to the anticorrosive treatment chamber 106-5, from the anticorrosive treatment chamber 106-5 to the ashing chamber 106-6, and from the ashing chamber 106-6 to the preparing chamber #2 106-7. The trailing treatment must be carried out such that a plurality of transporting steps for a plurality of wafers by the transporting mechanism 106-11 are not overlapped. FIG. 15 shows the trailing treatment in the metal film dry etching apparatus 203. In the processing and transporting performed in the metal film dry etching apparatus 203, the metal film dry etching in the etching chamber 106-4 takes the longest time. In this embodiment, this etching takes a time of $t_1$ (=1.7) min. To avoid the overlapping of the transporting steps, the waiting for transporting is set before the transporting from the ashing chamber 106-6 to the preparing chamber #2 106-7 after removal of the resist by ashing. By this trailing treatment, each wafer can be loaded or unloaded in or from the metal film dry etching apparatus 203 for each time interval of 3 min ($t_3$ in FIG. 15) like the lithography apparatus 201 or 202. This time interval (3 min) is very shorter than the processing time of 6.4 min ($t_2$ in FIG. 2) for each wafer. The wafer #1 is started to be transported to the next processing apparatus after N×T (min)=3×3 (min)=9 (min) since the start of processing in the processing apparatus 203. The wafer #1 waits for a time interval of 2.6 min after an elapse of 6.4 min. The wafers #3 to #6 are continuously processed. Thus, each wafer is loaded in the processing apparatus for each 3 min and another wafer is unloaded form the processing apparatus for each 3 min.

Figure 16:
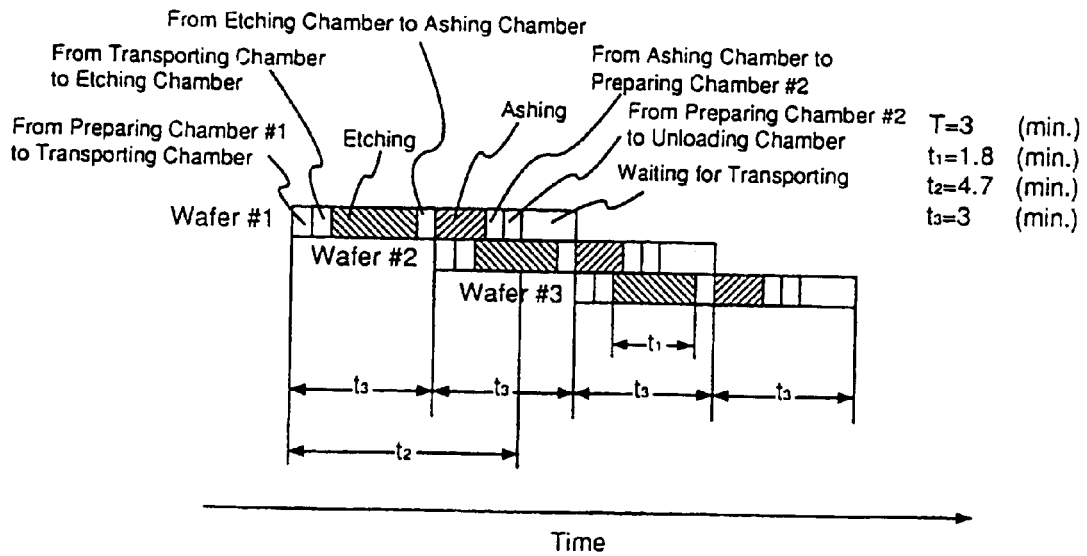
FIG. 16 is a diagram showing a procedure for sequentially processing a plurality of semiconductor wafers using the insulator film dry etching apparatus.

The construction of an insulator film dry etching apparatus 204 is similar to that of the insulator film dry etching apparatus 107 (FIG. 11) of Embodiment 1, except that one etching chamber is additionally provided in the apparatus 204. The insulator film dry etching apparatus 204 is a cluster tool capable of dry etching the $SiO_2$ or $Si_3N_4$ film of a wafer. It is also provided with an ashing chamber 204-3 capable of removing the resist of a wafer, other than an etching chamber 204-1 for the $SiO_2$ film, and an etching chamber 204-2 for the $Si_3N_4$ film. The apparatus 204 can be subjected to the trailing treatment. FIG. 16 shows the trailing treatment. In the processing and transporting performed in the insulator film dry etching apparatus 204, the dry etching for the $SiO_2$ film in the etching chamber 204-1 and the dry etching for the $Si_3N_4$ film in the etching chamber 204-2 take the longest time. The dry etching for the $SiO_2$ film and the dry etching for the $Si_3N_4$ film are the same in the processing time, each of which takes a time of $t_1$ (=1.8) min. By the trailing treatment shown in FIG. 16, each wafer can be loaded or unloaded in or from the insulator film dry etching apparatus 204 for each time interval of 3 min ($t_3$ in FIG. 16). This time interval (3 min) is very shorter than the processing time for each wafer, 4.7 min ($t_2$ in FIG. 16). The etching chamber 204-1 must be cleaned for each processing. This cleaning is performed for a time of 30 sec required to transport the next wafer from the preparing chamber to the transporting chamber. Accordingly, as shown in FIG. 16, the minimum time interval until the wafer processed in the insulator film dry etching apparatus 204 can be unloaded to the single wafer inter-apparatus transporter 208 (FIG. 13) is 3 min. This time interval cannot be reduced no longer. The wafer #1 is started to be transported to the next processing apparatus after N×T (min)=2×3 min=6 min since the start of the processing in the processing apparatus 204. The wafer #1 waits for a time interval of 1.3 min after an elapse of 4.7 min. The wafers #2 to #6 are continuously processed. Thus, each wafer is continuously loaded or unloaded in or from the processing apparatus for each 3 min.

Figure 17:
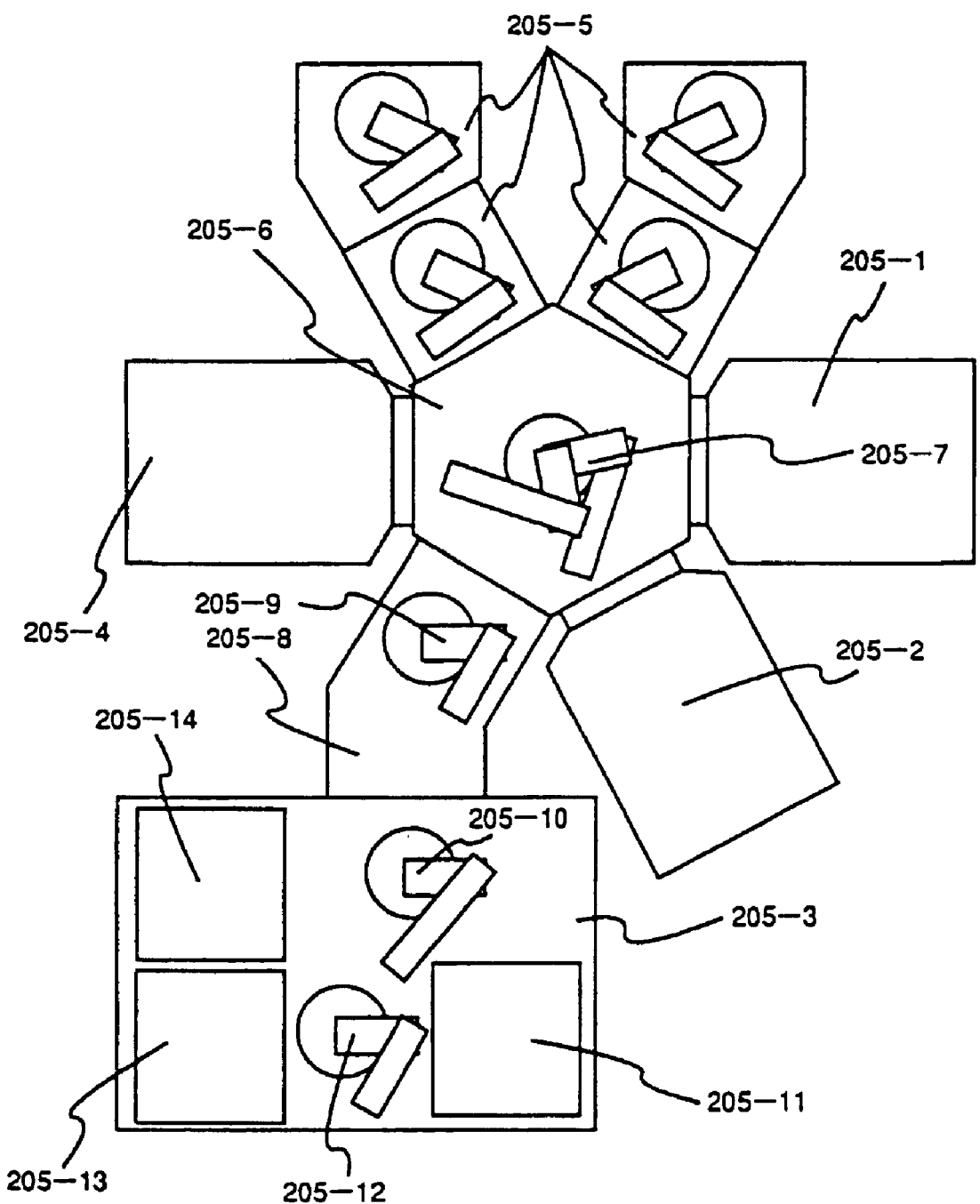
FIG. 17 is a plan view showing one example of an insulator film deposition apparatus constituting the fabricating system according to the present invention.

The construction of the insulator film dry etching apparatus 205 is shown in FIG. 17. This is a cluster tool capable of applying the film deposition of $SiO_2$ or $SiH_4$ on a wafer. It is provided with a coating apparatus 205-3 for coating and baking SOG (Spin-On-Glass), other than film deposition apparatuses 205-1 and 205-2. The $SiO_2$ film is formed in the film deposition apparatus 205-1 by plasma CVD using TEOS and oxygen; while the $Si_3H_4$ film is formed in the film deposition apparatus 205-2 by plasma CVD using monosilane ($SiH_4$) and ammonia ($NH_3$). The processing apparatus 205 is also provided with a heat-treatment chamber 205-4 capable of applying heat-treatment on a wafer as needed. After being formed with the $SiO_2$ film in the film deposition apparatus 205-1, the wafer #1 is transported in vacuum to a buffer chamber 205-8 by means of a transporting mechanism 205-7 provided in a transporting chamber 205-6. The transporting mechanism 205-7 has two transporting arms for permitting the overlapping of the transporting steps for transporting different wafers at the time of the trailing treatment. The buffer chamber 205-8 is filled with nitrogen at the atmospheric pressure, and then the wafer is transported to a transporting mechanism 205-10 of the coating apparatus 205-3 by means of a transporting mechanism 205-9. It is transported to an SOG coating chamber 205-11 by means of the transporting mechanism 205-10, and is coated with SOG using a rolling coater. The wafer #1 is then transported to a baking chamber 205-13 by means of a transporting mechanism 205-12 and is subjected to heat treatment at 150° C. It is then transported to a baking chamber 205-14 by means of the transporting mechanism 205-12, and is subjected to heat treatment at 450° C. The wafer #1 is transported to the buffer chamber 205-8 filled with nitrogen at the atmospheric pressure by means of the transporting mechanism 205-10, and the buffer chamber 205-8 is evacuated, thus completing the coating of SOG. A sequence of processes for coating the SOG takes 3.3 min. In the formation of a three layer film of $SiO_2/SOG/SiO_2$ for the Si memory LSI of this embodiment at the insulator film deposition apparatus 205, it takes 5.7 min until each wafer is made possible to be transported after it is started to be processed. However, like the lithography apparatuses 203 and 204, by use of the trailing treatment, each wafer can be loaded or unloaded in or from the processing apparatus 205 for each 3 min. The wafer #1 is started to be transported to the next processing apparatus after N×T (min)=2×3=6 (min) since the start of the processing in the processing apparatus 205. The wafer #1 waits for a time interval of 0.3 min after an elapse of 5.7 min. The subsequent wafers #2 to #6 are continuously processes. Thus, one wafer can be loaded in the processing apparatus for each 3 min, and a different wafer can be unloaded from the processing apparatus for each 3 min. In the formation of the $Si_3H_4$ film as the passivation layer for the Si memory LSI in the insulator film deposition apparatus 205, it takes a time of 2.7 min until each wafer is made possible to be transported after it is started to be processed. In this case, each wafer can be loaded or unloaded in or from the processing apparatus for each 3 min without the trailing treatment.

The metal film deposition apparatus 206 is a cluster tool capable of applying to a wafer the film deposition of an alloy mainly containing aluminum; and a metal and metal compound such as tungsten and TiN. The construction of the apparatus 206 is the same as that of the metal film deposition apparatus 102 (FIG. 2), except that one processing chamber is additionally provided. A sputtering chamber #1 206-1 has the function of the preparing chamber 102-4. A CVD chamber #1 206-2 and a CVD chamber #2 206-3 are provided for applying to a wafer the film deposition by CVD which is not applied in the processing apparatus 102. The sputtering chamber #1 206-3 is adapted to form the $TIN_4$ film by sputtering, and which has a function capable of applying the pre-treatment by soft etching using plasma of argon or the like prior to the film deposition as needed. The deposition of an alloy mainly containing aluminum by sputtering is performed in the sputtering chamber #2 206-2. The CVD chamber #1 206-3 is adapted to deposit blanket tungsten on the whole surface by CVD. A CVD chamber 206-4 is adapted to form a tungsten plug by selective CVD.

Figure 18:
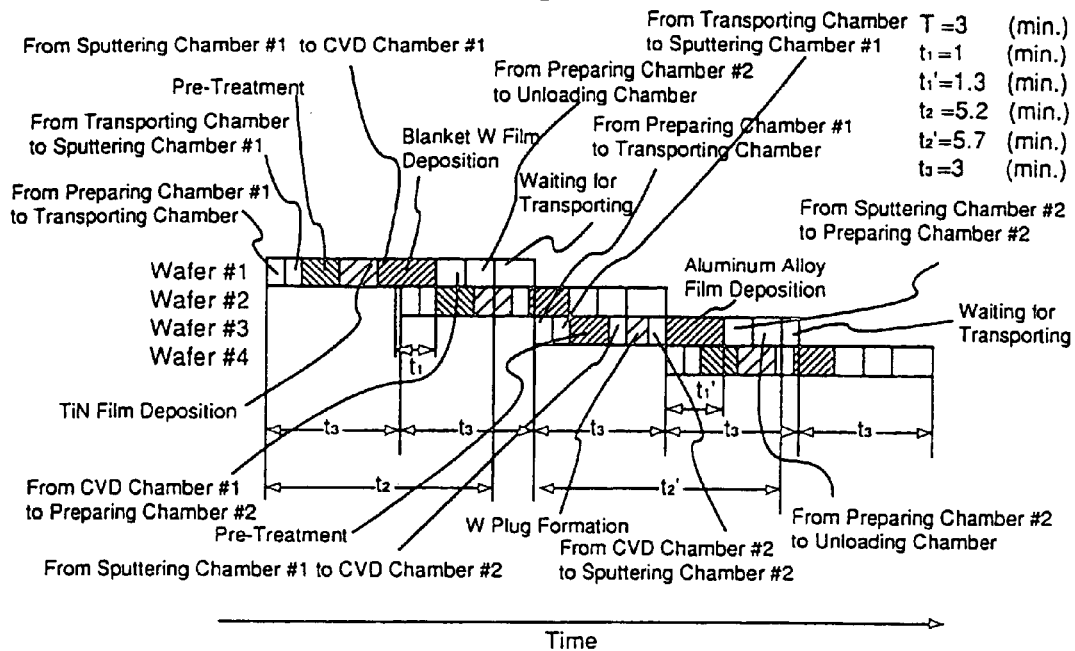
FIG. 18 is a diagram showing a procedure for sequentially processing a plurality of semiconductor wafers using a metal film deposition apparatus.

FIG. 18 shows an example of the trailing treatment in the metal film deposition apparatus 206. In the metal film deposition apparatus 206, a semiconductor wafer is subjected to two kinds of processes of forming a multi-layer film of blanket tungsten/titanium nitride as the first metal film of the Si memory LSI, and of forming a multi-layer film of aluminum alloy/tungsten plug as the second metal film of the Si memory LSI. The trailing treatment in the apparatus 206 must comply with any combination of the above two kinds of processes. In the example shown in FIG. 18, each of the wafers #1, #2 and #4 is formed with a multi-layer film of blanket tungsten/titanium nitride as the first metal film, and the wafer #3 is formed with a multi-layer film of aluminum alloy/tungsten plug as the second metal film. In the processing steps of forming the multi-layer film of blanket tungsten/titanium nitride, the formation of the blanket tungsten film in the CVD chamber #1 206-3 takes the longest time. On the other hand, in the processing steps of forming the multi-layer film of aluminum alloy/tungsten plug, the formation of aluminum alloy film in the sputtering chamber #2 206-2 takes the longest time. The processing time is $t_1$ (=1) min for the formation of the blanket tungsten film, and $t_1'$ (=1.3) min for the formation of the aluminum alloy film. The wafer is transported, by means of the transporting mechanism provided in the transporting chamber, from the preparing chamber #1 to the transporting chamber, from the transporting chamber to the sputtering chamber #1, from the sputtering chamber #1 to the CVD chamber #1 or #2, from the CVD chamber #1 to the preparing chamber #2, from the CVD chamber #2 to the sputtering chamber #2, and from the sputtering chamber #2 to the preparing chamber #2. As shown in FIG. 18, in the apparatus 206, the trailing treatment is performed not to overlap a plurality of the transporting steps of a plurality of wafers.

In the formation of the first metal film of blanket tungsten/titanium nitride, it takes 5.2 min ($t_2$ in FIG. 18) until each wafer is made possible to be unloaded after it is started to be processed and is subjected to the pre-treatment for the deposition of TiN film performed in the sputtering chamber #1 206-1. In the formation of the second metal film of aluminum alloy/tungsten plug, it takes 5.7 min ($t_2'$ in FIG. 18) until each wafer is made possible to be unloaded after it is started to be processed and is subjected to the pre-treatment for the formation of tungsten plug performed in the sputtering chamber #1 206-1. In either case, by use of the trailing treatment shown in FIG. 18, each wafer can be loaded or unloaded in or from the processing apparatus 206 for each tine interval 3 min ($t_3$ in FIG. 18). The wafer #1 is started to be transported to the next processing apparatus after N×T (min)=2×3 (min)=6 (min) since the start of processing in the processing apparatus 206. The wafer #1 waits for a time interval of 0.8 min after an elapse of 5.2 min, or for a time interval of 0.3 min after an elapse of 5.7 min. The wafers #2 to #6 are continuously processed. Thus, each wafer can be continuously loaded in the processing apparatus 206 for each 3 min, and a different wafer can be unloaded therefrom for each 3 min.

Figure 19:
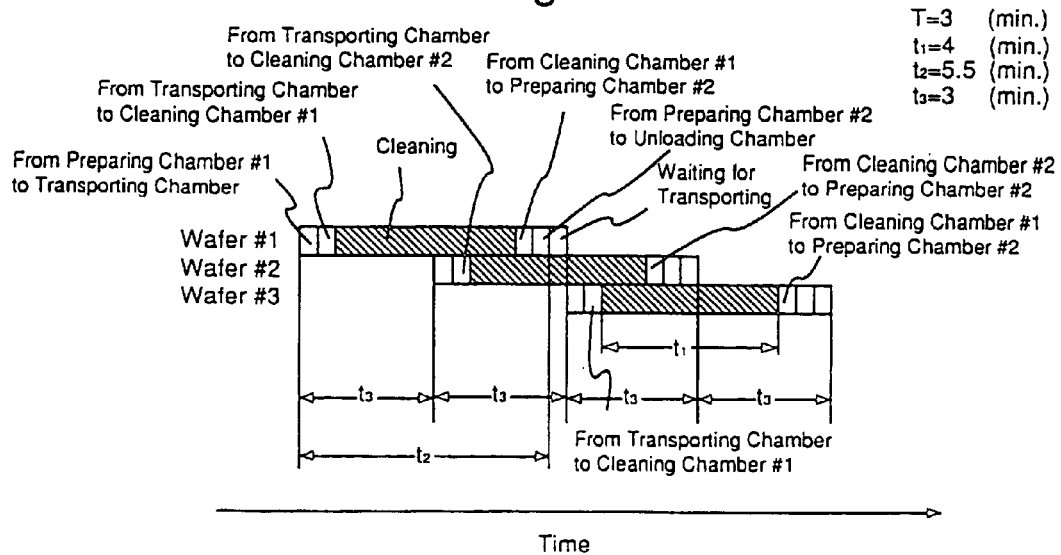
FIG. 19 is a diagram showing a procedure for sequentially processing a plurality of semiconductor wafers using a cleaning apparatus.

The cleaning apparatus 207 has cleaning chambers 207-1 and 207-2 having the same function. In the cleaning apparatus 207, the organic cleaning is performed to remove the residue which contains the resist remaining on the wafer not removed by ashing. FIG. 19 shows the trailing treatment for the wafers #1 to #3 in the cleaning apparatus 207. In the processing and transporting performed in the cleaning apparatus 207, the cleaning in the cleaning chamber #1 or #2 takes the longest time. The processing time for the cleaning is $t_1$ (4.0) min. The total processing time for each wafer is $t_2$ (=5.5) min. In the cleaning apparatus 207, by alternately using the cleaning chambers 207-1 and 207-2 having the same function, the wafers are sequentially processed. In a processing apparatus requiring a processing time of (Q−1)×T min or more and less than Q×T (Q: positive integer), it is effective to provide processing chambers in the number of Q or more having the same function, like the apparatus 207. In such a processing apparatus, each wafer is sequentially processed in each processing chamber while being delayed by a time of T min. As a result, each wafer can load or unload in or from the processing apparatus for each time interval of T min. In the apparatus 207, Q is 2, and T is 3 (min). The apparatus 207 can receive and unload each wafer for the time interval of 3 min ($t_3$ in FIG. 19). Alternatively, processing apparatuses in the number of Q or more having the same function may be provided in the fabricating system. In this case, each wafer is sequentially processed in each processing apparatus while being delayed by the time of T min. As a result, each wafer can be loaded in a set of the processing apparatuses for each T min, and a different wafer can be unloaded therefrom for each T min.

In the inventive system, a single wafer is transported between the processing apparatuses. The single wafer inter-apparatus transporter 208 is looped, and each wafer is transported in a high purity nitrogen atmosphere. The transporter 208 is connected to the processing apparatuses by way of interfaces 203-4, 204-4, 205-5, 206-5 and 207-3. The interface includes the stocking chamber, the preparing chambers #1 and #2 having the transporting mechanisms, and the unloading chamber provided in each processing apparatus of Embodiment 1. A special interface 209 is provided between the lithography apparatuses 201 and 202 and the transporter 208 for allocating wafers into the apparatuses 201 and 202. It includes one stocking chamber having two transporting mechanisms, and two preparing chambers each having a transporting mechanism. In a stocking apparatus 210 shown in FIG. 13, wafers completed in the processes before metallization are usually stocked in a specified amount or more, and are prepared to be loaded in the metallization process. The stocking apparatus 10 has the loading/unloading function similar to that of the loading/unloading apparatus 108 in Embodiment 1 (FIG. 1). Such a stocking apparatus is effective to smoothly process wafers.

Each of the processing chambers in the inventive system has a mechanism for identifying the kind and the processing content of the wafer placed therein. Namely, the processing chamber includes a mechanism for reading a laser mark previously marked on the rear surface of each wafer. Before each wafer is processed, the read-out mark is checked by a managing system by way of a computer for controlling the processing apparatus, thereby identifying the kind and the processing content of the wafer. When the wafer is confirmed to be applicable, it is processed under the condition suitable for the kind and the processing content of the wafer. In the inventive system, the fabrication is basically managed by the managing system in accordance with the predetermined scheduling. In this case, when there occurs abnormality in part of the managing system, or when the fabrication is not performed according to the command from the managing system due to a failure of the transporting system, the wafer not applicable is possibly loaded in the processing apparatus. When it is confirmed by the managing system that the wafer is not applicable, the processing is stopped and the signal on the stopping is transmitted to the managing system, and the wafer is contained in the stocking apparatus 201, if possible, according to the command from the managing system. When the wafer cannot be contained in the stocking apparatus because of a failure of the transporting system, the processing in all of the processing apparatuses is immediately stopped. The managing system judges which actions can be selected. The managing system can detect failures generated in the processing apparatuses 201 to 207, the transporter 208 and the like of the fabricating system, and selects the suitable action on the basis of the detection result. An interlock can be obtained by giving the identifying function to each processing apparatus. However, like this embodiment, when a plurality of processing apparatuses are provided to perform a plurality of processing steps in a plurality of processes, or when a plurality of kinds of wafers are processed in different processes under different conditions, a safer interlock can be obtained by giving the identifying function to each processing chamber.

Table 4 shows a sequence of processes for metallization of a CMOS LSI having a two layer metal film according to the inventive system, and processing apparatuses used for the fabrication.

TABLE 4

| Step # | Process | Apparatus | Processing Time for 1 Lot, 25 Wafers (min.) |
|---|---|---|---|
| 1 | Resist Coating Resist Baking Contact Hole Exposure Developing | Lithography | 80.7 = 8.7 + 3 × 24 |
| 2 | Contact Hole Etching Resist Ashing | Insulator Films Dry Etching | 76.7 = 4.7 + 3 × 24 |
| 3 | Soft Etching Pre-treatment TiN Film Sputtering W Film CVD | Metal Films Deposition | 77.2 = 5.2 + 3 × 24 |
| 4 | Resist Coating Resist Baking 1st Metal Exposure Developing | Lithography | 80.7 = 8.7 + 3 × 24 |
| 5 | 1st Metal Etching Anticorrosive Treatment Resist Ashing | Metal Films Dry Etching | 78.4 = 6.4 + 3 × 24 |
| 6 | Cleaning | Cleaning | 77.5 = 5.5 + 3 × 24 |
| 7 | SiO₂ Film Deposition SOG Coating Baking Baking SiO₂ Film Deposition Annealing | Insulator Film Deposition | 77.7 = 5.7 + 3 × 24 |
| 8 | Resist Coating Resist Baking Via Hole Exposure Developing | Lithography | 80.7 = 8.7 + 3 × 24 |
| 9 | Via Hole Etching Resist Ashing | Insulator Films Dry Etching | 76.7 = 4.7 + 3 × 24 |
| 10 | Soft Etching Pre-treatment W Film CVD Al Film Sputtering | Metal Films Deposition | 77.7 = 5.7 + 3 × 24 |
| 11 | Resist Coating Resist Baking 2nd Metal Exposure Developing | Lithography | 80.7 = 8.7 + 3 × 24 |
| 12 | 2nd Metal Etching Anticorrosive Treatment Resist Ashing | Metal Films Dry Etching | 78.4 = 6.4 + 3 × 24 |
| 13 | Cleaning | Cleaning | 77.5 = 5.5 + 3 × 24 |
| 14 | Silicon Nitride Deposition | Ins. Film Deposition | 74.7 = 2.7 + 3 × 24 |
| 15 | Resist Coating Resist Baking Passivation Layer Exposure Developing | Lithography | 80.7 = 8.7 + 3 × 24 |
| 16 | Passivation Layer Etching Resist Ashing | Insulator Films Dry Etching | 76.7 = 4.7 + 3 × 24 |

The determination of the cycle time T in this embodiment will be described. In this embodiment, each wafer is repeatedly processed in each processing apparatus: in the lithography apparatus (2.5 times (=5/2)); in the insulator film dry etching apparatus (3 times); in the metal film deposition apparatus (2 times); in the metal film dry etching apparatus (2 times); in the insulator film deposition apparatus (2 times); and in the cleaning apparatus (2 times). The maximum number of the repeated processing steps is 3 (times) in the insulator film dry etching apparatus. As described above, the minimum time interval, until the wafer already processed in the insulator film dry etching apparatus 204 can be unloaded to the transporter 208 (FIG. 13), is 3 min. This cannot be reduced no longer. For this reason, the time interval of 3 min is taken as the cycle time T of the inventive system, and on the basis of this cycle time T, the other trailing conditions are set. Each wafer is loaded with an average time interval of 9 (=T×N=3×3) min, wherein N is the number of the processes in the apparatus 204. When the average loading interval is less than 9 min, the apparatus 204 cannot smoothly process the wafers, with a result that the wafers are stayed. Thus, in processing a plurality of wafers with a cycle time of 3 min on the basis of a certain time To, each wafer is not loaded for each 3 min, but is loaded for each 9 min. In continuously processing a plurality of wafers while periodically performing the maintenance for the fabricating system with each interval of 1.5 hr per 24 hr, the output wafer becomes 150 (=22.5×60/9) (wafers/day).

In Table 4, the processing time for each lot is additionally shown in the lot processing (one lot: 25 wafers) using the fabricating system having the same processing apparatuses as those in this embodiment. The transporting between the continued processes takes 3 min. In this embodiment, a single wafer is transported for each 3 min. On the other hand, in the conventional batch processing, each lot is transported for each 3 min.

Figure 20:
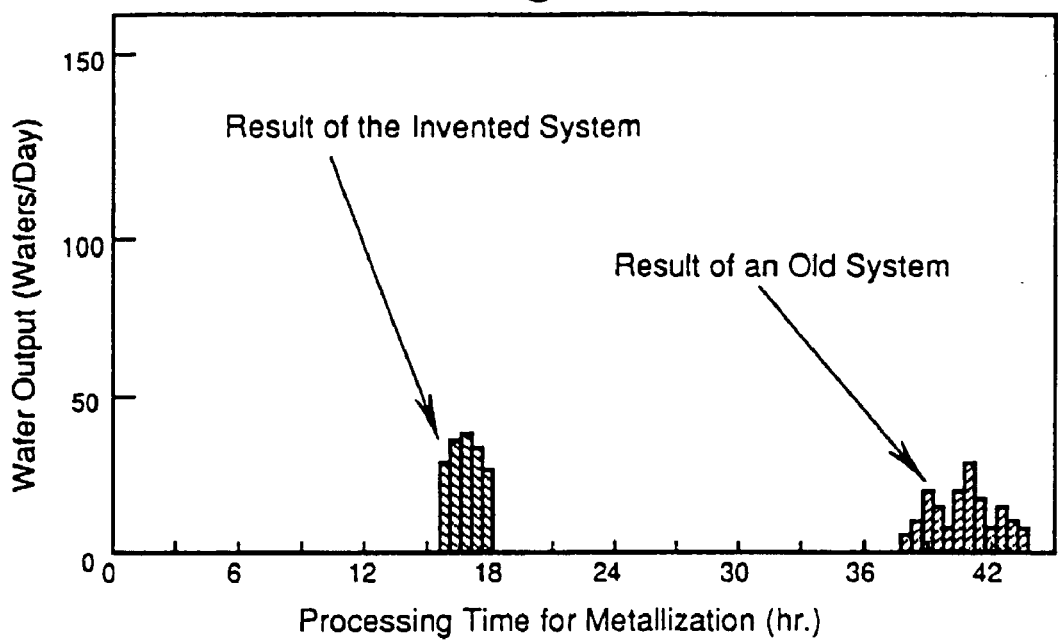
FIG. 20 is a graph showing the relationship between a processing time and a wafer output in metallization processes using the inventive system and old system.

FIG. 20 shows the term of works in the metallization process according to this embodiment. The results of the lot processing (one lot: 25 wafers) are also shown in this figure. In either of this embodiment and the lot processing, the wafer output is 150 wafers/day. The term of works the inventive system is significantly shortened compared with the lot processing. In the lot processing, the average of the terms of works is long, and the distribution thereof is extended. In the lot system, the lot necessary to be rapidly fabricated can be preceded. It is called "Hot Lot". When one lot is preceded as the hot lot, the average of the terms of works is made longer, and the distribution thereof is extended, resulting in the reduced wafer output. The reason for this is that the flow of the processing steps is disturbed by the presence of the hot lot, and thereby the working efficiency is reduced in some processing apparatuses. In the inventive system, the term of works for all wafers is shorter than that of the hot lot in the lot processing; accordingly, the hot lot itself can be eliminated.

By the reduction of the term of works and the effect of the transporter 208 capable of being transported in a high purity nitrogen atmosphere, the inventive system is not required be contained in the clean space with a high cleanliness which is required for the old system. Accordingly, the inventive system is effective to enhance the percent non-defective even when the fabrication is performed in the clean space with a cleanliness class very lower than that of the conventional clean space. By use of the inventive system installed in a clean room with a cleanliness class 10000, the percent non-defective of the CMOS LSI having a two layer metal film with a minimum design dimension of 0.5 μm is improved 92 to 96%, as compared with the fabrication in a clean room of a cleanliness class 100 using the old system.

Embodiment 3

This embodiment will be described with reference to FIGS. 21 and 22, and Table 5. In this embodiment, the present invention is applied to a fabricating system and a fabricating method for fabricating an Si memory LSI, wherein a sequence of processes for metallization of a CMOS LSI having a two layer metal film is applied to a wafer.

Figure 21:
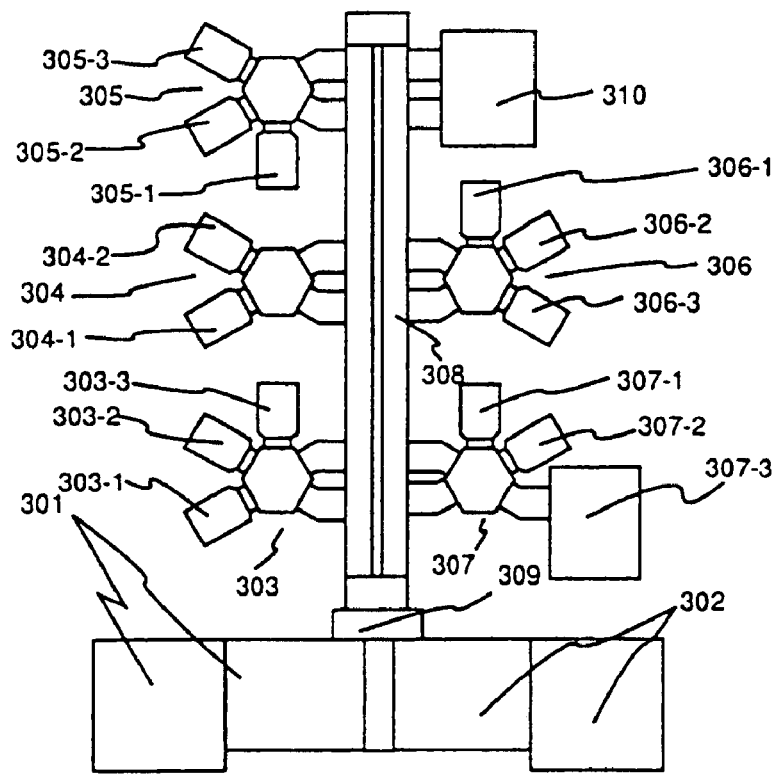
FIG. 21 is a plan view showing a further example of the fabricating system for semiconductor devices according to the present invention.

FIG. 21 is a view showing the fabricating system of this embodiment. Processing apparatuses 301 and 302 are adapted to perform a sequence of lithography processes including resist coating, resist baking, exposure using an i-ray of mercury as a light source, and resist developing. A processing apparatus 303 for dry-etching an interlayer insulator film is a cluster tool capable of dry-etching the $SiO_2$ film or $SiN_4$ film. It is provided with an ashing chamber 303-3 capable of removing the resist, other than two etching chambers 303-1 and 303-2. Each of the etching apparatuses 303-1 and 303-2 can perform the dry etching for the $SiO_2$ film or $SiN_4$ film. A processing apparatus 304 for dry-etching a metal film is a cluster tool capable of applying the dry etching of an alloy containing aluminum, and a metal or metal compound such as tungsten or titanium nitride. It is provided with an ashing chamber 304-2 capable of removing the resist, other than an etching chamber 304-1. A wet cleaning apparatus 305 has two cleaning chambers 305-1 and 305-2 for perfectly removing the resist remaining after the resist removing process by ashing, and also has a cleaning chamber 305-3 for performing the wet etching by fluoric acid for an oxide film on the surface of silicon before the deposition of a metal film. A metal film deposition apparatus 306 is a cluster tool capable of applying to a wafer the deposition of an alloy mainly containing aluminum, and a metal or metal compound such as tungsten or titanium nitride. In the deposition apparatus 306, the deposition is performed by sputtering or CVD. The deposition of titanium nitride is performed by sputtering in a processing chamber 306-1. The deposition of an alloy mainly containing aluminum is performed by sputtering in a processing chamber 306-2. A processing chamber 306-3 is used for the deposition of tungsten by CVD. An insulator film deposition apparatus 307 is a cluster tool capable of applying to a wafer the deposition of silicon oxide or silicon nitride. It is provided with a processing chamber 307-3 for applying a plurality of processes such as coating and baking of SOG (Spin On Glass), other than two processing apparatuses 307-1 and 307-2 for applying the film deposition by CVD. In the film deposition by CVD, a silicon oxide is formed by plasma CVD using TEOS as a source gas in the processing chamber 307-1; while a silicon nitride is formed by plasma CVD using monosilane and ammonia in the processing chamber 307-2. The construction of each of the above apparatuses and the flow of processes are the same as those in Embodiment 2.

In the inventive system, a single wafer is transported between the processing apparatuses. A single wafer transporter 308 is looped, and a wafer is transported in vacuum of 10 Pa (partial pressure of nitrogen with a high purity of approximately 100%). The transporter 308 is connected to each apparatus by means of an interface including a common load lock chamber similar to that in Embodiment 2. The transporter 308 is of a type in which a drive force is transmitted by a magnetic force, and it circulates around the loop by 2.5 min while being temporarily stopped at the interface of each processing apparatus for loading or unloading a wafer in or from the processing apparatus. Namely, the transporter 308 is adapted to transport each wafer while being repeatedly moved or stopped. The interfaces may be connected to the transporter 308 so as to be separated from each other with specified intervals for making easy the control of the above action of the transporter. In this embodiment, each interface is disposed at either of the equally divided positions (50 positions) along the circumference of the transporter 308. The transporter 308 is repeatedly moved and stopped by 50 times for one turn. One cycle is 3 sec (2.5 min/50). The moving time is 1 sec and stopping time is 2 sec. During the transporter 308 is stopped for the time of 2 sec, each wafer is loaded in or unloaded from each processing apparatus by means of a transporting mechanism provided in each interface. More preferably, each interface is disposed at either of less divided positions and is connected to the transporter 308 with a constant interval for more easily controlling the action of the transporter 308. A special interface 309 is disposed between the lithography apparatuses 301 and 302 and the transporter 308 for allocating wafers into the apparatuses 301 and 302. In a stocking apparatus 310 shown in FIG. 21, wafer completed in the processes before metallization are usually stocked in a specified amount or more, and are prepared to be unloaded for metallization.

Table 5 shows a sequence of processes for metallization of a CMOS LSI having a two layer metal film which is fabricated using the inventive system; and processing apparatuses or processing chambers used for the fabrication.

TABLE 5

| Step # | Process | Batch Processing Time for 24 Wafers (min.) | Processing Time for 1 Wafer (min.) | Processing Apparatus or Processing Chamber (See FIG. 21) |
|---|---|---|---|---|
| 1 | Contact Hole Lithography | 72 | 3 (Interval) | 301 or 302 |
| 2 | Contact Hole Dry Etching | 72 | 3 (5) | 303-1 or 303-2 |
| 3 | Ashing | 40 | 3 | 303-3 or 304-2 |
| 4 | Cleaning | 60 | 3 | 305-2 or 305-3 |
| 5 | SiO$_2$ Cleaning | 30 | 3 | 305-1 |
| 6 | TiN Film Sputtering | 72 | 3 | 306-1 |
| 7 | W Film CVD | 72 | 3 (5) | 306-3 |
| 8 | 1st Metal Lithography | 72 | 3 (Interval) | 301 or 302 |
| 9 | 1st Metal Dry Etching | 72 | 3 | 304-1 |
| 10 | Ashing | 40 | 3 | 303-3 or 304-2 |
| 11 | Cleaning | 60 | 3 | 305-2 or 305-3 |
| 12 | Insulator Film Deposition | 72 | 3 | 307-2 |
| 13 | SOG Coating, Baking | 72 | 3 | 307-3 |
| 14 | Insulator Film Deposition | 72 | 3 | 307-2 |
| 15 | Via Hole Lithography | 72 | 3 (Interval) | 301 or 302 |
| 16 | Via Hole Dry Etching | 72 | 3 (5) | 303-1 or 303-2 |
| 17 | Ashing | 40 | 3 | 303-3 or 304-2 |
| 18 | Cleaning | 60 | 3 | 305-2 or 305-3 |
| 19 | SiO$_2$ Cleaning | 30 | 3 | 305-1 |
| 20 | W Film CVD | 72 | 3 (5) | 306-3 |
| 21 | Al Film Sputtering | 72 | 3 | 306-2 |
| 22 | 2nd Metal Lithography | 72 | 3 (Interval) | 301 or 302 |
| 23 | 2nd Metal Dry Etching | 72 | 3 | 304-1 |
| 24 | Ashing | 40 | 3 | 303-3 or 304-2 |
| 25 | Cleaning | 60 | 3 | 305-2 or 305-3 |
| 26 | Insulator Film Deposition | 72 | 3 | 307-2 |
| 27 | Silicon Nitride Deposition | 72 | 3 | 307-1 |
| 28 | Passivation Layer Lithography | 72 | 3 (Interval) | 301 or 302 |
| 29 | Passivation Layer Dry Etching | 72 | 3 | 303-1 or 303-2 |
| 30 | Ashing | 40 | 3 | 303-3 or 304-2 |
| 31 | Cleaning | 60 | 3 | 305-2 or 305-3 |

Table 5 shows the processing time for each wafer in each processing apparatus in the inventive system, and the processing time for each lot (one lot: 24 wafers) by the old batch system having the processing apparatuses in the same number as that of this embodiment. For the inventive system, two processing times are shown. In the case that all processing times are the same, they are perfectly set at the longest time (3 min). On the other hand, in the case that some of the processing times are 5 min and others are 3 min, each of the processing apparatuses with the processing time of 5 min performs continued processes. In a specified kind of wafer requiring a high accurate processing, it is processed for a time of 5 min in each process shown in Table. It takes 3 min to transport each wafer between the continued processes by the transporter 308 or the transporting mechanism provided in the processing apparatus. In this embodiment, the trailing treatment is applied only to the lithography process. The reason for this is that the processing in each apparatus is made rapid, and the process with the long processing time in each processing apparatus is divided. Moreover, the transporting time between each processing apparatus and the transporter 308 is reduced by transporting a wafer in the transporter 308 in vacuum.

Figure 22:
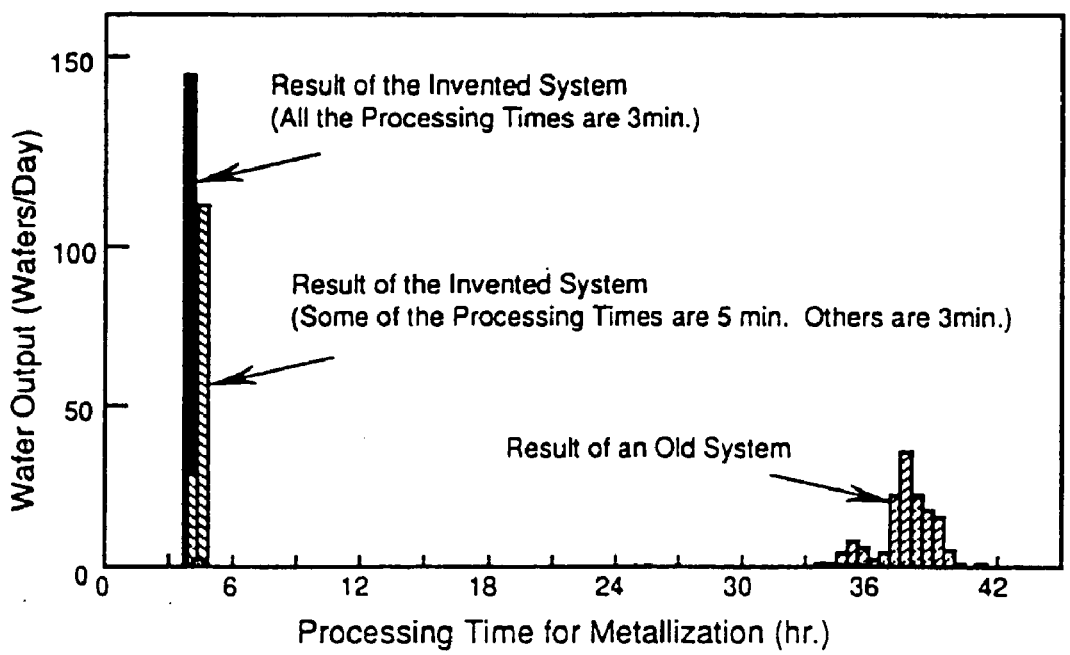
FIG. 22 a graph showing the relationship between a processing time and a wafer output in metallization processes using the inventive system and old system.

FIG. 22 is the result of scheduling the output wafer and the term of works in the metallization process of this embodiment prior to the processing. In this figure, the result in the old system having processing chambers in the same number as that of this embodiment is also shown. In the inventive system and the old system, the output wafer is 144 wafers/day. In the inventive system, the scheduling of the processing and transporting is determined, and on the basis of the scheduling, the processing is performed. The basic scheduling for processing a plurality of wafers in a fabricating system is performed by the steps of:

applying the m-th process to the n-th wafer (m, n; positive integer) for a time interval from (n+2×m−3)×T min to (n+2×m−2)×T min on the basis of a certain time;

transporting the wafer from the processing apparatus in which the m-th process is performed to a processing apparatus in which the (m+1)-th process is performed for a time interval from (n+2×m−2)×T min to (n+2×m−1)×T min; and applying the (m+1)-th process to the n-th wafer for a time interval from (n+2×m−1)×T min to (n+2×m)×T min.

The trailing treatment is not contained in the above scheduling. When a plurality of wafers simultaneously requires a certain process, the wafer to which the first process is early applied is preceded. The priority of the processing order is not performed except for the above case. The same is true for the conventional batch processing.

The term of works of the inventive system is made very shorter than that of the old system. When the processing time for each wafer is 3 min, the shortest term of works can be obtained. All of the wafers are processed without any dead time. Even when some of the processing times are 5 min, the term of works is not made longer so much. On the contrary, in the old system (batch processing), the average of the terms of works is long and the distribution thereof is extended.

The result of the actual fabrication in which a plurality of semiconductor wafers are continuously processed by the inventive system corresponds to the scheduling shown in FIG. 22. Moreover, like Embodiments 1 and 2, the percent non-defective is improved. The percent non-defective in a sequence of processes for metallization of a CMOS LSI having a two layer metal film with a minimum design dimension of 0.3 μm is improved from 86% to 93%.

Embodiment 4

This embodiment will be described with reference to FIGS. 19 and 23. In this embodiment, the present invention is applied to a fabricating system and a fabricating method for fabricating an Si logic LSI composed of a CMOS LSI having a two layer metal film.

Figure 23:
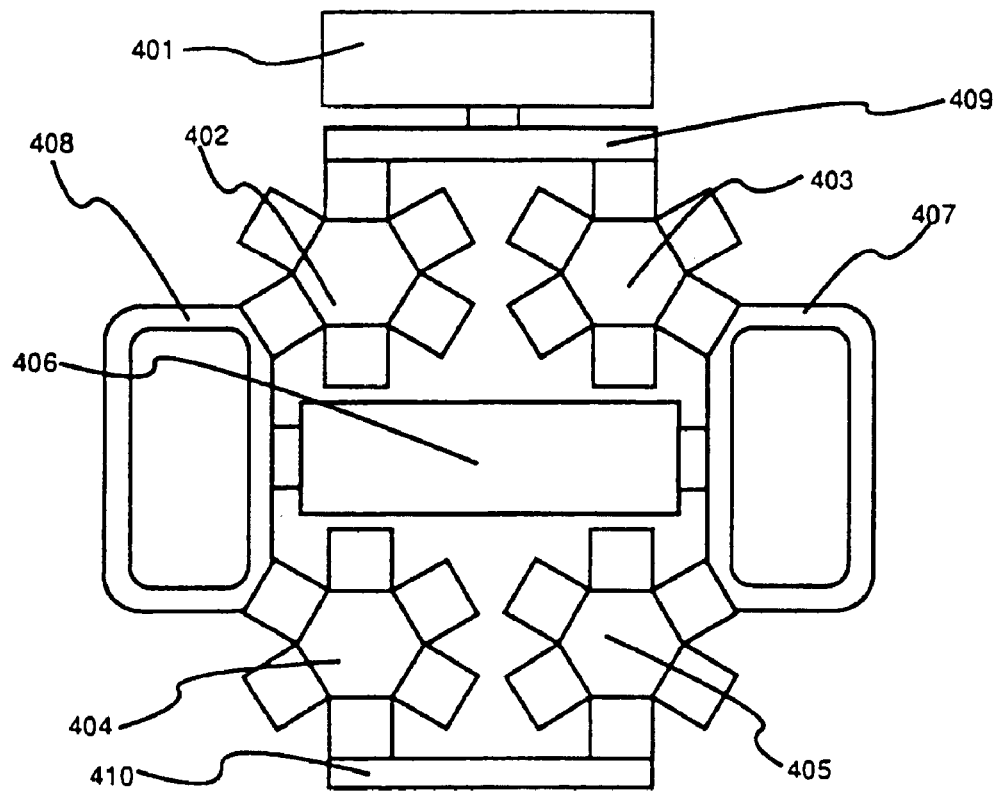
FIG. 23 is a plan view showing a further example of the fabricating system for semiconductor devices according to the present invention.

FIG. 23 is a view showing the fabricating system of this embodiment. A processing apparatus 401 is adapted to perform a plurality of lithography processes including resist coating, resist baking, exposure using an i-ray of mercury as a light source, and resist development. The apparatus 401 has a stocking apparatus capable of stocking 100 pieces of wafers. When wafers which are applicable to be exposed in the same rectile are collected by 10 pieces in the stocking apparatus, they are continuously processed. This is because the time required for exchange of rectile becomes 1/10 for each wafer. An ion implantation apparatus 402 is a cluster tool capable of introducing impurities by ion implantation and removing the resist by ashing. A dry etching apparatus 403 is a cluster tool capable of applying, to a wafer, the dry etching of an alloy mainly containing aluminum; a metal and metal compound such as tungsten or titanium nitride; and silicon and silicon compound including silicon, or silicon doped with impurities such as boron, arsenic or germanium as needed; silicon oxide, or silicon oxide doped with impurities such as boron, arsenic or germanium as needed; or silicon nitride, and the resist removing by ashing. A film deposition apparatus 404 is a cluster tool capable of applying, to a wafer, the film deposition of silicon or silicon compound including silicon, or silicon doped with impurities such as boron, arsenic or germanium as needed; silicon oxide, or silicon oxide doped with impurities such as boron, arsenic or germanium as needed; or silicon nitride. A film deposition apparatus 405 is a cluster tool capable of applying, to a wafer, the film deposition of an alloy mainly containing aluminum, and a metal or metal compound such as tungsten or titanium nitride. The film deposition for a wafer is performed by sputtering or CVD in the film deposition apparatus 405.

In the inventive system, the processing apparatuses for performing cleaning and wet etching, which require a high cleanliness, are all contained in a local ultra-cleanliness space 406 disposed at the center, thereby making easy the keeping and management of the cleanliness. All of the processing apparatuses in this embodiment are high in the sharing degree; accordingly, the processing apparatuses are disposed as shown in FIG. 23 by taking the easiness of keeping the cleanliness over the merit of the disposition of the lithography apparatus 401 at the center to reduce the load of the transporter.

The transporting steps between a plurality of processing apparatuses are performed by looped transporters 407 and 408, and linear transporters 409 and 410. The ultra cleanliness space 406 is also connected to the looped transporters 407 and 408.

The film deposition apparatus 404 is provided with four processing chambers, each of which enables the film deposition of silicon or silicon compound including silicon, or silicon doped with impurities such as boron, phosphorus or arsenic as needed; silicon oxide, or silicon oxide doped with impurities such as boron, phosphorus, arsenic or germanium as needed; or silicon nitride. The sharing of these processing chambers can be realized by the self-cleaning for the etching gas during processing by plasma discharge. The gas supply system, power feed system and discharge control system for the self-cleaning in the inventive system are shared by the film deposition clusters 404 and 405.

The deposition of the $SiO_2$ film in the film deposition apparatus 404 takes 10 min. By use of the two processing chambers, the processing apparatus 404 can receive each wafer from the transporter 408 for each 5 min and unload it to the transporter 408 for each 5 min. This is the same as the cleaning apparatus (FIG. 19) in Embodiment 2. Accordingly, although the inventive system has the processing apparatus requiring the processing time of 10 min for each wafer, all of the processing apparatuses receive or unload each wafer from or to the transporter for each 5 min. In this way, if the number of the processes with the long processing time in, for example the above film deposition apparatus 404 is small, only the term of works is somewhat lengthened and the number of wafers during processing is increased. The time interval of 5 min is longest in the processes in this embodiment, and which is taken as the period of time T. In this embodiment, each processing apparatus is of a single wafer processing type; however, it is not limited thereto. For example, in the case of the batch processing, by inserting a stocking apparatus between the processing apparatus and the transporter, it is possible to load or unload a wafer from or to the transporter for each time interval. The lithography apparatus 401 is restricted in the rectile exchange, and is substantially of a batch processing type; however, by use of the stocking apparatus, it becomes possible to load or unload a wafer from or to the transporter for each specified time interval.

In the inventive system, since the sharing degree of the processing apparatuses is large, the number of the processing apparatuses is reduced. Accordingly, this system is small in the wafer output, but is low at the cost and is small in the installation area, and therefore, it is suitable for the fabrication of a logic LSI which is small in the fabrication amount. A plurality of the inventive systems may be used for mass-production. By use of a plurality of the systems capable of being independently controlled, it is possible to suppress the effect of the stop of the systems due to an accidental failure of the processing apparatus and transporter or the repair therefor, and the maintenance or checking. In this embodiment, four of the systems are provided as shown in FIG. 23. They are subsequently stopped for maintenance and checking once for each week for preventing the accidental failure of the processing apparatuses and the transporters. The provision of a plurality of the systems makes easy the management thereof.

To prevent the stop of the whole system due to a failure caused at a portion of the system, it is effective to provide spare apparatuses. In this embodiment, the spare apparatus is provided in the clean room at a rate of one apparatus to four systems shown in FIG. 23. To make easy the exchange of the processing apparatuses, the system is previously provided with a guide mechanism to move the processing apparatus along the guide, which eliminates the adjustment in the relative positional relationship to the transporter. The spare processing apparatus may be previously provided in the system.

Like Embodiments 1 to 3, in the inventive system, the percent non-defective is improved and the term of works is shortened. The feature of this embodiment is to easily cope with a failure generated at a portion of the transporter. In this system, at least two transporting routes are given between any two processing apparatuses. When a portion of the transporter fails, a wafer can be transported along the different route, thereby preventing the stop of the whole system due to the failure of the transporter.

The thus doubled transporters is effective to prevent the cross-contamination between the processing apparatuses. A wafer entering the ultra cleanliness space 406 and a wafer discharged therefrom are respectively transported along the different routes, so that it becomes possible to prevent the cross-contamination between processing apparatuses by way of the wafer. In particular, this system is effective to fabricate the wafer necessary to be accurately managed in terms of the cleanliness.

Embodiment 5

This embodiment will be described with reference to FIGS. 24 and 25. In this embodiment, the present invention is applied to a fabricating system and a fabricating method for fabricating an Si logic LSI composed of a CMOS LSI having a two layer metal film.

Figure 24:
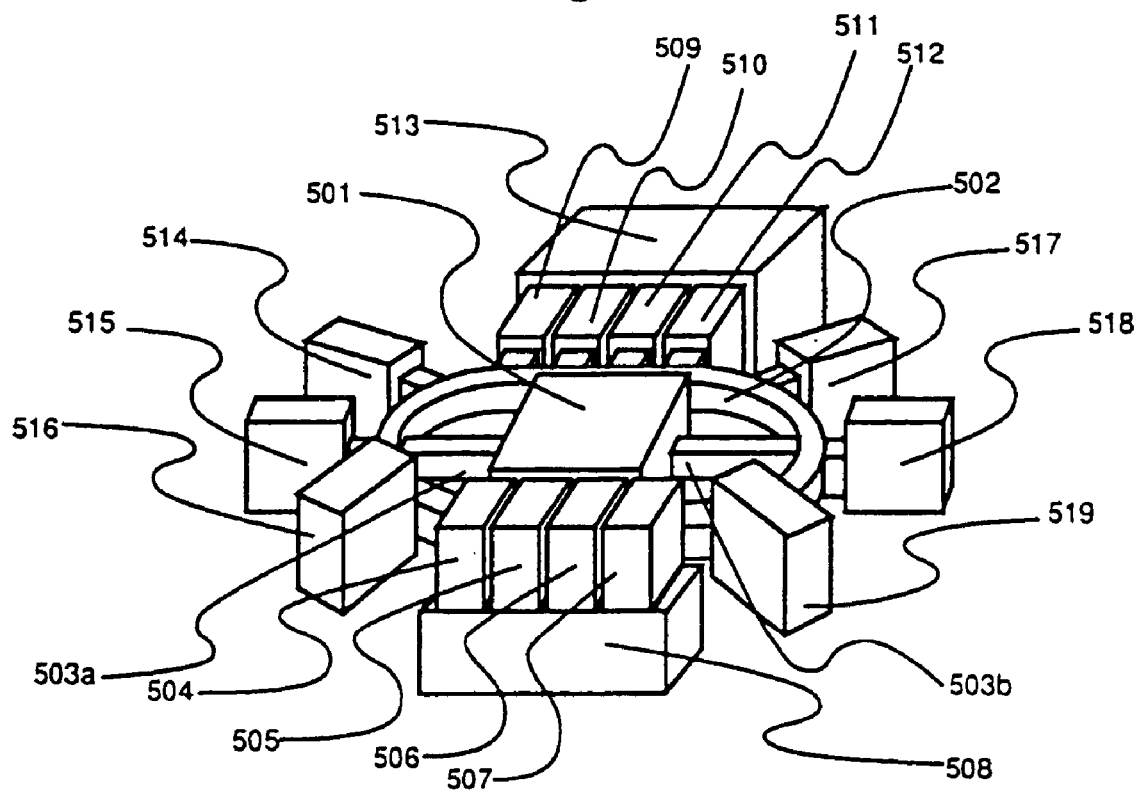
FIG. 24 is a perspective view showing a further example of the fabricating system for semiconductor wafers according to the present invention.

FIG. 24 is a view showing a fabricating system of this embodiment. A looped transporter 502 having a single wafer transporting mechanism is provided around a lithography apparatus 501. The apparatus 501 is adapted to perform a sequence of lithography processes including resist coating, resist baking, exposure using an i-ray of mercury as a light source, and resist developing. The looped transporter 502 is filled with clean nitrogen at a pressure of the atmospheric pressure or more. The lithography apparatus 501 can apply two kinds of a sequential processes for fine pattern and rough pattern to different semiconductor wafers. The processing apparatuses for applying two continued processes are connected to each other by means of the looped transporter 502 with a transporting time of 3 min for each wafer. The lithography apparatus 501 is connected to the looped transporter 502 by means of linear transporters 503a and 503b. Each of the linear transporters 503a and 503b is provided with a mechanism for transporting a single wafer in nitrogen. Like Embodiments 1 to 4, various processing apparatuses are connected to the looped transporter 502 by way of interface mechanisms each having a loading and unloading mechanism. In the inventive system, the looped transporter 502 is connected to the linear transporters 503a and 503b by means of the interface mechanisms for transporting wafers. Each wafer can be moved between any processing apparatuses for a time interval of 3 min by the looped transporter 502 and the linear transporters 503a and 503b.

A dry etching apparatus 504 is adapted to apply, to a wafer, the dry etching of various kinds of metals or metal compounds used for metallization of the LSI, for example, aluminum or an alloy mainly containing aluminum; tungsten or an alloy mainly containing tungsten such as titanium tungsten; titanium nitride; metal silicide such as titanium silicide or tungsten silicide; and copper or copper mainly containing copper. The number of the processing chambers provided in the dry etching apparatus 504 is not limited to one; but may be suitably selected according to the kind of a wafer and fabrication amount. The processing apparatus 504 in this embodiment has the two processing apparatuses.

A dry etching apparatus 505 is adapted to apply, to a wafer, the dry etching of a metal or metal compound used for electrode metallization of the LSI, and an insulator film, isolation area or interlayer insulator film for an MOS transistor or capacitor, for example, silicon or silicon doped with impurities such as boron, phosphorous or arsenic as needed; silicon oxide, or silicon oxide doped with impurities such as boron, phosphorus, arsenic or germanium as needed; or silicon nitride. The number of the processing chambers provided in the dry etching apparatus 505 is not limited to one, but may be suitably selected according to the kind of a wafer and the fabrication amount. The processing apparatus 505 has two processing chambers.

A film deposition apparatus 506 is adapted to apply, to a wafer, the film deposition of a metal or metal compounds used for electrode metallization of the LSI, and an insulator film, isolation area or interlayer insulator film for an MOS transistor or capacitor, for example, silicon or silicon doped with impurities such as boron, phosphorous or arsenic as needed; silicon oxide, or silicon oxide doped with impurities such as boron, phosphorus, arsenic or germanium as needed; or silicon nitride. The film deposition is applied to a wafer in the film deposition apparatus 506 by CVD using a source gas containing inorganic silicon compound such as silane, disilane, and dichlorosilane. The number of the processing chambers provided in the film deposition apparatus 506 is not limited to one, but may be suitably selected according to the kind of a wafer and the fabrication amount. The processing apparatus 506 has two processing chambers.

A film deposition apparatus 507 is adapted to apply, to a wafer, the film deposition of a silicon compound used for an interlayer insulator film or passivation layer, for example, silicon oxide; silicon oxide doped with impurities such as boron, phosphorus, arsenic or germanium as needed; or silicon nitride. The film deposition is applied to a wafer in the processing apparatus 507 by plasma CVD using an inorganic silicon compound such as silane, disilane or dichlorosilane, or an organic compound such as TEOS. The number of the processing chambers provided in the film deposition apparatus 507 is not limited to one, but may be suitably selected according to the kind of a wafer and the fabrication amount. The processing apparatus 507 has two processing chambers.

The exhaust of nine of processing chambers provided in four of the processing apparatuses 504 to 507 is performed by a common exhaust system 508. The common exhaust system 508 includes two of turbo-molecular pumps each having a nitrogen displacement of 10,000 l/sec. One of the pumps is used for the exhaust of the four processing chambers of the dry etching apparatuses 504 and 505; and the other pump is used for the exhaust of the five processing chambers of the film deposition apparatuses 506 and 507. The exhaust pump of each processing chamber, which is conventionally provided in the processing apparatus, is removed, and an exhaust pipe is made to extend to the common exhaust system 508. The common exhaust system 508 is periodically exchanged by a spare exhaust system for preventing a failure in the processing apparatus due to the exhaust system.

A cleaning and wet etching apparatus 509 and an oxidizing apparatus 510 which require high cleanliness are disposed in such a manner as to be symmetric from each other with respect to the dry etching apparatuses 504, 505, film deposition apparatus 506, 507 and the lithography apparatus 501 which are relatively low in cleanliness. This is one of the measures for preventing the adverse effect of the cross-contamination by way of the looped transporter 502. To prevent the cross-contamination, the looped transporter 502 includes a mechanism for blowing a laminar flow nitrogen gas on the surface of a wafer. Each of the transporters 502, 503a and 503b includes a mechanism for detecting the approach and passage of a wafer. The mechanism controls the flow rate of nitrogen to be larger in the presence of a wafer, and to be smaller in the absence of a wafer, thus preventing the local contamination in the processing apparatus from being diffused to the whole system by way of a wafer.

A film deposition apparatus 511 is adapted to apply, to a wafer, the film deposition of a metal and metal compound used for electrode or metallization of the LSI, for example, aluminum or an alloy mainly containing aluminum; tungsten or an alloy mainly containing tungsten such as titanium tungsten; titanium nitride; a metal silicide such as titanium silicide or tungsten silicide; or copper or an alloy mainly containing copper. The film deposition for a wafer is performed by sputtering in the processing apparatus 511. The number of the processing chambers provided in the film deposition apparatus 511 is not limited to one, and may be suitably selected according to the kind of a wafer and the fabrication amount. In this embodiment, the processing apparatus 511 includes four processing chambers for applying, to a wafer, the pre-treatment such as HF vapor cleaning, gas cleaning or sputter-cleaning. Moreover, the processing apparatus 511 includes a mechanism for applying, to a wafer, an RTA (Rapid Thermal Annealing) for silicidation after the film deposition of titanium or tungsten.

A film deposition apparatus 512 is adapted to apply, to a wafer, the film deposition of a metal used for electrode or metallization of the LSI such as aluminum, tungsten or copper. The film deposition is performed by CVD in the processing apparatus 512. The number of the processing chambers provided in the film deposition apparatus 512 is not limited to one, and may be suitably selected according to the kind of a wafer and the fabrication amount. In this embodiment, the processing apparatus 512 includes two processing chambers.

The cleaning and wet etching apparatus 509, the oxidizing apparatus 510, and the film deposition apparatuses 511 and 512 are controlled by a control system 513. The control system 513 has a mechanism for detecting the states of each processing chamber in the apparatuses 509, 510, 511 and 512, a gas supply system, exhaust system and power supply system, and it has also a mechanism for feeding-back the detection result to the control for each processing or each processing apparatus. The control for each processing is performed, for example by setting the kinds and flow rate of gases and the wafer temperature according to the predetermined condition. The feed-back of the detection result means that when there occurs abnormality in one exhaust system of a plurality of processing chambers of each processing apparatus, the command for prohibiting the use of the processing chamber is transmitted to the processing apparatus.

An impurities introducing apparatus 514, a cleaning and wet etching apparatus 515, and a resist removing apparatus 516 are connected to the looped transporter 502. A sequence of resist removing processes are performed by the apparatuses 516 and 515.

A processing apparatus 517 is adapted to apply RTA (Rapid Thermal Annealing) to a wafer in an atmosphere of nitrogen, hydrogen, oxygen or argon. An loading and unloading has a function to load or unload a plurality of wafers to or from the fabricating system one by one.

A film deposition apparatus 519 is adapted to form a coating film for planarization of an interlayer insulator film. It includes a mechanism capable of performing not only the coating but also the baking of the coating film. Each of the processing apparatuses of the inventive system shown in FIG. 24 is of a single wafer processing type. All of the continuous single wafer processing apparatuses are connected to each other by means of a single wafer transporter capable of transporting a wafer for a time interval less than 3 min. Thus, the whole system can apply a sequence of continued processes to a wafer. The construction of each processing apparatus and the flow of processes are the same as those in Embodiment 2.

Next, a fabricating method using the inventive system will be described. First, a wafer is loaded in the fabricating system from the loading/unloading apparatus 518. The loading/unloading apparatus 518 receives 25 pieces of wafers once, and unloads them to the fabricating system one by one with suitable time intervals. The time interval is 24 min on average in this embodiment. The wafer is then transported to the processing apparatus 509 by way of the looped transporter 502 and is subjected to wet cleaning. It is further subjected to the oxidation process in the adjacent processing apparatus 510. The wafer is then transported to the film deposition apparatus 506 by the looped transporter 502, and is formed with an $Si_3N_4$ film by CVD. Subsequently, it enters the lithography apparatuses 501 by means of the looped transporter 502 and the linear transporter 503*b*, and is subjected to resist coating, resist baking, exposure using an i-line of mercury as a light source, and resist developing. After that, the wafer is transported to the dry etching apparatus 504 by means of the linear transporter 503*a* and the looped transporter 502. In this dry etching apparatus 504, part of the $Si_3N_4$ film is selectively removed using the resist as a mask. Next, the wafer is transported to the processing apparatus 514 by means of the looped transporter 502, and is subjected to ion implantation. It is then transported to the processing apparatus 516. In the apparatus 516, the resist is removed. Thus, a plurality of the wafers are sequentially processed. The period time T in this embodiment is 3 min. Like Embodiment 2, the period time of T is realized by the introduction of the trailing treatment and the provision of a plurality of processing chambers in the processing apparatus. The transporting time between any two processing apparatuses is 3 min.

Like Embodiments 1 to 4, in this embodiment, the same period time is allocated for the processing and the transporting; accordingly, at a certain time, about half of the wafers are processed, and the remaining wafers are transported, except for the effect of the trailing treatment and of a long term processing using a plurality of processing chambers. If all the wafers in the system are processed simultaneously, on the other hand, and then all the wafers are transported at the same time, the cycle time of works in the latter processing way can be shortened more than that of the inventive method unless the transporting time is shortened. However, this becomes possible only for the small-scale fabrication. In the usual fabrication form, the inventive method is exterior to the latter processing way. This is because, in the latter processing way, wafers are not processed during the transporting step, thereby reducing the working efficiency. Moreover, in the latter processing way, all wafers are allocated to the next processing apparatus, which makes difficult the scheduling and hence the effective use of the whole system. According to the inventive system, in processing a plurality of wafers, the scheduling for processing and transporting are first determined as follows. The n-th wafer is subjected to the m-th process for a time interval from $(n+2 \times m-3) \times T$ min to $(n+2 \times m-2) \times T$ min based on a certain time (n, m: positive integer); the above wafer is transported by a single wafer inter-apparatus transporter from the processing apparatus in which the m-th process is performed to a processing apparatus in which the (m+1)-th process is processed for a time interval from $(n+2 \times m-2) \times T$ min to $(n+2 \times m-1) \times T$ min; and the n-th wafer is subjected to the (m+1)-th process for a time interval from $(n+2 \times m-1) \times T$ min to $(n+2 \times m) \times T$ min. On the basis of the above scheduling, the processing is performed. The trailing treatment and a long term processing using a plurality of processing chambers are not contained in the above scheduling.

Figure 25:
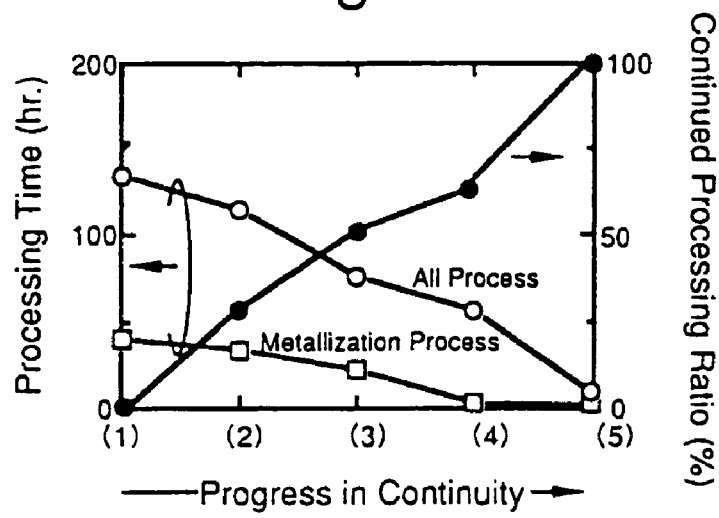
FIG. 25 is a graph showing the relationship between a continued processing ratio and a processing time.

As shown in FIG. 25, the continued processing ratio (continued process steps/all process steps) is increased by performing the progress in continuity in the order of (1) to (5) shown in the abscissa. This is the result of measuring the processing times of all processes for one lot (25 wafers) in the fabrication of the CMOS LSI having a two layer metal film requiring about 100 of processes. (1) In the batch transporting, the total processing time for all processes is about 135 hr. (2) First, the last process of a sequence of the lithography processes including resist coating, resist baking, exposure and resist developing is continued to the etching process such as dry etching or wet etching, or the impurities introducing process by ion implantation, as a result of which each continued process can be performed with the processing time of T=3 min. (3) Next, the etching process such as dry etching or wet etching, and impurities introducing process by ion implantation are continued to the resist removing process, and which are continued to the above-described continued processes, as a result of which each continued process can be performed with the processing time of T=3 min. (4) Moreover, the metallization process including the metal film deposition process and insulator film deposition process are similarly continued to the above processes, as a result of which each continued process in the metallization can be performed with the processing time of T=3 min. (5) The continued processing is thus sequentially progressed, and all of the remaining processes including the oxidation, CVD and the like are continued to the above processes, as a result of which each continued process can be performed with the processing time of T=3 min, thus shortening the total processing time for one lot (25 wafers) to be 10.1 hr.

In the fabrication of the CMOS LSI having a two metal film using apparatuses shown in FIG. 24, all of the processes including those after the resist removing process are continued to each other, so that the processing time for one lot is 10.1 hr which corresponds to the continued processing ratio of 100% in FIG. 25. As compared with the processing time of 135 hr in the lot processing, the term of works is shortened to be 1/10 or less.

In the case of simultaneously processing a plurality of lots in the same fabricating system, the processing time of the inventive system is somewhat lowered because of the sharing of the processing apparatuses. In the lithography apparatus with the largest sharing degree, one wafer is subjected to lithography to form six and eight layers of patterning for fine pattern and rough pattern, respectively. Namely, in this embodiment, the maximum sharing degree is a ratio of eight processes to one processing apparatus. The sharing degree of other processing apparatuses is smaller than the above case, so that the processing time is not increased so much. When eight layers of patterning are formed by lithography at a processing time of 24 (=3×8) min/wafer, the throughput becomes 60 wafers/day (24 hr). This restricts the processing ability of the fabricating system of this embodiment. The input amount of wafers to the system described above is thus determined. When processes more than the above case are required, a plurality of the systems may be provided. In the case of the throughput of 60 wafers/day (=1800 wafers/month), the whole processing time for 25 wafers (one lot) is 17 hr on average. This is because all of the apparatuses are managed to be effectively operated according to the optimized production management system using computers. In the conventional lot processing, to achieve the throughput of 60 wafers/day, the average processing time becomes about 400 hr even by use of computers. The optimization can be achieved by use of the pipeline system in which the processing time and the transporting time of each process are both set at 3 min.

In the inventive system, the lithography apparatus 501 is disposed substantially at the center of the system within the looped transporter 502. By disposing the processing apparatus with a high shearing degree at the center, it is possible to shorten the total transporting distance, and to relatively decrease the transporting speed thus reducing the load of the transporter. The resist removing apparatus or ion implantation apparatus with a high sharing degree may be disposed at the center to shorten the total transporting distance. Another reason why the lithography apparatus 501 is disposed at the center is as follows. Namely, the lithography apparatus 501 requires a high accurate temperature control, and thereby it must be disposed in the clean room just as in the conventional manner. Thus, the looped transporter 502 and the linear transporters 503a and 503b are disposed around the lithography apparatus 501 within the clean room, which makes it possible to easily manage the cleanliness without any complicated mechanism in the transporter itself. The processing apparatuses around the looped transporter 502 may be disposed in the clean room with a low cleanliness or out of the clean room as needed, thus reducing the area of the clean room with a high cleanliness.

By the reduction of the term of works and the provision of the single wafer transporter, the inventive system is not required to be contained in a clean space with a high cleanliness, and has an effect of obtaining the good percent non-effective even in the clean space of a low cleanliness class. By use of the inventive system installed in a clean room of a cleanliness class 10000, the percent non-defective of the CMOS LSI having a two layer metal film with the minimum design dimension of 0.3 μm is improved from 78% (the conventional system in the clean room of class 100) to 92%.

In the inventive system, the cycle T is specified at 3 min. When T is less than 7 min, the cost reduction can be obtained in the fabrication for some products. When it is less than 5 min, the cost reduction can be obtained in the fabrication of products except for the specified products such as DRAM and SRAM in which the cost reduction is achieved by mass-production.

When a plurality of kinds of wafers are fabricated, in the inventive system is superior in the working efficiency of each processing apparatus to the old system. Moreover, in the old system, when a certain kind of wafers are preceded, the flow of the processing is disturbed, to reduce the working efficiency and lower the wafer output, thus making longer the term of works of the other kinds of wafers. However, in the inventive system, the terms of works for all kinds of wafers are shortened, so that it is not required to precede a specified kind of wafers. Therefore, the inventive system is suitable for the mass-production of various kinds of wafers.

Embodiment 6

This will be described with reference to FIGS. 27 to 39 and Tables 6 and 8. In this embodiment, one layer metal film and a passivation layer are formed on a semiconductor wafer formed with elements and contact-holes.

Figure 27:
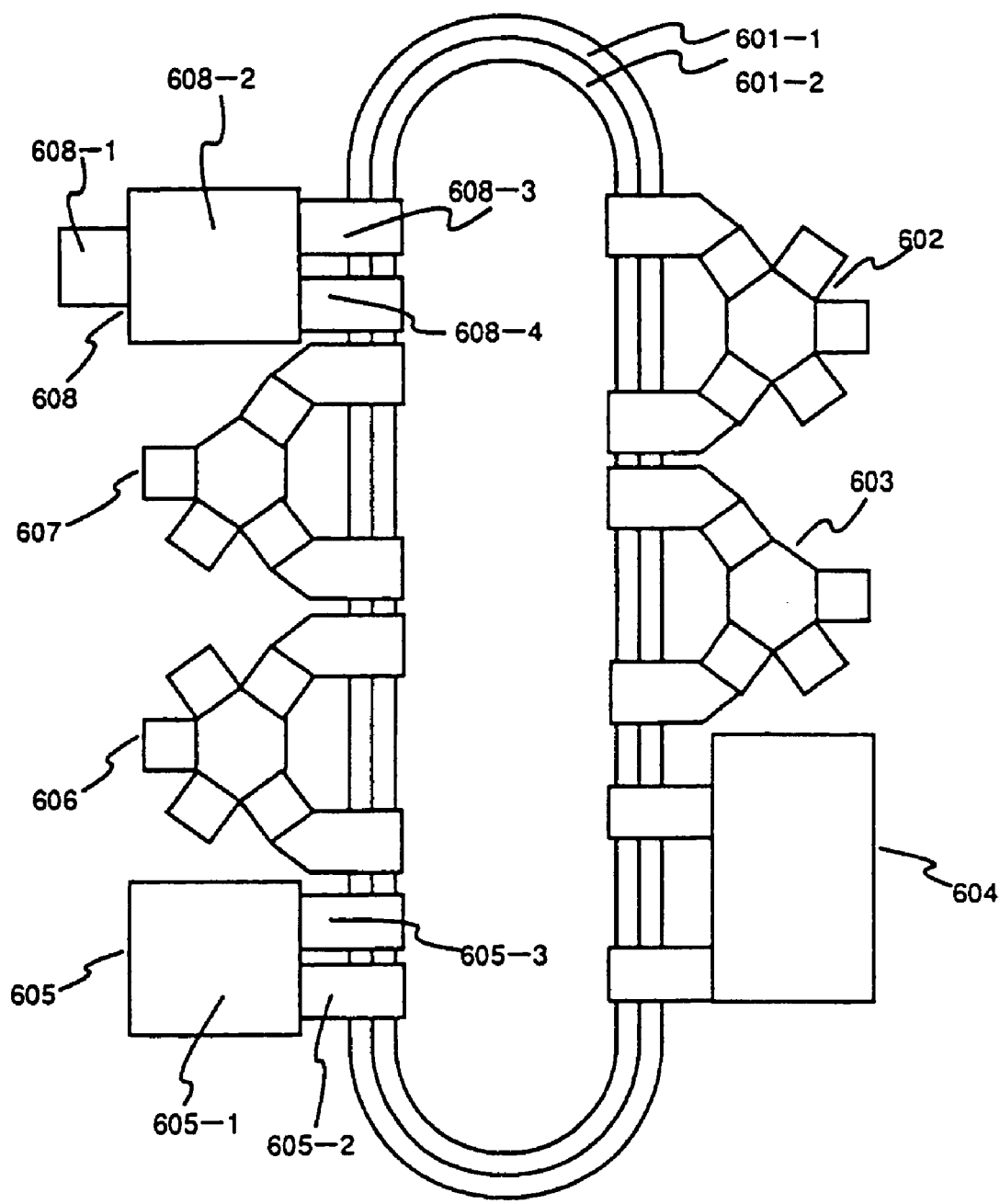
FIG. 27 is a plan view showing a further example of the fabricating system for semiconductor devices according to the present invention.

FIG. 27 is a view showing the embodiment of the inventive system. A metal film deposition apparatus 602, insulator film deposition apparatus 603, lithography apparatus 604, stocking apparatus 605, metal film dry etching apparatus 606, insulator film dry etching apparatus 607, and wafer loading/unloading mechanism 608 are disposed around two looped inter-apparatus single wafer transporters 601-1 and 601-2. In this embodiment, a single wafer is processed and transported. Six pieces of semiconductor wafers #1 to #6 are continuously processed in the metal film deposition apparatus 602, lithography apparatus 604, metal film dry etching apparatus 606, insulator film deposition apparatus 603, lithography apparatus 604 and insulator film dry etching apparatus 607.

Six pieces of the semicondctor wafers are unloaded to the fabricating system by way of the loading/unloading apparatus 608. First, they are put in a preparing chamber 608-1 of the apparatus 608, and after the atmosphere of the preparing chamber 608-1 is replaced by high purity nitrogen, they are transported to a stocking chamber 608-2 filled with high purity nitrogen by a transporting mechanism provided in the stocking chamber 608-2. The wafers are then unloaded from the stocking chamber 608-2 to the transporter 601-1 or 601-2 by a transporting mechanism provided in an unloading chamber 608-4 sequentially in the order of the number of the wafers with a time interval of 6 min (which is the specified time interval T in this embodiment) on the basis of a specified starting time. It takes 1 min until the start of the unloading of the wafer #1 after six pieces of the wafers are disposed in the preparing chamber 608-1. The unloading chamber 608-4 is filled with high purity nitrogen. In the transporter 601-1 or 601-2, the wafers are also transported in a high purity nitrogen atmosphere. Each of the transporter 601-1 and 601-2 has a mechanism of moving wafers along one-direction by a belt, and it takes 9 min for one round. The length of one round in the outside transporter 601-1 is 45 m and the transporting speed is 300 m/h, which can be realized by the conventional transporting technique. A semiconductor wafer can be moved between any two processing apparatuses for 9 min or less by means of the transporter 601-1 or 601-2. The transporting time of a semiconductor wafer between processing apparatuses, including receiving and unloading times to and from a processing apparatus, is less than the time interval T (6 min).

Figure 28:
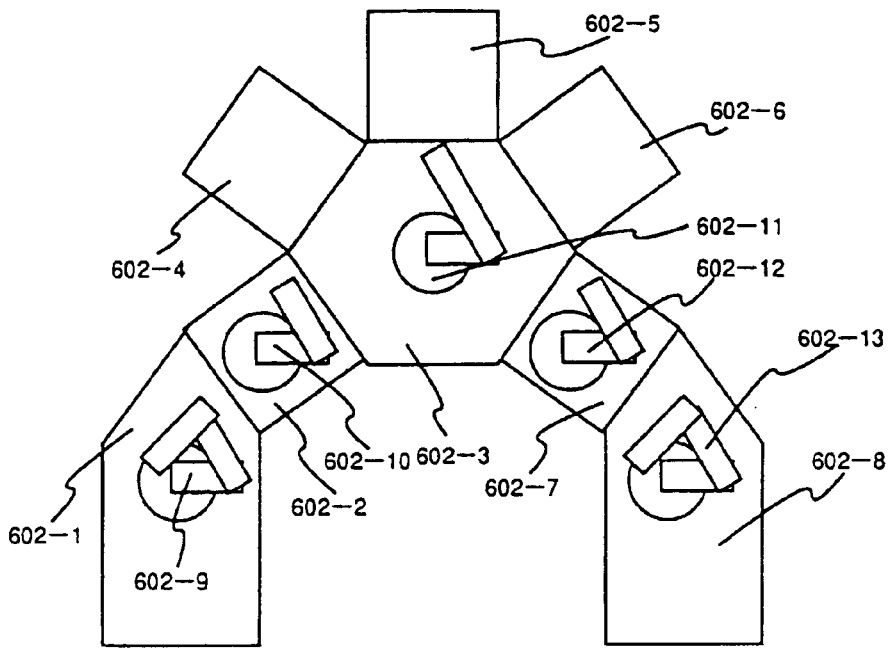
FIG. 28 is a plan view showing one example of a metal film deposition apparatus constituting the fabricating system according to the present invention.
Figure 29:
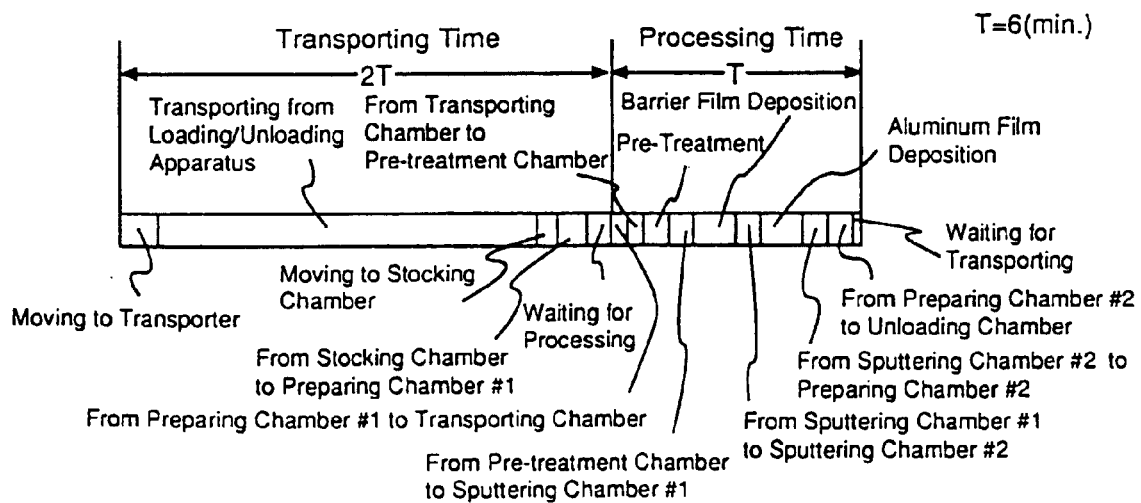
FIG. 29 is a diagram showing a processing procedure for semiconductor wafers in the metal film deposition apparatus shown in FIG. 28.
Figure 32:
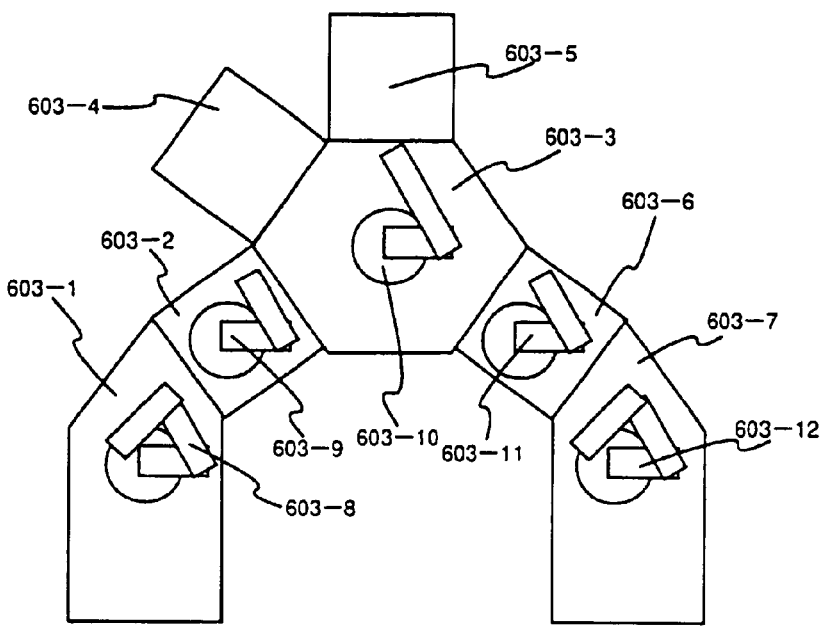
FIG. 32 is a plan view showing one example of an insulator film deposition apparatus constituting the fabricating system according to the present invention.
Figure 33:
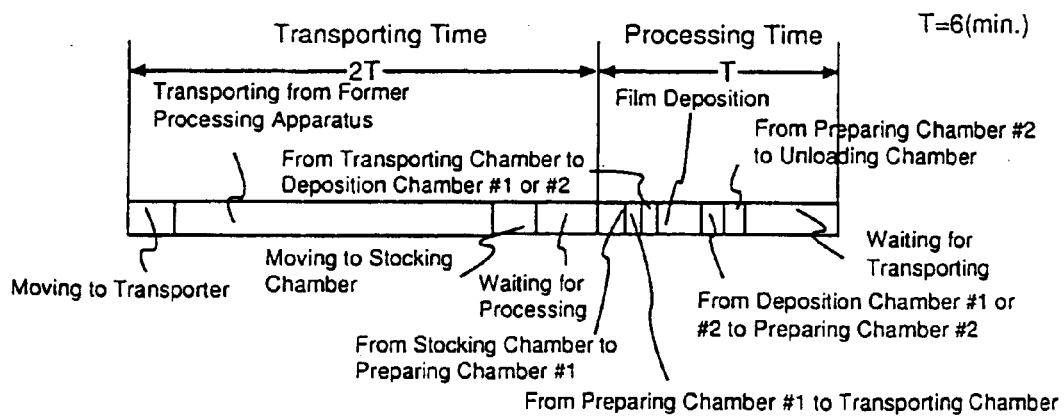
FIG. 33 is a view showing a processing procedure for semiconductor wafers in the insulator film deposition apparatus shown in FIG. 32.
Figure 34:
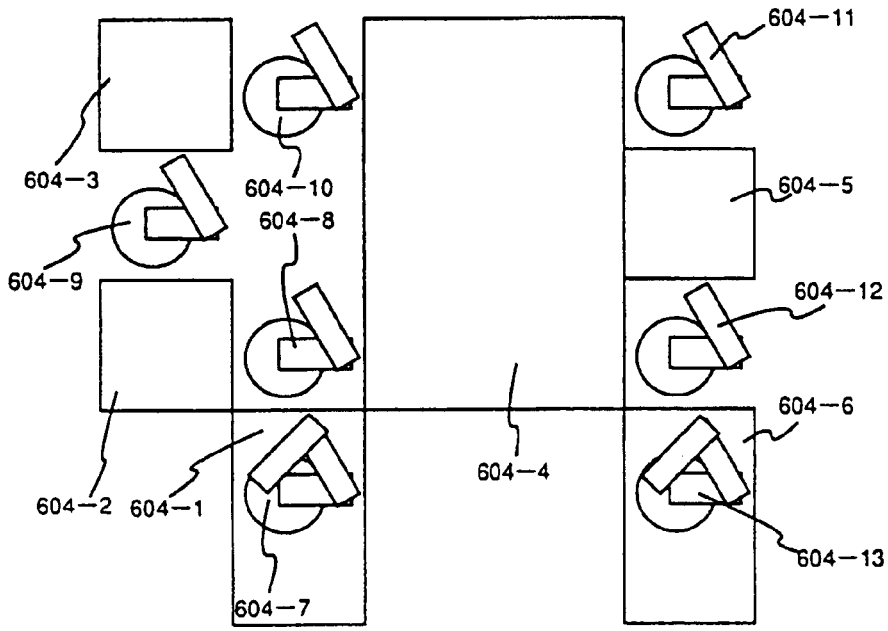
FIG. 34 is plan view showing one example of a lithography apparatus constituting the fabricating system according to the present invention.
Figure 35:
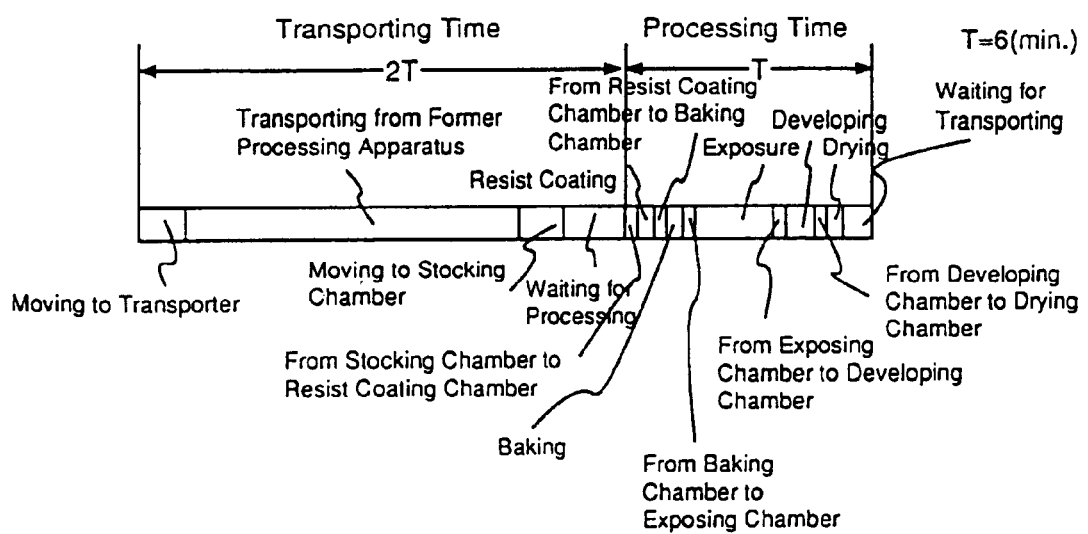
FIG. 35 is a diagram showing a processing procedure for semiconductor wafers in the lithography apparatus shown in FIG. 34.
Figure 36:
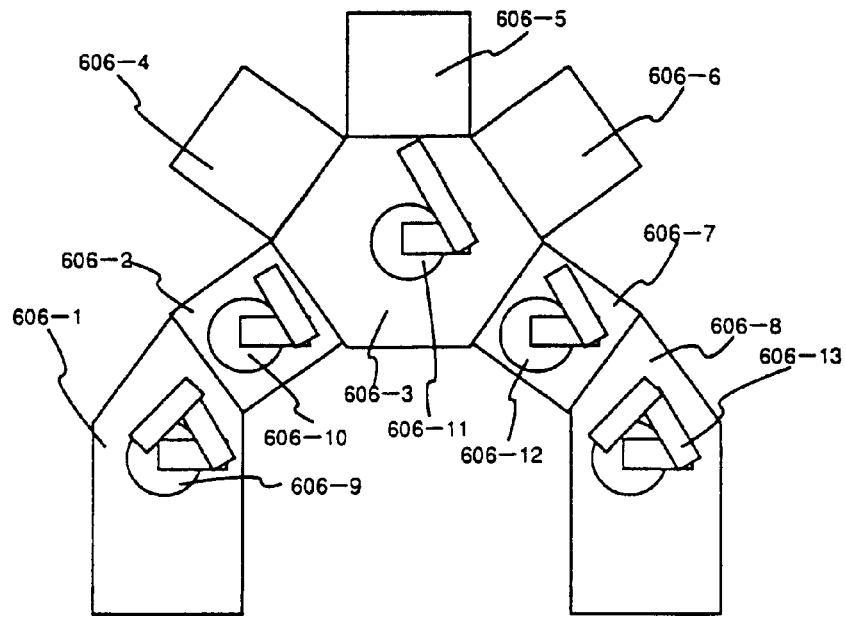
FIG. 36 is a plan view showing one example of a metal film dry etching apparatus constituting the fabricating system of the present invention.
Figure 37:
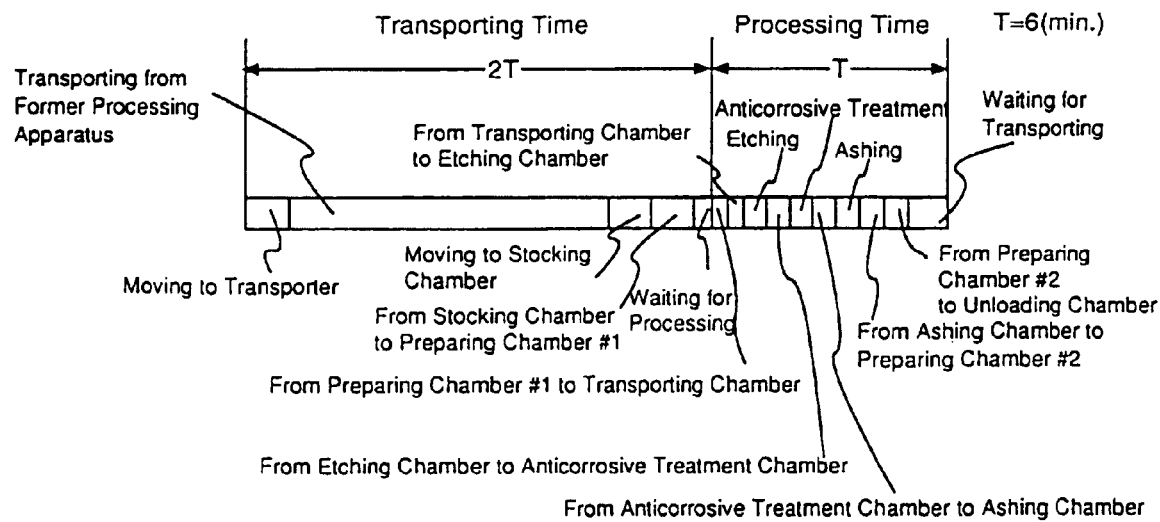
FIG. 37 is a diagram showing a processing procedure for semiconductor wafers in the dry etching apparatus shown in FIG. 36.
Figure 38:
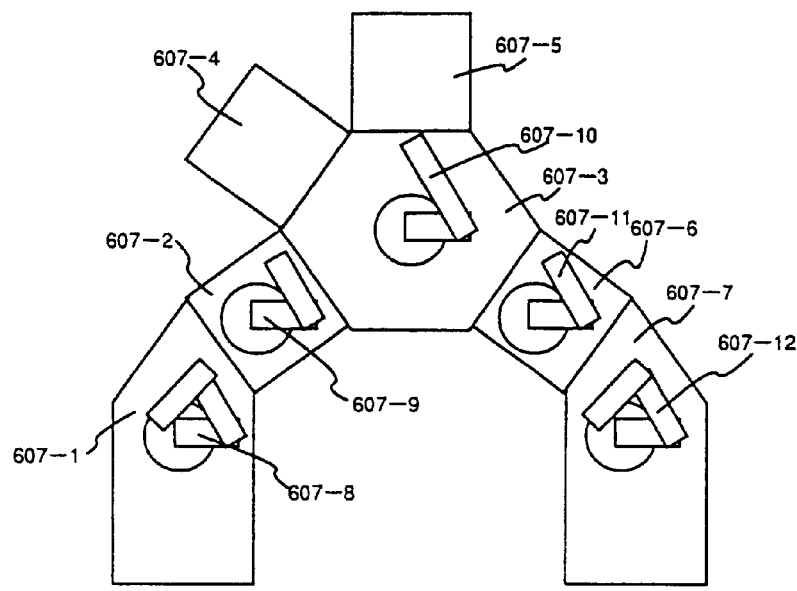
FIG. 38 is a view showing one example of an insulator film dry etching apparatus constituting the fabricating system of the present invention.
Figure 39:
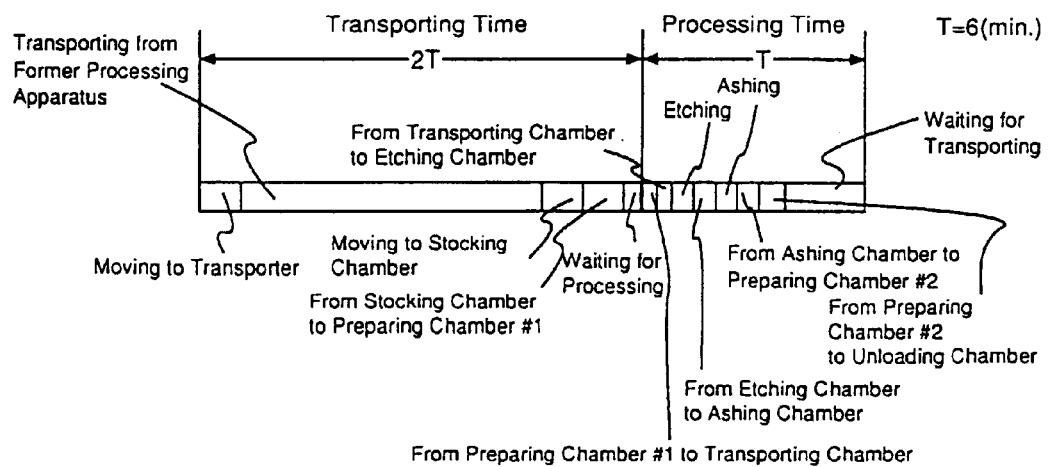
FIG. 39 is a diagram showing a processing procedure for semiconductor wafers in the dry etching apparatus shown in FIG. 38.

First, the wafer #1 is transported to the metal film deposition apparatus 602 by the transporter 601-1 or 601-2. The construction of the metal film deposition apparatus 602 is shown in FIG. 28. The details of the processing and the transporting in the apparatus 602 are shown in FIG. 29. Similarly, the construction and the details of the processing and transporting in the insulator film deposition apparatus 603 are shown in FIGS. 32 and 33; those in lithography apparatus 604 are shown in FIGS. 34 and 35; those in metal film dry etching apparatus 606 are shown in FIGS. 36 and 37; and those in insulator film dry etching apparatus 607 are shown in FIGS. 38 and 39.

A transporting mechanism 602-9 of the stocking chamber 602-1 filled with high purity nitrogen receives the wafer #1 from the transporter 601-1 or 601-2. It is transported to a preparing chamber #1 602-2 filled with nitrogen at the atmospheric pressure by a transporting mechanism 602-10 provided in the preparing chamber #1 602-2, and then the preparing chamber #1 602-2 is evacuated up to 0.06 Pa.

It takes not less than 12 min until the evacuation of the preparing chamber #1 602-2 is completed and the wafer #1 is made possible to be transported to a transporting chamber 602-3, after it is started to be unloaded to the transporter 601-1 or 601-2 by the transporting mechanism provided in the unloading chamber 608-4. The processing is started after an elapse of 12 min. The time, at which the wafer #1 is started to be processed in the metal film deposition apparatus 602, is taken as a time To. The wafer #1 waits for a time interval until it is started to be processed after it is made possible be transported to the transporting chamber 602-3.

First, the wafer #1 is transported from the preparing chamber 602-2 to the transporting chamber 602-3 by means of a transporting mechanism 602-11 provided in the transporting chamber 602-3. The pressure in the transporting chamber 602-3 is 6.5×10E(−5) Pa. The wafer #1 is then transported to a pre-treatment chamber 602-4 by the transporting mechanism 602-11 and are subjected to the pre-treatment for film deposition. In this embodiment, a natural oxide film or the like on the bottom of a contact-hole of an Si substrate is removed by soft-etching using Ar soft plasma.

The pressure is 0.65 Pa and the etching time is 30 sec. After evacuation of the pre-treatment chamber 602-4, the wafer #1 is transported to a sputtering chamber #1 602-5 by way of the transporting chamber 602-3 by a transporting mechanism 602-11 provided in the transporting chamber 602-3. In the sputtering chamber #1 602-5, the wafer #1 is formed with a barrier film, which is TiN in this embodiment, to a thickness of 150 nm by a reactive sputter using a discharge gas of Ar and $N_2$. In the film formation, the pressure is 0.5 Pa, and the processing time is 1 min. The wafer #1 is then transported to a sputtering chamber #2 602-6 by way of the transporting chamber 602-3 by the transporting mechanism 602-11. In the sputtering chamber #2 602-6, an Al-1% Si-0.5% Cu alloy film is deposited. The thickness of the Al alloy film is 700 nm, the pressure for the film deposition is 0.5 Pa, and the processing time is 1 min. After that, the wafer #1 is transported to a preparing chamber #2 602-7 with a pressure of 0.06 Pa by way of the transporting chamber 602-3 by the transporting mechanism 602-11. After the pressure of the preparing chamber #2 602-7 is returned to the atmospheric pressure using nitrogen, the wafer #1 is transported to an unloading chamber 602-8 filled with high purity nitrogen by a transporting mechanism 602-12 provided in the preparing chamber #2 602-7. It takes less than 6 min, that is, 5.7 min until the wafer #1 is transported to the unloading chamber 602-8 and is made possible to be transported to the transporter 601-1 or 601-2 by a transporting mechanism 602-13 provided in the unloading chamber 602-8, after it is started to be transported to the transporting chamber 602-3 from the preparing chamber #1 602-2. The wafer #1 is started to be transported to the next processing apparatus after an elapse of 6 min. The wafer #1 waits for a time interval until it is started to be transported after it is made possible to be unloaded to the transporter 601-1 or 601-2.

The time, at which the wafer #1 is started to be processed in the metal film deposition apparatus 602, is taken as the time To. FIG. 30 is a view for explaining the details of the processing and transporting applied to the wafers #1 and #2 for a time period of 3T (=18) min after the time To. The processing time of the wafer #1 in the metal film deposition apparatus 602 is the time from To to (To+T), that is, the time T (=6) min. The transporting time of the wafer #1 from the metal film deposition apparatus 602 to the lithography apparatus 604 is the time from (To+T) to (To+3T), that is, the time 2T min. This transporting will be described. First, at the time (To+T), the wafer #1 is started to be unloaded to the transporter 601-1 or 601-2 by means of a transporting mechanism 602-13 (FIG. 28) provided in the unloading chamber 602-8, and it is transported to the subsequent lithography apparatus 604 by the transporter 601-1 or 601-2. It is transported from the transporter 601-1 or 601-2 to a stocking chamber 604-1 by means of a transporting mechanism 604-7 provided in the stocking chamber 604-1 (FIG. 33). The wafer #1 waits for a time interval until the time (To+3T) after the wafer #1 is transported to the stocking chamber 604-1 and it is made possible to be transported to a coating chamber 604-2 of the lithography apparatus 604 by means of a transporting mechanism 604-8.

FIG. 30 also shows the details of the processing and transporting applied to the wafer #2 for a time interval from the time To to (To+3T). The wafer #2 is loaded to the system by means of the loading/unloading apparatus 608 while being delayed by T (min), and which is subjected to the same processing and transporting operations as those for the wafer #1. It takes a time 2T, from (To−T) to (To+T), to transport the wafer #2 from the loading/unloading apparatus 608 to the metal film deposition apparatus 602. It takes a time T (min), from (To+T) to (To+2T), to process the wafer #2 in the metal film deposition apparatus 602.

FIG. 31 shows the details of the processing and transporting applied to the wafers #3 and #4 until a time interval 3T (=18) min from the time To. The wafer #3 is loaded from the loading/unloading apparatus 608 to the fabricating system while being retarded from the wafer #1 by 2T min, and receives the same processing and transporting steps as those applied to the wafer #1 with a delay of 2T min. The wafer #3 is transported from the loading/unloading apparatus 608 to the metal film deposition apparatus 602 for a time interval 2T min from the time To to (To+2T). It is processed in the metal film deposition apparatus 602 for a time interval T min from the time (To+2T) to (To+3T). The wafer #4 is loaded while being retarded from the wafer #1 by 3T min, and receives the same processing and transporting steps as those applied to the wafer #1 with a delay of 3T min. The wafer #4 is transported from the loading/unloading apparatus 608 to the metal film deposition apparatus 602 for a time interval 2T min from the time (To+T) to (To+3T).

Next, the processing for the wafer #1 in the lithography apparatus 604 will be fully described with reference to FIGS. 34 and 35. First, the wafer #1 is transported from a stocking chamber 604-1 to a coating chamber 604-2 by means of a transporting mechanism 604-8, and which is coated with a resist by a roller type resist coater. It takes 40 sec to coat the wafer #1 with the resist to a thickness of 1.2 μm. The transporting mechanism 604-8 and the like are all contained in a housing (not shown) filled with nitrogen, so that the wafer is not exposed to the atmospheric air in the processing apparatus 604. The wafer #1 is then transported to a baking chamber 604-3 by means of a transporting mechanism 604-9, and is subjected to heat treatment (120° C.×40 sec) to harden the resist. It is transported from the baking chamber 604-3 to an exposing chamber 604-4 by means of a transporting mechanism 604-10, to be subjected to exposure using the infrared ray of mercury as a light source. The function of the exposing chamber 604-4 is the same as that of the usual stepper. The exposure for the wafer #1 takes 2 min. The wafer #1 is then moved to a developing chamber 604-5 by means of a transporting mechanism 604-11, and is subjected to developing by exposing the surface to a developing agent. The developing for the wafer #1 takes 80 sec. It is then transported to a dry chamber 604-6 by means of a transporting mechanism 604-12. It takes 5.3 min, which is less than the time interval T (6 min) of the inventive system, until the wafer #1 is made possible to be transported to the transporter 601-1 or 601-2 by a transporting mechanism 604-13 provided in the dry chamber 604-6, after it is started to be moved from the stocking chamber 604-1 to the coating chamber 604-2. The wafer #1 waits until an elapse of 6 min, that is, it is transported after an elapse of 6 min.

The wafer #1 is unloaded to the transporter 601-1 or 601-2, and is transported to the metal film dry etching apparatus 606. It is moved to a stocking chamber 606-1 filled with nitrogen by means of a transporting mechanism 606-9 provided in the stocking chamber 606-1 (FIG. 36), and is further transported to a preparing chamber #1 606-2 by means of a transporting mechanism 606-10. It takes a time less than 12 min (2T) until the preparing chamber #1 606-2 is evacuated up to 0.65 Pa and the wafer #1 is made possible to be moved to a transporting chamber 606-3, after it is started to be transported. The wafer #1 waits until an elapse of 12 min, that is, it is started to be processed after an elapse of 12 min.

The processing for the wafer #1 in the metal film dry etching chamber 606 will be described with reference to FIGS. 36 and 37. The wafer #1 in the preparing chamber #1 606-2 is transported to the transporting chamber 606-3 by means of a transporting mechanism 606-11 provided in the transporting chamber 606-3, and which is further transported to an etching chamber 606-4. The pressure of the transporting chamber 606-3 is 0.01 Pa. In an etching chamber 606-4, a multi-layer film of an Al alloy film/TiN film is etched. It takes 40 sec to etch the multi-layer film using a mixed gas of chlorine and $BCl_3$. The pressure upon etching is 0.4 Pa. The etching chamber 106-4 is evacuated to 0.015 Pa, and the wafer #1 is transported to an anticorrosive treatment chamber 606-5 through the transporting chamber 606-3 by means of a transporting mechanism 606-11, to be subjected to anticorrosive treatment by $CHF_3$ for the Al alloy film. The pressure upon the anticorrosive treatment is 0.6 Pa, and the treatment takes 30 sec. The wafer #1 is then transported from the anti-corrosive treatment chamber 606-5 to an ashing chamber 606-6 through the transporting chamber 606-3 by means of the transporting mechanism 606-11. The resist is removed by ashing using oxygen plasma in the ashing chamber 606-6. The pressure upon the ashing is 50 Pa, and the ashing takes 30 sec. The wafer #1 is then transported to a preparing chamber #2 606-7 through the transporting chamber 606-3 by means of the transporting mechanism 606-11. The preparing chamber #2 606-7, after receiving the wafer #1, is filled with high purity nitrogen at the atmospheric pressure. After that, the wafer #1 is transported to an unloading chamber 606-8 filled with high purity nitrogen by means of a transporting mechanism 606-12, and waits for transporting. It takes 5 min until the wafer #1 is made possible to be transported after it is started to be processed. The wafer #1 waits for 1 min.

The wafer #1 is unloaded onto one of the transporters 601-1 or 601-2 by transporting mechanism 606-13 and moved from the metal film dry etching apparatus 606 to apparatus 603. The processing for the wafer #1 in the insulator film deposition apparatus 603 will be described with reference to FIGS. 32 and 33. The wafer #1 is placed in a film deposition chamber #1 603-4 of the insulator film deposition chamber 603 by transporting mechanism 603-8, and an $SiO_2$ film is deposited by plasma chemical vapor deposition (CVD) using TEOS and oxygen as a source gas. The $SiO_2$ film thus deposited is used as an interlayer insulator film for metallization. In a film deposition chamber #2 603-5, an $Si_3N_4$ film is deposited by plasma CVD using $Si_3H_4$ and $NH_3$ as a source gas. The $Si_3N_4$ film thus deposited is used as the uppermost passivation layer of the wafer. Now, the nitride film is formed on the wafer #1. In this insulator film deposition apparatus 603, only the film deposition is performed, and this processing does not take a lot of time; accordingly, the wafer #1 waits for processing in the stocking chamber 603-1, and is started to be processed.

First, the wafer #1 is moved from the stocking chamber 603-1 to a preparing chamber #1 603-2 by means of a transporting mechanism 603-9, thus starting the processing. It is transported from the preparing chamber #1 603-2 to a transporting chamber 603-3 by means of a transporting mechanism 603-10, and is further transported to a film deposition apparatus #2 603-5. In this chamber #2 603-5, an $Si_3N_4$ film is deposited on the wafer #1 to a thickness of 0.5 μm by the above-described plasma CVD. The pressure is 50 Pa, and the film deposition takes 1 min. The wafer #1 is then transported to a preparing chamber #2 603-6 through the transporting chamber 603-3 by means of a transporting mechanism 603-10. The preparing chamber #2 603-6 is filled with nitrogen at the atmospheric pressure, and then the wafer #1 is transported to an unloading chamber 603-7 filled with nitrogen by means of a transporting mechanism 603-11, and it waits for unloading to the transporter 601-1 or 601-2 (FIG. 27) by a transporting mechanism 603-12. It takes 4 min until the wafer #1 is made possible to be unloaded after it is started to be processed. Accordingly, the wafer #1 waits for 2 min. After the wafer #1 is moved from the film deposition chamber #2 603-5 to the transporting chamber 603-3, the film deposition chamber #2 603-5 is cleaned by $NF_3$ plasma, and is prepared for the next semiconductor wafer.

The wafer #1 is transported from the insulator film deposition apparatus 603 to the lithography apparatus 604 again, and is subjected to the same processing as that applied after the metal film deposition. The flow of the processes, and the processing time are the same, except for the processing condition such as the reticle upon exposure. The wafer #1 is transported from the lithography apparatus 604 to the insulator film dry etching apparatus 607.

The processing for the wafer #1 in the insulator film dry etching apparatus 607 will be described with reference to FIGS. 38 and 39. First, the wafer #1 is transported from the transporter 601-1 or 601-2 (FIG. 27) to a stocking chamber 607-1 filled with nitrogen by means of a transporting mechanism 607-8. It is then transported to a preparing chamber #1 607-2 by means of a transporting mechanism 607-9. The preparing chamber #1 607-2 is evacuated. The wafer #1 waits for the processing. The processing of the wafer #1 is started by the movement of the wafer #1 to a transporting chamber 607-3. The wafer #1 is transported from the preparing chamber #1 607-2 to the transporting chamber 607-3 by means of a transporting mechanism 607-10, and is further transported to an etching chamber 607-4. In the etching chamber 607-4, the dry etching for the $SiO_2$ film and the $Si_3N_4$ film can be performed; however, in this embodiment, the dry etching for the $Si_3N_4$ film is performed. The etching gas is $CHF_3$, and the pressure is 0.7 Pa. This dry etching takes 40 sec. The wafer #1 is then transported from the etching chamber 607-4 to an ashing chamber 607-5 through the transporting chamber 607-3 by means of the transporting mechanism 607-10. In the ashing chamber 607-5, the resist is removed by ashing using oxygen plasma. The pressure is 50 Pa, and the processing takes 30 sec. The wafer #1 is then transported to a preparing chamber #2 607-6 through the transporting chamber 607-3 by means of the transporting mechanism 607-10, and is further transported to an unloading chamber 607-7 filled with nitrogen by means of a transporting mechanism 607-11 and it waits for unloading by a transporting mechanism 607-12. It takes 4 min until the wafer #1 is made possible to be unloaded after it is started to be processed. The wafer #1 waits for 2 min.

Next, the wafer #1 is transported to the loading/unloading apparatus 608 by means of the transporter 601-1 or 601-2. The wafer #1 is moved in a stocking chamber 608-2 by means of a transporting mechanism 608-4 provided in the apparatus 608. Thus the wafer #1 is transported in a preparing chamber 608-1 filled with nitrogen together with the subsequent wafers #2 to #6. They wait for unloading from the fabricating system. The transporting from the stocking chamber 608-2 to the preparing chamber 108-1 takes 1 min.

The details of processing and transporting for the wafer #1 to #3 for each time interval T from the time To to (To+9T) are summarized in Tables 6 to 8.

TABLE 6

| Time | Wafer #1 | Wafer #2 | Wafer #3 |
|---|---|---|---|
| T0~T0 + T | Processing in A | Transporting to A | Transporting to A |
| T0 + T~T0 + 2T | Transporting from A to B | Processing in A | Transporting to A |
| T0 + 2T~T0 + 3T | Transporting from A to B | Transporting from A to B | Processing in A |
| T0 + 3T~T0 + 4T | Processing in B | Transporting from A to B | Transporting from A to B |
| T0 + 4T~T0 + 5T | Transporting from B to C | Processing in B | Transporting from A to B |
| T0 + 5T~T0 + 6T | Transporting from B to C | Transporting from B to C | Processing in B |
| T0 + 6T~T0 + 7T | Processing in C | Transporting from B to C | Transporting from B to C |
| T0 + 7T~T0 + 8T | Transporting from C to D | Processing in C | Transporting from B to C |
| T0 + 8T~T0 + 9T | Transporting from C to D | Transporting from C to D | Processing in C |
| T0 + 9T~T0 + 10T | Processing in D | Transporting from C to D | Transporting from C to D |
| T0 + 10T~T0 + 11T | Transporting from D to B | Processing in D | Transporting from C to D |
| T0 + 11T~T0 + 12T | Transporting from D to B | Transporting from D to B | Processing in D |
| T0 + 12T~T0 + 13T | Processing in B | Transporting from D to B | Transporting from D to B |

Apparatus A: Metal Films Deposition Apparatus
Apparatus B: Lithography Apparatus
Apparatus C: Metal Films Dry Etching Apparatus
Apparatus D: Insulating Films Deposition Apparatus
Apparatus E: Insulating Films Dry Etching Apparatus
T0 + T: T minutes after the time T0

TABLE 7

| Time | Apparatus A | Apparatus B | Apparatus C |
|---|---|---|---|
| T0~T0 + T | Processing Wafer #1 | | |
| T0 + T~T0 + 2T | Processing Wafer #2 | | |
| T0 + 2T~T0 + 3T | Processing Wafer #3 | Processing Wafer #1 | |
| T0 + 3T~T0 + 4T | Processing Wafer #4 | Processing Wafer #2 | |
| T0 + 4T~T0 + 5T | Processing Wafer #5 | Processing Wafer #3 | Processing Wafer #1 |
| T0 + 5T~T0 + 6T | Processing Wafer #6 | Processing Wafer #4 | Processing Wafer #2 |
| T0 + 6T~T0 + 7T | | Processing Wafer #5 | Processing Wafer #3 |
| T0 + 7T~T0 + 8T | | Processing Wafer #6 | Processing Wafer #4 |
| T0 + 8T~T0 + 9T | | Processing Wafer #1 | Processing Wafer #5 |
| T0 + 9T~T0 + 10T | | Processing Wafer #2 | Processing Wafer #6 |
| T0 + 10T~T0 + 11T | | Processing Wafer #3 | |
| T0 + 11T~T0 + 12T | | Processing Wafer #4 | |
| T0 + 12T~T0 + 13T | | Processing Wafer #5 | |

Apparatus A: Metal Films Deposition Apparatus
Apparatus B: Lithography Apparatus
Apparatus C: Metal Films Dry Etching Apparatus
Apparatus D: Insulating Films Deposition Apparatus
Apparatus E: Insulating Films Dry Etching Apparatus
T0 + T: T minutes after the time T0

TABLE 8

| Time | Transporter between Processing Apparatuses | | |
|---|---|---|---|
| | From A to B | From B to C | From C to D |
| T0~T0 + T | | | |
| T0 + T~T0 + 2T | Wafer #1 | | |
| T0 + 2T~T0 + 3T | Wafer #1, 2 | | |
| T0 + 3T~T0 + 4T | Wafer #2, 3 | | |
| T0 + 4T~T0 + 5T | Wafer #3, 4 | Wafer #1 | |
| T0 + 5T~T0 + 6T | Wafer #4, 5 | Wafer #1, 2 | |
| T0 + 6T~T0 + 7T | Wafer #5, 6 | Wafer #2, 3 | |
| T0 + 7T~T0 + 8T | Wafer #6 | Wafer #3, 4 | Wafer #1 |
| T0 + 8T~T0 + 9T | | Wafer #4, 5 | Wafer #1, 2 |
| T0 + 9T~T0 + 10T | | Wafer #5, 6 | Wafer #2, 3 |
| T0 + 10T~T0 + 11T | | Wafer #6 | Wafer #3, 4 |
| T0 + 11T~T0 + 12T | | | Wafer #4, 5 |
| T0 + 12T~T0 + 13T | | | Wafer #5, 6 |

Apparatus A: Metal Films Deposition Apparatus
Apparatus B: Lithography Apparatus
Apparatus C: Metal Films Dry Etching Apparatus
Apparatus D: Insulating Films Deposition Apparatus
Apparatus E: Insulating Films Dry Etching Apparatus
T0 + T: T minutes after the time T0

As shown in Table 6, semiconductor wafers are subjected to a pipelining processing, in which the continued process and the transporting between processing apparatuses are repeated with a period of 2T (min), that is, the period of time T (min) is equally allocated to the processing and transporting. In this embodiment, the time T is 6 min. The maximum value of each minimum time interval required to unload each semiconductor wafer already processed in each processing apparatus to the transporter is 5.7 min (at the metal film deposition apparatus). This maximum value (5.7 min) is added with a margin (0.3 min), thus determining the time T (6 min). In each processing apparatus of this embodiment, the trailing treatment cannot be applied by the restriction of the control of the transporting mechanism in the processing apparatus or the like. Namely, during one wafer is processed in a processing apparatus, the next wafer is not processed in the same processing apparatus. For example, even when the preceding wafer is transported to the anticorrosive treatment chamber after the completion of the metal film etching, the subsequent wafer cannot be started to be etched. Accordingly, if the trailing treatment can be applied, the time interval T can be shortened to be less than 6 min. In this embodiment, two transporters are provided; however, when the time interval T is short and the transporting speed is insufficient, the number of the transporters may be increased. When L pieces of transporters are provided, the time interval (L×T) min may be allocated for the transporting.

The processing for semiconductor wafers in three processing apparatuses (A to C) for each time interval T from the time To to (T0+13T) are summarized in Table 7. In the viewpoint of the processing apparatus, six pieces of semiconductor wafers are continuously processed except for the waiting time for transporting.

Table 8 summarizes semiconductor wafers transported by the single wafer transporter from an apparatus A to B, from B to C, and from C to D, for each T min from the time To to (T0+13T).

The wafers are allocated to two pieces of the transporters and the processing apparatuses, and thereby ⅔ of the wafers are present in the two transporters. Namely, when ⅔ of wafers are transported by the transporters, ⅓ of wafers are processed in the processing apparatuses. In the pipe line system in which the time interval T is allocated to the processing and the time interval (L×T) is allocated to the transporting, only 1/(L+1) of wafers present in each of L pieces of transporters. This has an effect not to complicate the transporter.

In this embodiment, it takes 152 min until six pieces of wafers are made possible to be unloaded after they are loaded to the fabricating system. Namely, it takes 122 min until the initial wafer #1 is made to be unloaded (20T (=120) min for six processing steps and seven transporting steps (each transporter)+2 min (1 min for each of loading and loading steps); and each of the wafers #2 to #6 is retarded by T min. Thus, the total time interval (152 min) is obtained by the addition of the time interval 5T (=30 min) to the time interval 122 min.

The above pipeline system will be compared with the lot processing (one lot: six wafers). The lot processing has the shortest term of works among the conventional methods. The processing time for one wafer in each processing apparatus is as follows: 5 min (metal film deposition apparatus); 4 min (insulator film deposition apparatus); 5.3 min (10.6 min (twice)) (lithography apparatus); 5 min (metal film dry etching apparatus); and 4 min (insulator film deposition apparatus). In the lot processing, six wafers are all processed in each processing apparatus, and are transported to the next processing apparatus. Accordingly, the total processing time is 6 times of the processing time for one wafer in all processing apparatuses, that is, 175.8 min. This is added with the transporting time and the loading/unloading time. The transporting time is 9 min, and each of the loading and unloading times is 1 min, that is, 63 (=9×7) min+2 min=65 min. Namely, it takes 240.8 min until six wafers are made possible to be unloaded after they are loaded in the fabricating system. Therefore, in this embodiment, the term of works is reduced to be about half of that of the lot processing.

In this embodiment, a unit composed of one wafer is processed and transported, and the short time can be effectively allocated to the processing compared with the conventional lot processing. Even when a unit composed of a set of wafers is processed and transported, it becomes possible to reduce the term of works using the pipe line system in which the time interval T min is allocated to the processing and the time interval (L×T) is allocated to the transporting.

By the reduction of the term of works and the provision of the inter-apparatus transporter capable of being transported in nitrogen, the inventive system eliminates the clean space with a high cleanliness, and improve the percent non-defective. The percent non-defective is increased from 88% to 93% compared with the old system.

As is apparent from Table 7, the allocation (scheduling) of wafers to each processing apparatus is highly optimized. The processing apparatus can process wafers with no dead time. The reason for this is that the time interval T min is allocated to the processing and the time interval 2T min is allocated to the transporting, thus achieving the good timing between the processing and transporting. As the number of wafers is increased, the above effect is enlarged.

Embodiment 7

This embodiment will be described with reference to FIGS. 40 and 41, and Table 9. In this embodiment, the present invention is applied to a fabricating system and a fabricating method for fabricating an Si memory LSI, wherein a sequence of processes for metallization of a CMOS LSI having a two layer metal film is applied to a wafer.

Figure 40:
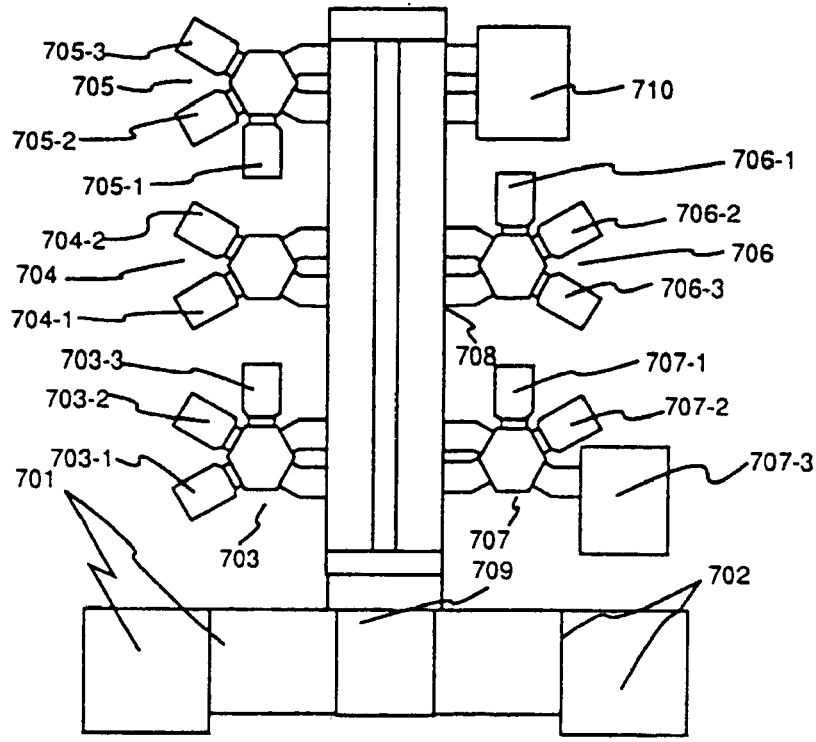
FIG. 40 is a plan view showing a further example of the fabricating system for semiconductor wafers according to the present invention.

FIG. 40 is a view showing the fabricating system of this embodiment. Processing apparatuses 701 and 702 are adapted to perform a sequence of lithography processes including resist coating, resist baking, exposure using an infrared ray of mercury as a lamp source, and resist developing. An interlayer insulator film dry etching apparatus 703 is a cluster tool capable of applying the dry-etching of silicon oxide or silicon nitride to a wafer. Each of the apparatuses 701 and 702 is provided with an ashing chamber 703-3 capable of applying a resist removing process to a wafer, other than two etching chambers 703-1 and 703-2. Either of the etching chambers 703-1 and 703-2 is capable of applying the dry etching silicon oxide or silicon nitride. A metal film dry etching apparatus 704 is a cluster tool capable of applying, to a wafer, the dry-etching of an alloy mainly containing aluminum, and a metal or metal compound such as tungsten or titanium nitride. The apparatus 704 is also provided with an ashing chamber 704-2 capable of applying a resist removing process to a wafer, other than an etching chamber 704-1. A wet cleaning apparatus 705 has two cleaning chambers 705-1 and 705-2 for perfectly removing the resist remaining after the resist removing process by ashing thereby perfectly removing the contamination, and also has a cleaning chamber 705-3 for performing wet etching by fluoric acid for removing an oxide film on the surface of silicon before the deposition of a metal film. A metal film deposition apparatus 706 is a cluster tool capable of applying, to a wafer, the film deposition of an alloy mainly containing aluminum, and a metal or metal compound such as tungsten or titanium nitride. In the deposition apparatus 706, the deposition is performed by sputtering or CVD. The deposition of titanium nitride by sputtering is performed in a processing chamber 706-1. The deposition of an alloy mainly containing aluminum by sputtering is performed in a processing chamber 706-2. A processing chamber 706-3 is used for the deposition of tungsten by CVD. An insulator film deposition apparatus 707 is a cluster tool capable of applying the deposition of silicon oxide or silicon nitride to a wafer. The apparatus 707 is provided with a processing chambers 707-3 for performing a plurality of processes including coating and baking of SOG (Spin On Glass), other than two processing apparatuses 707-1 and 707-2 for performing the film deposition by CVD. In the film deposition by CVD, silicon oxide is formed by plasma CVD using TEOS in the processing chamber 707-1; while silicon nitride is formed by plasma CVD using monosilane and ammonia in the processing chamber 707-2. The construction of the above processing apparatuses and the flow of processes are the same as those in Embodiment 1.

In the fabricating system of this embodiment, a lot is constituted of 24 wafers, and each lot of wafers are transported between processing apparatuses. A transporter 708 is looped, and a wafer is transported in the atmospheric air with a high cleanliness. The transporter 708 is connected to each processing apparatus by means of an interface including a common load lock chamber similar to the above-described embodiments. This embodiment is different from the other embodiments in that the interface in this embodiment has a function of handling a lot of wafers. Each lot of wafers are unloaded or loaded to or from each processing apparatus by a transporting mechanism provided in each interface. A special interface 709 is disposed between the lithography apparatuses 701 and 702 and the transporter 708 for allocating wafers into the two apparatuses 701 and 702. A stocking apparatus 710 is provided in the fabricating system shown in FIG. 40 for usually stocking wafers completed in processes before metalization in a specified amount or more, and which is prepared to load the wafers for metallization.

Table 9 shows a sequence of processes for metallization of a CMOS LSI having a two layer metal film fabricated using the inventive system; and processing apparatuses or processing chambers used for the fabrication.

TABLE 9

| Step # | Process | Batch Processing Time for 24 Wafers (min.) | Processing Apparatus or Processing Chamber (See FIG. 40) |
|---|---|---|---|
| 1 | Contact Hole Lithography | 72 | 701 or 702 |
| 2 | Contact Hole Dry Etching | 72 | 703-1 or 703-2 |
| 3 | Ashing | 40 | 703-3 or 704-2 |
| 4 | Cleaning | 60 | 705-2 or 705-3 |
| 5 | SiO$_2$ Cleaning | 30 | 705-1 |
| 6 | TiN Film Sputtering | 72 | 706-1 |
| 7 | W Film CVD | 72 | 706-3 |
| 8 | 1st Metal Lithography | 72 | 701 or 702 |
| 9 | 1st Metal Dry Etching | 72 | 704-1 |
| 10 | Ashing | 40 | 703-3 or 704-2 |
| 11 | Cleaning | 60 | 705-2 or 705-3 |
| 12 | Insulator Film Deposition | 72 | 707-2 |
| 13 | SOG Coating, Baking | 72 | 707-3 |
| 14 | Insulator Film Deposition | 72 | 707-2 |
| 15 | Via Hole Lithography | 72 | 701 or 702 |
| 16 | Via Hole Dry Etching | 72 | 703-1 or 703-2 |
| 17 | Ashing | 40 | 703-3 or 704-2 |
| 18 | Cleaning | 60 | 705-2 or 705-3 |
| 19 | SiO$_2$ Cleaning | 30 | 705-1 |
| 20 | W Film CVD | 72 | 706-3 |
| 21 | Al Film Sputtering | 72 | 706-2 |
| 22 | 2nd Metal Lithography | 72 | 701 or 702 |
| 23 | 2nd Metal Dry Etching | 72 | 704-1 |
| 24 | Ashing | 40 | 703-3 or 704-2 |
| 25 | Cleaning | 60 | 705-2 or 705-3 |
| 26 | Insulator Film Deposition | 72 | 707-2 |
| 27 | Silicon Nitride Deposition | 72 | 707-1 |
| 28 | Passivation Layer Lithography | 72 | 701 or 702 |
| 29 | Passivation Layer Dry Etching | 72 | 703-1 or 703-2 |
| 30 | Ashing | 40 | 703-3 or 704-2 |
| 31 | Cleaning | 60 | 705-2 or 705-3 |

Table 9 shows the processing time for each lot (24 wafers) in each processing apparatus of the inventive system. The longest processing time is 72 min. The processing time T min in this embodiment is set at 80 min by the addition a margin to the longest processing time (72 min). This time interval 80 min is also allocated to the transporting.

Figure 41:
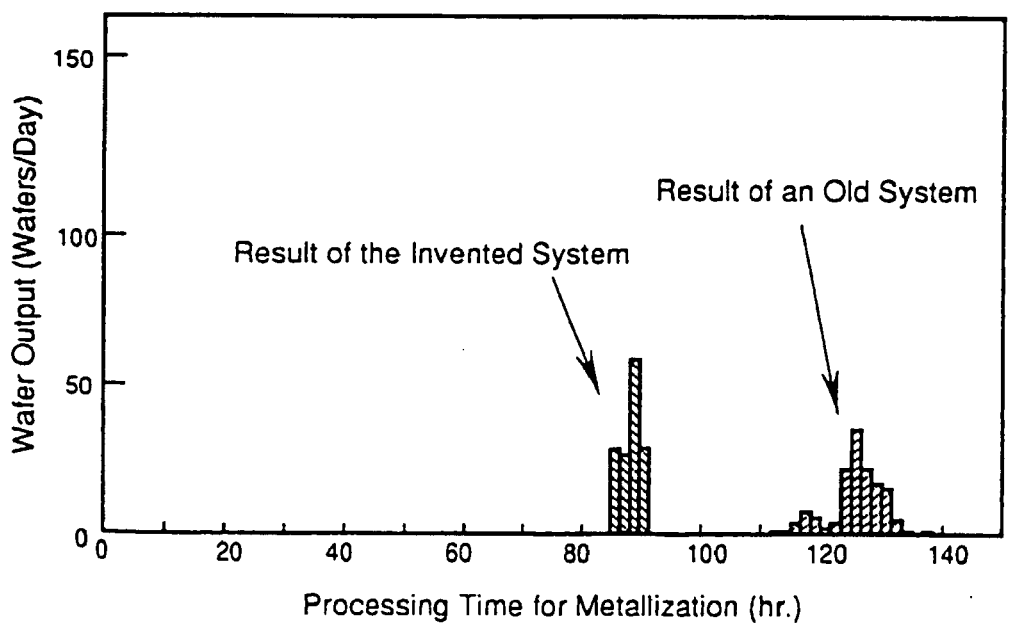
FIG. 41 is a graph showing the relationship between a processing time and a wafer output in metallization processes using the inventive system and old system.

FIG. 41 is the result of the scheduling of wafer output and term of works in the inventive system, which is performed prior to the processing. In this figure, the result in the old system without the pipe line processing and transporting is also shown. In both the inventive and old systems, the wafer output is 144 wafers/day. In this embodiment, the scheduling of processing and transporting is first determined, and the processing is performed on the basis of the scheduling. When a plurality of wafers are processed in a group of processing apparatuses, the scheduling is basically performed by the steps of:

applying the m-th process to the n-th wafer (m, n; positive integer) for a time interval from $(n+2 \times m-3) \times T$ min to $(n+2 \times m-2) \times T$ min on the basis of a certain time;

performing the transporting from the processing apparatus in which the m-th process is applied to a processing apparatus in which the (m+1)-th process is applied for a time interval from $(n+2 \times m-2) \times T$ min to $(n+2 \times m-1) \times T$ min; and applying the (m+1)-th process to the n-th wafer for a time interval from $(n+2 \times m-1) \times T$ min to $(n+2 \times m) \times T$ min.

The trailing treatment is not contained in the above scheduling. When a plurality of wafers are required to be simultaneously processed in either of processing apparatuses, the wafer to which the first process is early applied is preceded. The priority of the processing order of wafers is not performed except for the above case.

According to the method using the inventive system, the term of works is significantly shortened compared with the method using the old system. In the method using the old system, the average value of terms of works is long, and the distribution thereof is extended.

The result of actually applying continued processes to a plurality of sets of semiconductor wafers using the inventive system corresponds to the result of the scheduling shown in FIG. 41. In this embodiment, the percent non-defective is also improved. The percent non-defective of a sequence of processes for metallization of a CMOS LSI having a two layer metal film with a minimum design dimension of 0.3 µm is improved from 86% to 91%.

Embodiment 8

This will be described with reference to FIGS. 21, 42, 43 and 47, and Tables 10 and 13. In this embodiment, the present invention is applied to a fabricating system and fabricating method for fabricating an Si memory LSI, wherein a sequence of processes for metallization of a CMOS LSI having a two layer metal film are applied to a silicon wafer.

Figure 42:
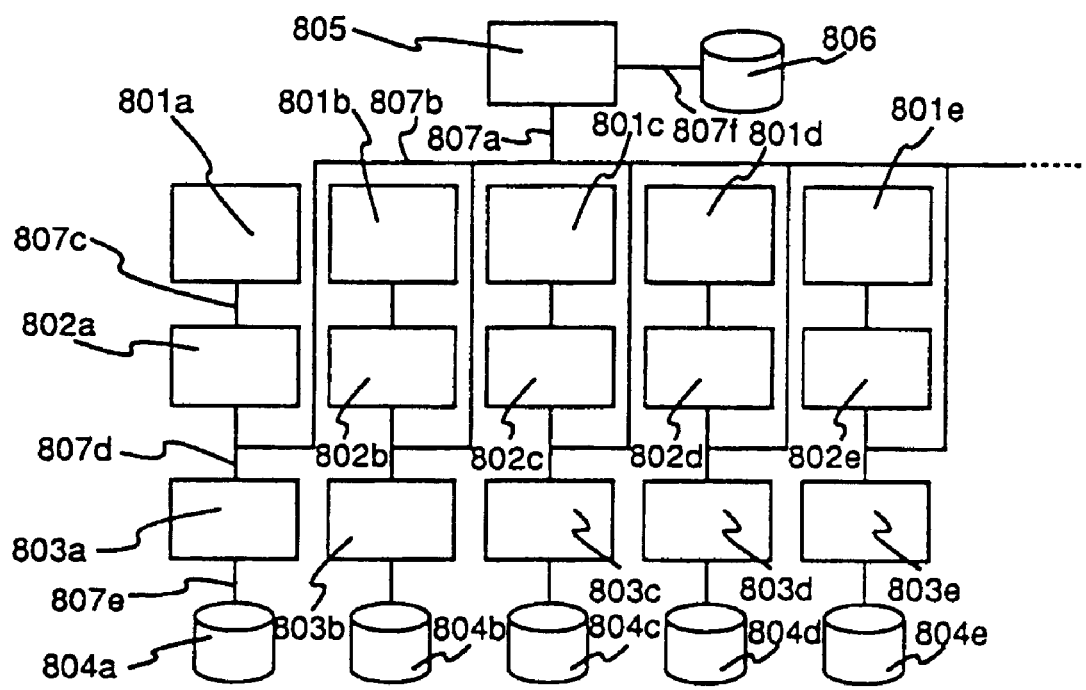
FIG. 42 is a view showing the construction of a fabricating system of the present invention.

FIG. 42 is a view for explaining the construction of the fabricating system of this embodiment. There are distributed two computers 802a and 802b for controlling two lithography apparatuses 801a and 801b, a computer 802c for controlling an interlayer insulator film dry etching apparatus 801c, a computer 802d for controlling a metal film dry etching apparatus 801d, and a computer 802e for controlling a wet cleaning apparatus 801e. Moreover, there are distributed computers for controlling a metal film deposition apparatus, an insulator film deposition apparatus, stocking apparatus and an inter-apparatus transporter. The processing apparatus 801a is connected to the computer 802a by means of a communication line 807c for transmitting and receiving the control data to and from the computer 802a. The same is true for the other processing apparatuses and computers. Computers 803a to 803e for managing a plurality of data bases are connected to the control computers 802a to 802e by means of a communication line 807d and the like. The computers 803a to 803e are connected to memories 804a to 804e containing data bases by means of a communication line 807e and the like. The control computers 802a to 802e are connected to a computer 805 for managing the general managing data base of the whole system by means of communication lines 807a and 807b. The computer 805 is connected to a memory 806 containing the general managing data base by means of a communication line 807.

FIG. 21 shows processing apparatuses and transporters of the inventive system, the constructions of which are similar to those shown in Embodiment 3. In the inventive system, each processing apparatus is of a single wafer processing type. In a looped inter-apparatus transporter 308, the drive force is transmitted by a belt. Wafers are transported in high purity nitrogen with the atmospheric pressure in a manner not to be contained in a case but to be placed on a holder. The inter-apparatus transporter 308 is connected to each processing apparatus by means of an interface including a common load lock. When wafers or the holder mounting wafers reach the position of the interface of each processing apparatus, the transporter 308 is temporarily stopped for loading and unloading wafers to and from the processing apparatus. The transporter 308 takes 4.5 min for one round. Namely, the transporter 308 is adapted to transport wafers while being repeatedly moved and stopped. Preferably, the interfaces are connected to the transporter 308 with specified intervals to easily control the above action of the transporter 308. In this embodiment, the circumference of the transporter 308 is divided into 50 positions, and each interface is disposed at either of these divided positions. The transporter 308 is repeatedly moved and stopped by 50 times for one round. One cycle takes 5.4 sec (=4.5 min/50). The moving time is 1.9 sec and the stopping time is 3.5 sec. For this cycle time (3.5 sec), wafers are loaded or unloaded between the transporter 308 and each processing apparatus. A special interface 309 is provided between a plurality of lithography apparatuses 301 and 302 and the transporter 308 for allocating wafers into the two apparatuses 301 and 302. In a stocking apparatus 310, wafers completed in processes before metallization are stocked in a specified amount or more, and which are prepared to be unloaded to the processing apparatus for metallization.

Table 10 shows a sequence of processes for metalization of a CMOS LSI having a two layer metal film fabricated using the inventive system; processing apparatuses or processing chambers used for the fabrication.

TABLE 10

| Step # | Process | Processing Time for 1 Wafer (min.) | Processing Apparatus or Processing Chamber (See FIG. 21) |
|---|---|---|---|
| 1 | Contact Hole Lithography | 5 × 5 | 301 or 302 |
| 2 | Contact Hole Dry Etching | 5 | 303-1 or 303-2 |
| 3 | Ashing | 5 | 303-3 or 304-2 |
| 4 | Cleaning | 3 | 305-2 or 305-3 |
| 5 | $SiO_2$ Cleaning | 3 | 305-1 |
| 6 | TiN Film Sputtering | 3 | 306-1 |
| 7 | W Film CVD | 5 | 306-3 |
| 8 | 1st Metal Lithography | 5 × 5 | 301 or 302 |
| 9 | 1st Metal Dry Etching | 5 | 304-1 |
| 10 | Ashing | 5 | 303-3 or 304-2 |
| 11 | Cleaning | 5 | 305-2 or 305-3 |
| 12 | Insulator Film Deposition | 5 | 307-2 |
| 13 | SOG Coating, Baking | 5 | 307-3 |
| 14 | Insulator Film Deposition | 5 | 307-2 |
| 15 | Via Hole Lithography | 5 × 5 | 301 or 302 |
| 16 | Via Hole Dry Etching | 5 | 303-1 or 303-2 |
| 17 | Ashing | 5 | 303-3 or 304-2 |
| 18 | Cleaning | 5 | 305-2 or 305-3 |
| 19 | $SiO_2$ Cleaning | 5 | 305-1 |
| 20 | W Film CVD | 5 | 306-3 |
| 21 | Al Film Sputtering | 5 | 306-2 |
| 22 | 2nd Metal Lithography | 5 × 5 | 301 or 302 |
| 23 | 2nd Metal Dry Etching | 5 | 304-1 |
| 24 | Ashing | 5 | 303-3 or 304-2 |
| 25 | Cleaning | 5 | 305-2 or 305-3 |
| 26 | Insulator Film Deposition | 5 | 307-2 |
| 27 | Silicon Nitride Deposition | 5 | 307-1 |
| 28 | Passivation Layer Lithography | 5 | 301 or 302 |
| 29 | Passivation Layer Dry Etching | 5 | 303-1 or 303-2 |
| 30 | Ashing | 5 | 303-3 or 304-2 |
| 31 | Cleaning | 5 | 305-2 or 305-3 |

In Table 10, a processing time for each wafer in each processing apparatus of the inventive system is also shown. In the inventive system, most of the processing times are 5 min. This is because most of the processing times are set to correspond to the longest processing time (5 min). In this embodiment, the trailing treatment can be applied only to the two sets of lithography apparatuses 301 and 302 (FIG. 21). By use of the trailing treatment, after a first wafer is processed in a resist coating apparatus contained in the processing apparatus and transported to a resist baking apparatus, a second wafer can be processed in the emptied resist coating apparatus. In the lithography apparatus 301 or 302, the trailing treatment with the cycle time 5 min can be used in each of the five lithography processes including resist coating, resist baking, exposure, developing and baking, so that a new wafer can be loaded for each 5 min, though the processing for each wafer takes 15 min. Additionally, in this trailing treatment, the transporting time within the apparatus 301 or 302 is contained in the processing time.

The first fabricating method by the inventive system will be described. FIG. 43 shows the details of a data base of the lithography apparatus 301 which is contained in the memory 804a, as an example of data bases contained in the memories 804a to 804e (FIG. 42). The contents 808a to 808e regarding information on result of processing and transporting are for each semiconductor wafer contained in the processing apparatus 301 at a certain time. FIG. 43 shows the information content 808c displayed by the computer 803 for managing the data base. In the information content 808c, the wafer number is 00002; the kind is ABCD; and the fabrication date is May 5, 1994. The data base in this embodiment contains information on result of processing and transporting including the condition of each process and the results of the processing and detection, other than managing information of process progress. As for the processing already completed, the data base has the information complied with each processing condition predetermined according to each processing. When the parameter of the processing is monitored during the processing, the data base has the information on the result of the monitoring or that reflected by the result. When the detection is performed after processing, the data base has the information on the result of the detection or that reflected by the result. For example, when the film thickness is measured, the data base contains the information on the thickness, and the information can be used to feedforward-control the subsequent etching process. Now, the wafer is in the first metal film lithography process, and it is subjected to exposure under the condition determined to be applied to the first metal film of the wafer of the kind ABCD. As described above, the data base in this embodiment collectively manages the information on a single wafer for each wafer contained in each processing apparatus. Tables 11 and 12 shows part of the content of the data base collecting the results of the scheduling of processing for wafers performed prior to the processing according to the inventive system.

TABLE 11

| Time | Apparatus 301 | Apparatus 304 | Apparatus 306 |
|---|---|---|---|
| 10:00~10:05 | | | Processing Wafer #1, 2 |
| 10:05~10:10 | | | Processing Wafer #2, 3 |
| 10:10~10:15 | Processing Wafer #1 | | Processing Wafer #3, 4 |
| 10:15~10:20 | Processing Wafer #1, 2 | | Processing Wafer #4, 5 |
| 10:20~10:25 | Processing Wafer #1, 2, 3 | | |
| 10:25~10:30 | Processing Wafer #1, 2, 3 | | |
| 10:30~10:35 | Processing Wafer #1, 2, 3 | | |
| 10:35~10:40 | Processing Wafer #2, 3, 4 | | |
| 10:40~10:45 | Processing Wafer #3, 4, 5 | Processing Wafer #1 | |

TABLE 12

| | Transporter between Processing Apparatuses | | |
|---|---|---|---|
| Time | From 301 to 304 | From 305 to 306 | From 306 to 301 |
| 10:00~10:05 | | Wafer #3 | Wafer #1 |
| 10:05~10:10 | | | Wafer #2 |
| 10:10~10:15 | | | Wafer #3 |
| 10:15~10:20 | | | |
| 10:20~10:25 | | | |
| 10:25~10:30 | | | |
| 10:30~10:35 | | | |
| 10:35~10:40 | Wafer #1 | | |
| 10:40~10:45 | Wafer #2 | | |

Table 11 shows part of the results of the scheduling for the processing in the processing apparatus 301 (FIG. 21). The results on the wafers #1 to #5 are extracted. Table 12 shows part of the results of the scheduling for transporting in the inter-apparatus transporter 308. Similarly, the results on the wafers #1 to #5 are extracted. The wafer output in the inventive system is 144 wafers/day. In the inventive system, the scheduling of processing and transporting is first determined and the processing is performed on the basis of the scheduling. The scheduling is basically performed by the pipeline system in which the processing is combined with the transporting. In the inventive system, a plurality of wafers are processed by the steps of:

applying the m-th process to the n-th wafer (m, n: positive integer) for a time interval from $(n+2\times m-3)\times 5$ min to $(n+2\times m-2)\times 5$ min based on a certain time To;

performing the transporting from the processing apparatus in which the m-th process is performed to a processing apparatus in which the (m+1)-th process is performed by an inter-apparatus for a time interval from $(n+2\times m-2)\times 5$ min to $(n+2\times m-1)\times 5$ min; and applying the (m+1)-th process to the n-th wafer for a time interval from $(n+2\times m-1)\times 5$ min to $(n+2\times m)\times 5$ min. The trailing treatment is not contained in the above scheduling. When a plurality of wafers are required to be simultaneously processed in either of processing apparatuses, the wafer to which the first process is early applied is preceded, and the remaining wafers are temporarily contained in the stocking apparatus 310 (FIG. 21).

The memory 804a, which is distributed in the processing apparatus 801a (FIG. 42) and contains the data base having information on result of processing and transporting of the wafer contained in the apparatus 801a, has scheduling information of processing and transporting which collects the data on wafers to be processed in the apparatus 801a at a certain time, as shown in Table 11. In the first fabricating method, the computer 805 for managing the general managing data base automatically performs the scheduling for one hour on the basis of the general managing data base regarding the information on result of processing and transporting contained in the memory 806, so that the scheduling information of processing and transporting reflected by the result is transmitted to the memory 804a by way of the communication line 807a at least prior to the next scheduling. As for the other processing apparatus 801b and the like, the scheduling information of processing and transporting corresponding to each processing apparatus shown in Table 11 is previously transmitted to the memory 804b and the like. Table 12 shows one example of the scheduling information of processing and transporting contained in the memory distributed in the inter-apparatus transporter.

The second fabricating method using the inventive system will be described. FIG. 44 shows the details of a data base for the lithography apparatus 301, which is contained in the memory 804a, as one example of data bases contained in the memories 804a to 804e (FIG. 42). The data base of the second fabricating method contains the information on result and scheduling of processing and transporting including the scheduled apparatus and the scheduled starting time reflected by the result of the scheduling. The contents 809a to 809e of the information on result and scheduling of processing and transporting are for each wafer contained in the processing apparatus 301 at a certain time. FIG. 43 shows at the lower side the information content 809c displayed by the computer 803. In the information content 809c, the wafer number is 00002; the kind thereof is ABCD; and the fabrication data is 1994. 5.5. According to the scheduled starting time of processing, most processes have no waiting time, except for the second metal film etching of the 23-th process (20 min), and the passivation layer lithography of the 28-th process (10 min). In this waiting time, wafers are contained in the stocking apparatus 310 (FIG. 21). As for the process already processed, when the detection is performed after the process, the data base contains the information on the result of the detection or that reflected by the result. In this embodiment, the thicknesses of the sputter TiN film and the CVD-W film of the first metal film are measured in the sixth and seventh processes, and the information thereof is used to feedforward-control the first metal film etching in the ninth process. Namely, the etching is performed while the etching time is adjusted according to the actual film thickness. Now, the wafer is in the first metal film lithography of the fifteenth process, and it is subjected to developing under the condition predetermined to be applied to the first metal film of the wafer of the kind ABCD. As described above, the data base of this embodiment collectively manages the information on a single wafer for each wafer contained in each processing apparatus.

Figure 45:
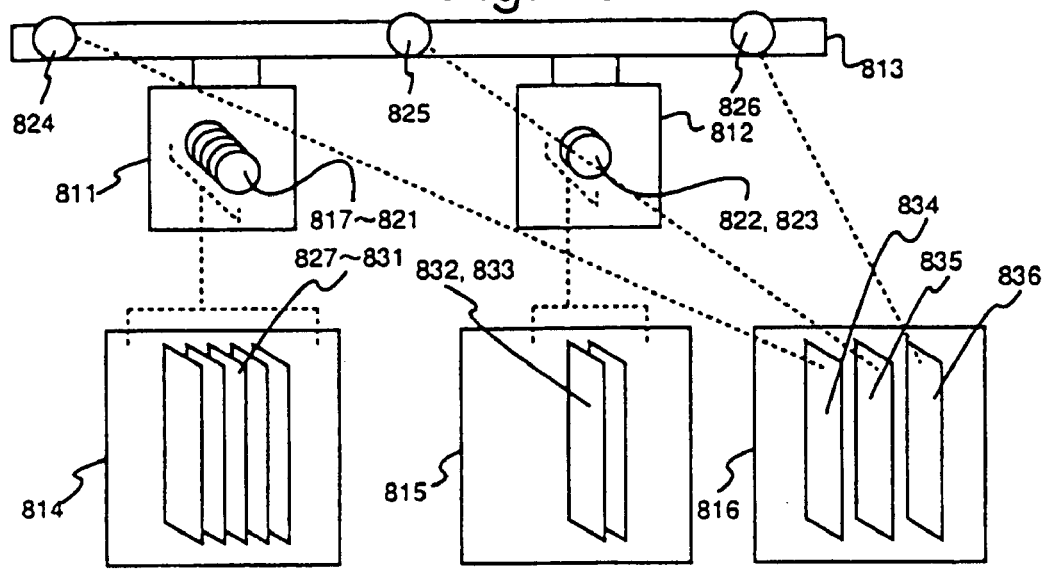
FIGS. 45 and 46 are views for explaining the relationship between the inventive system and the data base.

FIG. 45 is a view for explaining the management of information in this embodiment, and which shows part of the inventive system at a certain time. Wafers #817 and #821 are contained in a processing apparatus 811, and wafers #822 and #823 are contained in a processing apparatus 812. The wafers are processed in the processing apparatus 811 and then processed in the processing apparatus 812. Wafers #824 and #825 are in the transporting stage by an inter-apparatus transporter 813. Data bases 827 to 831 regarding the information on result of processing and transporting corresponding to the wafers #817 to #821 are contained in a memory 814 distributed in the processing apparatus 811. Data bases 832 to 833 regarding the information on result of processing and transporting corresponding to the wafers 822 to 823 are contained in a memory 815 distributed in the processing apparatus 812. Data bases 834 to 835 regarding the information on result of processing and transporting corresponding to the wafers 824 to 826 are contained in a memory 816 distributed in the processing apparatus 813.

Figure 46:
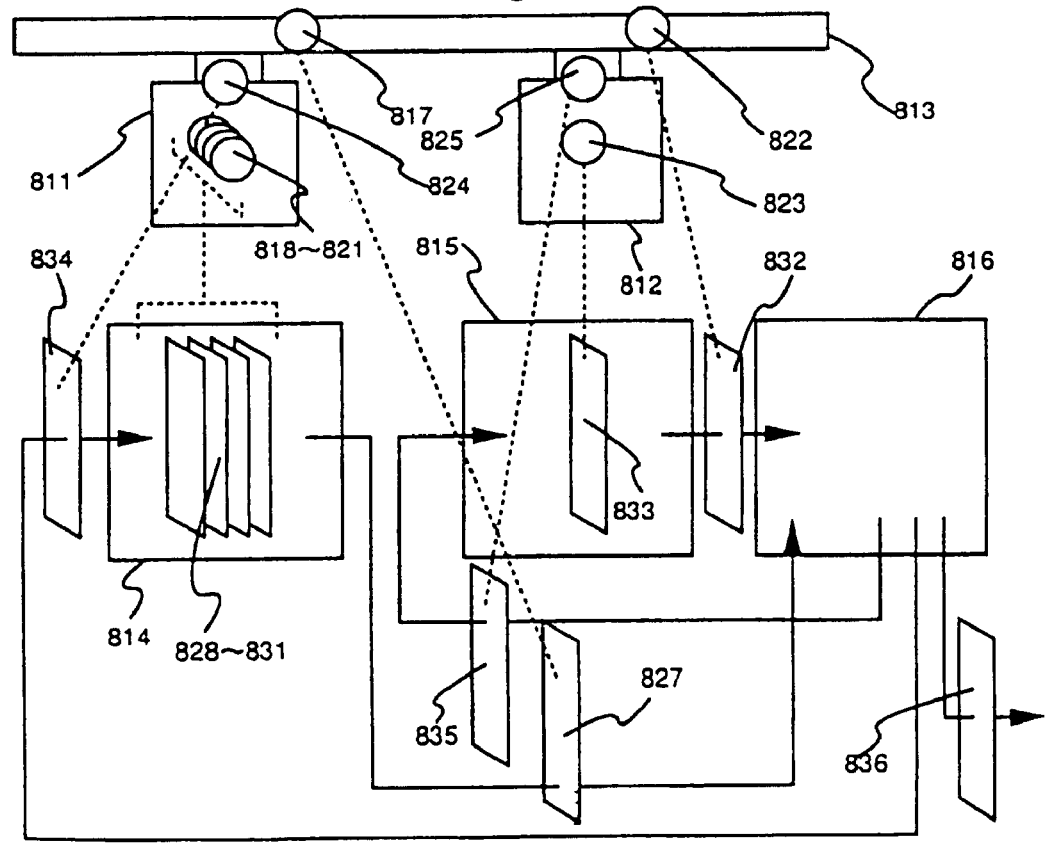

FIG. 46 shows the states that the wafers already processed and transported are moved between the processing apparatuses 811 and 812, and the transporter 813. The wafer #824 is introduced from the transporter 813 to the processing apparatus 811. The wafer #817 is processed in the processing apparatus 811 and is transported by the transporter 813. The wafer #825 is introduced from the transporter 813 to the processing apparatus 812. The wafer #822 is processed in the processing apparatus 812 and transported by the transporter 813. The wafer #826 is introduced from the transporter 813 to the processing apparatus. FIG. 46 is also shows the state that the data bases of the wafers already processed and transported are moved between the memories 814 and 816 after an elapse of a specified time since a certain time. The data base 834 of the wafer #824 is transmitted from the memory 816 to the memory 814. The data base 827 of the wafer #817 is transmitted form the memory 814 to the memory 816. The data base 835 of the wafer #825 is transmitted from the memory 816 to the memory 815. The data base 832 of the wafer #822 is transmitted from the memory 815 to the memory 816. The data base 836 of the wafer 826 is transmitted from the memory 816 to a memory distributed in the next processing apparatus.

The above transmission of the data bases is controlled by the computers 803a to 803e, and 802a to 802a distributed in the processing apparatuses and the transporter 801a to 801e by way of communication lines 807a to 807e. The transmitting procedure will be described. After the completion of the processing and the transporting for wafers, the computers distributed in the processing apparatuses and the transporter up-load the data on the completion of the processing and transporting to the computer 805 for renewing the data bases. In the first fabricating method, the information for determining the apparatus in which the next processing and transporting are performed is further down-loaded from the computer 805 for determining the memory to which the data base on the completion of processing and transporting is to be transmitted.

Table 13 shows part of the content of the data base regarding the scheduling information of processing and transporting collected for each wafer, which is prepared on the basis of the result of the scheduling of wafers prior to the processing according to the inventive system.

TABLE 13

| Time | Wafer #1 | Wafer #2 | Wafer #3 |
| --- | --- | --- | --- |
| 10:00~10:05 | Processing in 306 | Processin in 306 | Transporting from 305 to 306 |
| 10:05~10:10 | Transporting from 306 to 301 | Processing in 306 | Processing in 306 |
| 10:10~10:15 | Processing in 301 | Transporting from 306 to 301 | Processing in 306 |
| 10:15~10:20 | Processing in 301 | Processing in 301 | Transporting from 306 to 301 |
| 10:20~10:25 | Processing in 301 | Processing in 301 | Processing in 301 |
| 10:25~10:30 | Processing in 301 | Processing in 301 | Processing in 301 |
| 10:30~10:35 | Processing in 301 | Processing in 301 | Processing in 301 |
| 10:35~10:40 | Transporting from 301 to 304 | Processing in 301 | Processing in 301 |
| 10:40~10:45 | Processing in 304 | Transporting from 301 to 304 | Processing in 301 |

According to the first fabricating method, the data base is managed by the computer 806 for managing the data base as part of the general managing data base, so that each computer distributed in each of the processing apparatuses and the transporter down-loads the data for determining the memory to which the data base is to be transmitted from the computer 806.

According to the second fabricating method, as shown partially in FIG. 44, since the data base contains the scheduling information of processing and transporting, each computer distributed in each of the processing apparatuses and the transporter can know the memory to which the data base of the wafer already processed and transported is to be transmitted, differently from the first fabricating method; accordingly, the step of down-loading the data from the general managing data base for determining the memory to which the data is transmitted can be omitted. In the fabricating system applicable for the first fabricating method, the first and second fabricating methods are freely selected according to the maintenance. In this case, it is desirable to display the state of the fabricating system.

In either of the first and second fabricating methods, the computer for managing the general managing data base manages the process progress of the whole fabricating system. Thus, unless there occurs an accidental failure, it becomes possible to perform the fabrication according to the scheduling information of processing and transporting pre-determined by the scheduling. When the computer for managing the general managing information fails, the fabrication can be continued by the management of the distributed computers. These are selectively used according to the maintenance. In this case, it is also desirable to display the state of the fabricating system.

Figure 47:
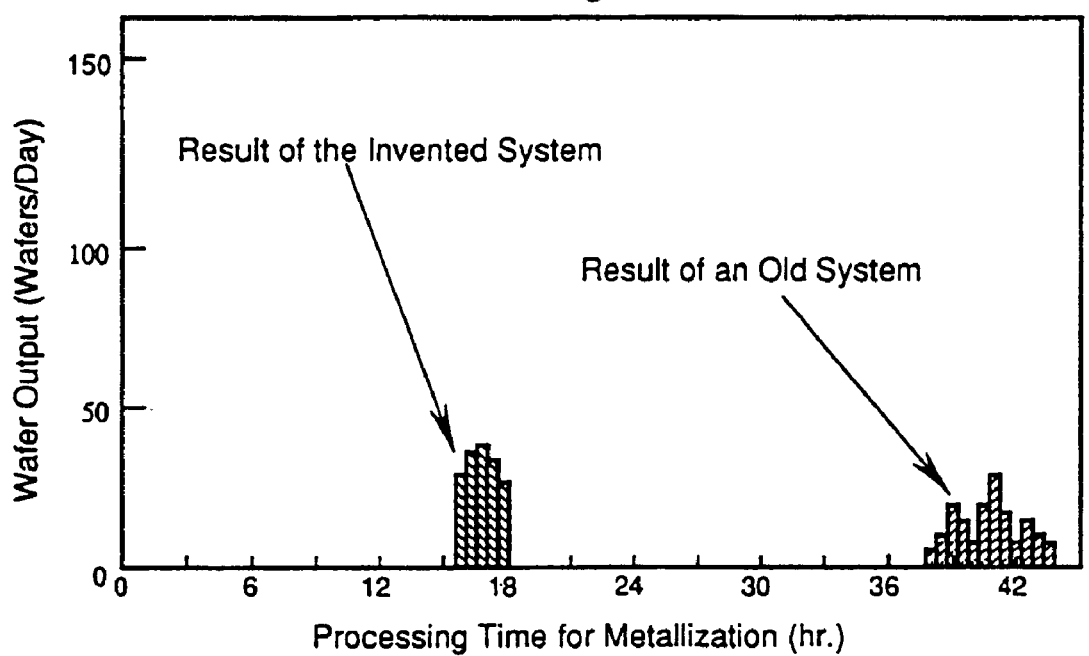
FIG. 47 is a graph showing the relationship between a processing time and a wafer output in metallization processes using the inventive system and old system.

In this embodiment, the term of works is exceedingly improved compared with the old system, as shown in FIG. 47. In the old system using the lot processing, the average value of the terms of works is long, and the distribution thereof of extended. According to the fabricating method using the inventive system, all of the wafers are processed with little dead time, to improve the working efficiency of each processing apparatus, thus increasing the wafer output for each unit time.

Embodiment 9

This will be described with reference to FIGS. 24, 48 and 49. In this embodiment, the present invention is applied to a fabricating system and a fabricating method for fabricating an Si logic LSI having a two layer metal film.

FIG. 24 is a view showing the fabricating system in this embodiment. The construction of the fabricating system is the same as that of Embodiment 5. A sequence of wafer processes by the inventive system are the same as those in Embodiment 5.

Figure 48:
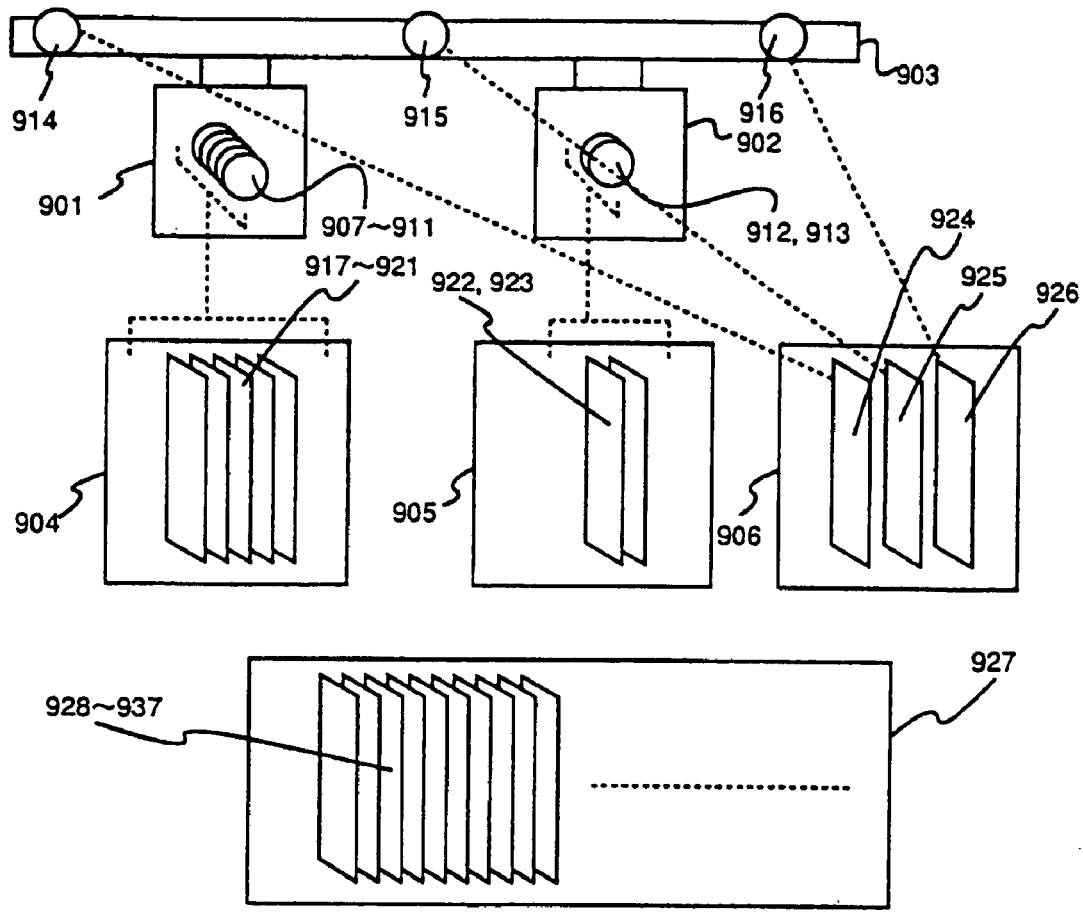
FIG. 48 is a view for explaining the relationship between the inventive system and the data base.
Figure 49:
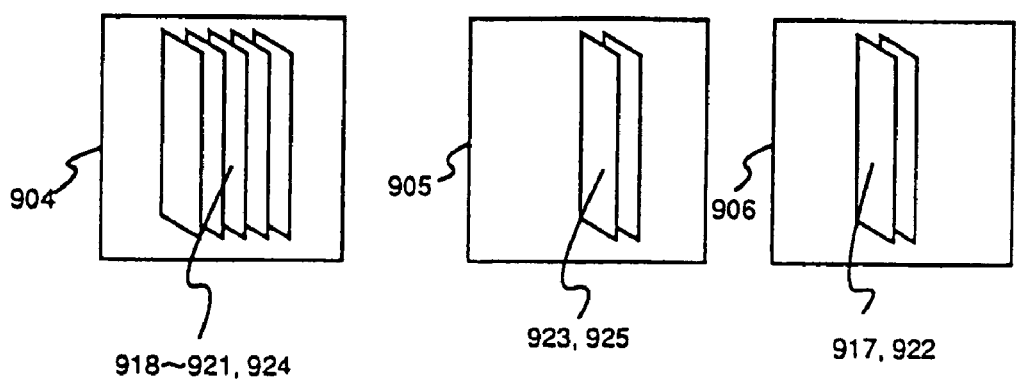
FIG. 49 is a view for explaining the shifting of wafer information in a memory.

FIGS. 48 and 49 are views for explaining the management of information in this embodiment. FIG. 48 shows part of the inventive system at a certain time. Wafers #907 to #911 are contained in a processing apparatus 901, and wafers #912 and #913 are contained in a processing apparatus 902. The wafers are processed in the processing apparatus 901 and then processed in the processing apparatus 902. Wafers #914 to #916 are in the transporting stage by an inter-apparatus transporter 903. Data bases 917 to 921 of information on result of processing and transporting corresponding to the wafers #907 to #911 are contained in a memory 904 distributed in the processing apparatus 901. Data bases 922 to 923 of information on result of processing and transporting corresponding to the wafers #912 to #913 are contained in a memory 905 distributed in the processing apparatus 902. Data bases 924 to 926 of information on result of processing and transporting corresponding to the wafers #914 to #916 are contained in a memory 906 distributed in the processing apparatus 903. The data base on all of the wafers in the fabricating system is contained in a general managing data base 927. Data bases 928 to 937 have the same contents as those of the data bases 917 to 926 contained in the memories 904 to 906, respectively.

FIG. 49 shows the states of the memories 904 to 906 after wafers already processed and transported are moved between the processing apparatuses 901 and 902, and the inter-apparatus transporter 903. The wafer #914 is transported to the processing apparatus 901 from the transporter 903. The wafer #907 is processed in the processing apparatus 901 and is then transported by the transporter 903. The wafer #915 is transported from the transporter 903 to the processing apparatus 902. The wafer #912 is processed in the processing apparatus 902 and is then transported by the transporter 903. The wafer #916 is transported from the transporter 903 to a processing apparatus. Differently from Embodiment 8, in this method using the inventive system, the data base is not directly transmitted between memories distributed in the processing apparatuses and the transporter. The content of each memory is managed by a computer for managing the general managing data. The distribution of the computers in this embodiment are the same as in Embodiment 8 shown in FIG. 42. When the processing and transporting of a wafer is completed, the computers distributed in the processing apparatuses and the inter-apparatus transporter up-load a data on the completion of the processing and transporting to the computer 805 for renewing the general managing data base. According to the inventive method, the computer 805 down-loads the data necessary for renewing the contents of the data bases of the processing apparatuses and the transporter along with the process progress. Like Embodiment 8, the scheduling is performed prior to the processing of the wafer. The data base of scheduling information of processing and transporting collected for each wafer on the basis of the scheduling is managed as part of the general managing data base by the computer 805.

In this embodiment, data bases of information of process progress for each wafer are distributed in the processing apparatuses and transporter. Accordingly, when all or part of the general managing data base is destroyed due to an accidental failure, it becomes possible to repair it and continue the fabrication. In this embodiment, the data base is contained in the memory; however, it may be marked on the wafer itself.

Embodiment 10

This will be described with reference to FIGS. 13 and 50. In this embodiment, the present invention is applied to a fabricating system for fabricating an Si logic LSI.

Figure 50:
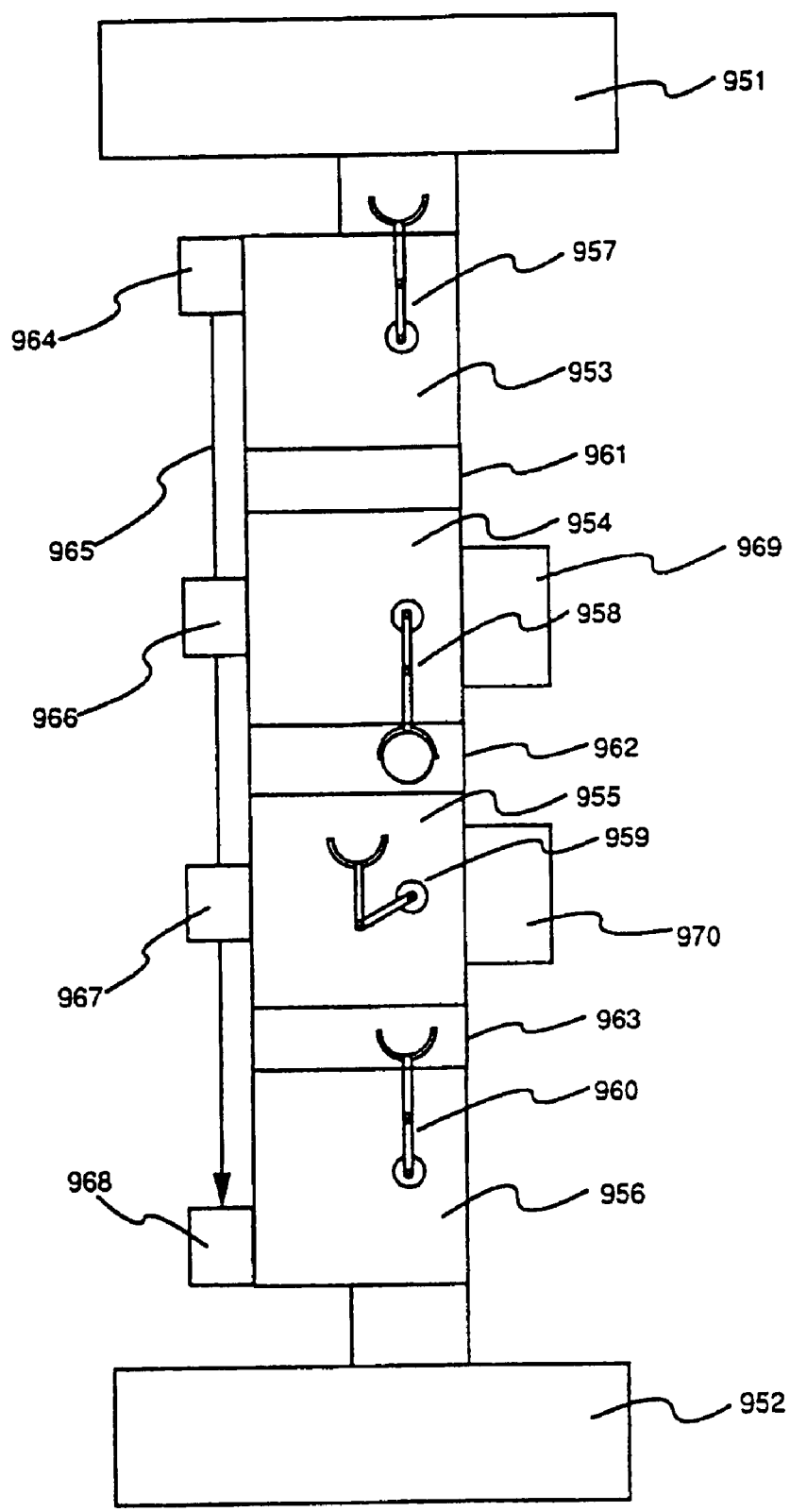
FIG. 50 is a plan view showing one example of an inter-apparatus transporter according to the present invention.

FIG. 50 is a view showing a linear single wafer transporter connecting processing apparatuses 950 and 951 for applying two continued processes to each other according to the inventive system. The linear transporter includes four partial transporting units 953 to 956. In this embodiment, these partial transporting units 953 to 956 are the same; however, they may be different from each other. The partial transporting units 953 and 956 are fixed to the processing apparatuses 951 and 952, respectively. The apparatuses 951 and 952 are fixed on supporting members rigidly fixed on the floor in a clean space where the fabricating system is contained, and thereby they are little moved. These partial transporting units 953 to 956 have transporting robots 957 to 960, respectively. Each of the transporting robots 957 to 960 has a rotatably and extendable arm. The tip of the arm is provided with a mechanism capable of freely loading and unloading a wafer between the partial transporting units or between the partial transporting unit and the processing apparatus. The robot has also a vertically movable mechanism at the center of the transporting portion thereof. Expansible connection portions 961 to 963 connects the partial transporting units to each other so as to keep the sealing of a clean tunnel constituted of the four partial transporting units even when the partial transporting units 954 and 955 are somewhat moved. In the inventive system, the clean tunnel is filled with clean nitrogen with a pressure of the atmosphere pressure or more; however, it may be filled with air or in vacuum. When the four partial transporting units 957 to 960 are linearly arranged, a laser beam 965 emitted from a laser source 964 fixed on the partial transporting unit passes through fine holes opened in two intermediate monitor portions 966 and 967 fixed on the partial transporting units 958 and 959, and reaches a final monitor portion 968 fixed to the partial transporting unit 956. A light receiving element is provided on the final monitor portion 968 for usually monitoring the intensity of the laser beam. The reduction of the intensity of the laser beam means that the partial transporting unit 958 or 959 is moved in the lateral or vertical direction and the laser beam do not perfectly pass through the fine holes opened on the two intermediate monitoring portions 966 and 967, and that the partial transporting units 957 to 960 are not linearly arranged by any cause. In this case, light receiving elements disposed around the fine holes opened on the intermediate monitor portions 966 and 967 can detect the direction and the amount of the shifting of the partial transporting units 958 and 959. These signals are transmitted to a special control computer for managing the relative positional relationship between the partial transporting units, and are subjected to data processing. The partial transporting units 958 and 959 include position adjusting mechanism 969 and 970 for adjusting the positions of the partial transporting units 958 and 959, respectively. The position adjusting mechanisms 969 and 970 are operated on the basis of a command from the control computer, to suitably adjust the positions of the partial transporting unit 958 or 959, thereby correctly rearranging the four partial transporting units 957 to 960. The drive force used for adjustment is an air pressure; however, it may be nitrogen pressure, water pressure, electrostatic force or magnetic force.

Although only the positional adjustment in the direction parallel to the transporting direction has been described, the inventive system is provided with a mechanism for individually monitoring the arrangement in the two vertical directions, and a mechanism for adjusting the positions thereof.

In the inventive system, the partial transporting units 953 and 956 fixed on the processing apparatuses have not the function of adjusting the positions; however, they may include the function of adjusting the positions for adjusting the relative positional relationship between the partial transporting unit and the processing apparatuses.

FIG. 13 is a fabricating system for applying, to a wafer, a sequence of processes for metallization according to the present invention. The construction of the fabricating system is the same as in Embodiment 2. In the fabricating system shown in FIG. 13, a single wafer is transported between processing apparatuses. The basic construction of a single wafer transporter 208 is the same as the linear transporter shown in FIG. 50. The single transporter 208 is constituted of a plurality of partial transporting units connected to each other. Part of the single wafer transporter 208 is curved, and thereby the relative positional relationship between the partial transporting units is detected by a laser source fixed on the supporting member rigidly fixed on the floor in a clean space where the fabricating system is contained. The single wafer transporter 208 is connected to each processing apparatus by means of an interface having a common load lock chamber. A special interface 209 is provided between lithography apparatuses 201 and 202 and the transporter 208 for allocating wafers into the apparatuses 201 and 202.

According to the inventive system, the term of works is extremely reduced compared with the old system by the lot transporting using the conventional self-transporting vehicle. When a sequence of processes for metallization of a CMOS LSI having a two layer metal film are performed at a wafer output of 150 wafers/day, the term of works for all processes is in the range from 4 hr to 4.5 hr. On the other hand, when the same processing is performed by the old system at a wafer output of 150 wafers/day, the term of works is in the range from 33 to 43. In the inventive system, the frequency of the generation of failure in the transporter is extremely reduced compared with the conventional fabricating system with the single wafer transporter, and thereby it becomes possible to apply continued processes to wafers.

Since the waiting time between two continued processes is short and all of processing apparatuses are connected to each other by means of a single wafer transporter filled with clean nitrogen, the percent non-defective is improved. In the fabrication of a CMOS memory LSI having a two layer metal film with the minimum design dimension of 0.25 μm, as compared with the old system installed in a clean room with the cleanliness of the same class, the percent non-defective in metallization processes is improved from 67% to 87%.

According to the inventive system, the transporting between processing apparatuses is automated, and wafers can be transported in a local clean space filled with nitrogen or in vacuum, so that the conventional extensive ultra-clean space can be eliminated. Therefore, the inventive system is effective to prevent the adherence of dust or contamination to a wafer, to shorten the term of works, to improve the percent non-defective, and to reduce the generation of failure.

What is claimed is:

1. A fabricating method comprising the steps of:

processing semiconductor wafers by a plurality of processing apparatuses each including at least one processing chamber and an interface having transporting means for transporting a semiconductor wafer to be processed into said processing chamber and for sending out a processed semiconductor wafer; and transporting semiconductor wafers from one of the processing apparatuses to another by an inter-apparatus transporter;

wherein, in each of said plurality of processing apparatuses, semiconductor wafers are set at said interface by said inter-apparatus transporter, transported into said processing chamber by said transporting means, processed in said processing chamber, and transported out of said processing chamber by said transporting means; and wherein a time interval assigned for transporting the semiconductor wafers from one of said processing apparatuses to another by said inter-apparatus transporter and assigned for processing in each of said processing apparatuses including time for transporting a semiconductor wafer to be processed into said processing chamber at said interface, time for processing the semiconductor wafer in said processing chamber, and time for transporting the semiconductor wafer out of said processing chamber and sending out at said interface is set to N multiplication of a predetermined unit time, with N being a positive integer, that is common to all of said plurality of the processing apparatuses and the inter-apparatus transporter and that is longer than the shortest required time for either processing in each of the processing apparatuses or for transporting by the inter-apparatus transporter but shorter than the longest required time for either processing in each of the processing apparatuses or for transporting by the inter-apparatus transporter.

2. A fabricating method according to claim 1,
wherein said time interval assigned for processing in each of said processing apparatuses further includes time for waiting prior to transporting the semiconductor wafer to be processed into said processing chamber at said interface.

3. A fabricating method according to claim 2,
wherein said time interval assigned for processing in each of said processing apparatuses further includes time for waiting prior to sending out the semiconductor wafer at said interface.

4. A fabricating method according to claim 1,
wherein said time interval assigned for processing in each of said processing apparatuses further includes time for waiting prior to sending out the semiconductor wafer at said interface.

5. A fabricating method comprising the steps of:
processing semiconductor wafers by a plurality of processing apparatuses each including at least one processing chamber and an interface having transporting means for transporting a semiconductor wafer to be processed into said processing chamber and for sending out a processed semiconductor wafer; and
transporting semiconductor wafers from one of the processing apparatuses to another by an inter-apparatus transporter;
wherein, in each of said plurality of processing apparatuses, semiconductor wafers are set at said interface by said inter-apparatus transporter, transported into said processing chamber by said transporting means, processed in said processing chamber, and transported out of said processing chamber by said transporting means; and
wherein a plurality of time intervals assigned to said processing apparatuses each including time for transporting a semiconductor wafer to be processed into said processing chamber at said interface, time for processing the semiconductor wafer in said processing chamber, and time for transporting the semiconductor wafer out of said processing chamber and sending out at said interface are set to N multiplication of a predetermined unit time that is common to all of said plurality of the processing apparatuses with N being a positive integer, and that is longer than the shortest required time for processing the semiconductor wafer in each of the processing chambers but shorter than the longest required time for processing in each of the processing apparatuses; and
wherein a time interval assigned to transporting the semiconductor wafers from one of said processing apparatuses to another by said inter-apparatus transporter is scheduled by use of one of said time intervals.

6. A fabricating method comprising the steps of:
processing semiconductor wafers by a plurality of processing apparatuses each including at least one processing chamber and an interface having transporting means for transporting a semiconductor wafer to be processed into said processing chamber and for sending out a processed semiconductor wafer; and
transporting semiconductor wafers from one of the processing apparatuses to another by an inter-apparatus transporter;
wherein, in each of said plurality of processing apparatuses, semiconductor wafers are set at said interface by said inter-apparatus transporter, transported into said processing chamber by said transporting means, processed in said processing chamber, and transported out of said processing chamber by said transporting means; and
wherein a time interval assigned to each of said processing apparatuses including time for transporting a semiconductor wafer to be processed into said processing chamber at said interface, time for processing the semiconductor wafer in said processing chamber, and time for transporting the semiconductor wafer out of said processing chamber and sending out the semiconductor wafer to said inter-apparatus transporter at said interface is set to N multiplication of a predetermined unit time that is common to all of said plurality of the processing apparatuses, with N being a positive integer, and that is longer than the shortest required time for either processing in each of the processing chambers or for transporting by the inter-apparatus transporter but shorter than the longest required time for either processing in each of the processing apparatuses or for transporting by the inter-apparatus transporter;
wherein a time interval between setting of a semiconductor wafer at the interface of one of said processing apparatuses by said inter-apparatus transporter and setting at the interface of another processing apparatus by said inter-apparatus transporter is set to M multiplication of said predetermined unit time, with M being a positive integer.

7. A fabricating method comprising the steps of:
processing a lot being constituted of a plurality of semiconductor wafers by a plurality of processing apparatuses each including at least one processing chamber and an interface having transporting means for transporting a semiconductor wafer to be processed into said processing chamber and for sending out a processed semiconductor wafer; and
transporting said lot from one of the processing apparatuses to another by an inter-apparatus transporter;
wherein, in each of said plurality of processing apparatuses, semiconductor wafers constituting the lot are set at said interface by said inter-apparatus transporter, transported into said processing chamber by said transporting means, processed in said processing chamber, and transported out of said processing chamber by said transporting means; and
wherein a time interval assigned either for transporting the lot from one of said processing apparatuses to another by said inter-apparatus transporter or for processing in each of said processing apparatuses including time for transporting semiconductor wafers to be processed into said processing chamber at said interface, time for processing the semiconductor wafers in said processing chamber, and time for transporting the semiconductor wafer out of said processing chamber and sending out at said interface is set to N multiplication of a predetermined unit time, with N being a positive integer, that is common to all of said plurality of the processing apparatuses and that is longer than the shortest required time for processing one of the wafers in each of the processing apparatuses but shorter than the longest required time for processing in each of the processing apparatuses.

8. A fabricating method according to claim 7,
wherein said time interval assigned for processing in each of said processing apparatuses further includes time for waiting prior to transporting the semiconductor wafer to be processed into said processing chamber at said interface.

9. A fabricating method according to claim 7,
wherein said time interval assigned for processing in each of said processing apparatuses further includes time for waiting prior to sending out the semiconductor wafer at said interface.

10. A fabricating method comprising the steps of:

processing semiconductor wafers by plurality of processing apparatuses each including at least one processing chamber and an interface having transporting means for transporting a semiconductor wafer to be processed into said processing chamber and for sending out a processed semiconductor wafer; and transporting semiconductor wafers from one of the processing apparatuses to another by an inter-apparatus transporter;

wherein, in each of said plurality of processing apparatuses, semiconductor wafers are set at said interface by said inter-apparatus transporter, transported into said processing chamber by said transporting means, processed in said processing chamber, and transported out of said processing chamber by said transporting means; and wherein a time interval assigned either for transporting semiconductor wafers from one of said processing apparatuses to another by said inter-apparatus transporter or for processing in each of said processing apparatuses including time for transporting a semiconductor wafer to be processed into said processing chamber at said interface, time for processing the semiconductor wafer in said processing chamber, and time for transporting the semiconductor wafer out of said processing chamber and sending out at said interface is set to N multiplication of a predetermined unit time, with N being a positive integer, that is common to all of said plurality of the processing apparatuses and the inter-apparatus transporter and that is longer than a minute of processing time and at least as long as the shortest processing time but shorter than the longest required time for either processing in each of the processing apparatuses or for transporting by the inter-apparatus transporter.

11. A fabricating method comprising the steps of:

processing semiconductor wafers by a plurality of processing apparatuses each including at least one processing chamber and an interface having transporting means for transporting a semiconductor wafer to be processed into said processing chamber and for sending out a processed semiconductor wafer; and transporting semiconductor wafers from one of the processing apparatuses to another by an inter-apparatus transporter;

wherein, in each of said plurality of processing apparatuses, semiconductor wafers are set at said interface by said inter-apparatus transporter, transported into said processing chamber by said transporting means, processed in said processing chamber, and transported out of said processing chamber by said transporting means; and wherein a plurality of time intervals assigned to said processing apparatuses each including time for transporting a semiconductor wafer to be processed into said processing chamber at said interface, time for processing the semiconductor wafer in said processing chamber, and time for transporting the semiconductor wafer out of said processing chamber and sending out at said interface are set to N multiplication of a predetermined unit time that is common to all of said plurality of the processing apparatuses with N being a positive integer, and that is longer than a minute of processing time and at least as long as the shortest processing time but shorter than the longest required time for processing in each of the processing apparatuses; and wherein a time interval assigned to transporting the semiconductor wafers from one of said processing apparatuses to another by said inter-apparatus transporter is scheduled by use of one of said time intervals.

12. A fabricating method comprising the steps of:

processing semiconductor wafers by a plurality of processing apparatuses each including at least one processing chamber and in interface having transporting means for transporting a semiconductor wafer to be processed into said processing chamber and for sending out a processed semiconductor wafer; and transporting semiconductor wafers from one of the processing apparatuses to another by an inter-apparatus transporter;

wherein, in each of said plurality of processing apparatuses, semiconductor wafers are set at said interface by said inter-apparatus transporter, transported into said processing chamber by said transporting means, processed in said processing chamber, and transported out of said processing chamber by said transporting means; and wherein a time interval assigned to each of said processing apparatuses including time for transporting a semiconductor wafer to be processed into said processing chamber at said interface, time for processing the semiconductor wafer in said processing chamber, and time for transporting the semiconductor wafer out of said processing chamber and sending out the semiconductor wafer to said inter-apparatus transporter at said interface is set to N multiplication of a predetermined unit time that is common to all of said plurality of the processing apparatuses, with N being a positive integer, and that is longer than a minute of processing time and at least as long as the shortest processing time but shorter than the longest required time for either processing in each of the processing apparatuses or for transporting by the inter-apparatus transporter;

wherein a time interval between setting of a semiconductor wafer at the interface of one of said processing apparatuses by said inter-apparatus transporter and setting at the interface of another processing apparatus by said inter-apparatus transporter is set to M multiplication of said predetermined unit time, with M being a positive integer.

* * * * *